US012701917B2

(12) United States Patent
Li et al.

(10) Patent No.: US 12,701,917 B2
(45) Date of Patent: Aug. 4, 2026

(54) PYROELECTRIC DEVICE FOR A SEMICONDUCTOR DEVICE

(71) Applicant: Taiwan Semiconductor Manufacturing Company, Ltd., Hsinchu (TW)

(72) Inventors: Fu-Hai Li, Tainan City (TW); Kuen-Yi Chen, Hsinchu City (TW); Yi Ching Ong, Hsinchu (TW); Kuo-Ching Huang, Hsinchu City (TW); Harry Hak Lay Chuang, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 821 days.

(21) Appl. No.: 17/807,617

(22) Filed: Jun. 17, 2022

(65) Prior Publication Data
US 2023/0413673 A1 Dec. 21, 2023

(51) Int. Cl.
*H10N 15/10* (2023.01)
*H10N 19/00* (2026.01)
*H10N 30/853* (2023.01)

(52) U.S. Cl.
CPC ............. *H10N 15/15* (2023.02); *H10N 19/00* (2023.02); *H10N 30/8554* (2023.02)

(58) Field of Classification Search
CPC ..... H10N 15/15; H10N 19/00; H10N 30/8554
See application file for complete search history.

(56) References Cited

U.S. PATENT DOCUMENTS

| | | | |
|---|---|---|---|
| 2003/0098588 A1* | 5/2003 | Yazawa | F03G 7/00 290/43 |
| 2023/0065314 A1* | 3/2023 | Veches | H01L 23/38 |
| 2024/0172451 A1* | 5/2024 | Schenk | H10D 1/694 |
| 2024/0313766 A1* | 9/2024 | Kvatinsky | H03K 3/01 |

* cited by examiner

*Primary Examiner* — Joshua Benitez Rosario
*Assistant Examiner* — Christopher A Culbert
(74) *Attorney, Agent, or Firm* — Harrity & Harrity, LLP

(57) ABSTRACT

A pyroelectric generator may be included in the same semiconductor device as a radio frequency (RF) switch (e.g., a phase-change material (PCM) RF switch and/or other types of RF switch). The pyroelectric generator includes a pyroelectric material layer between two electrodes. The pyroelectric generator is configured to scavenge thermal energy that is generated during the operation of the RF switch, and to convert the thermal energy into electrical energy that may be stored and reused.

20 Claims, 41 Drawing Sheets

1800

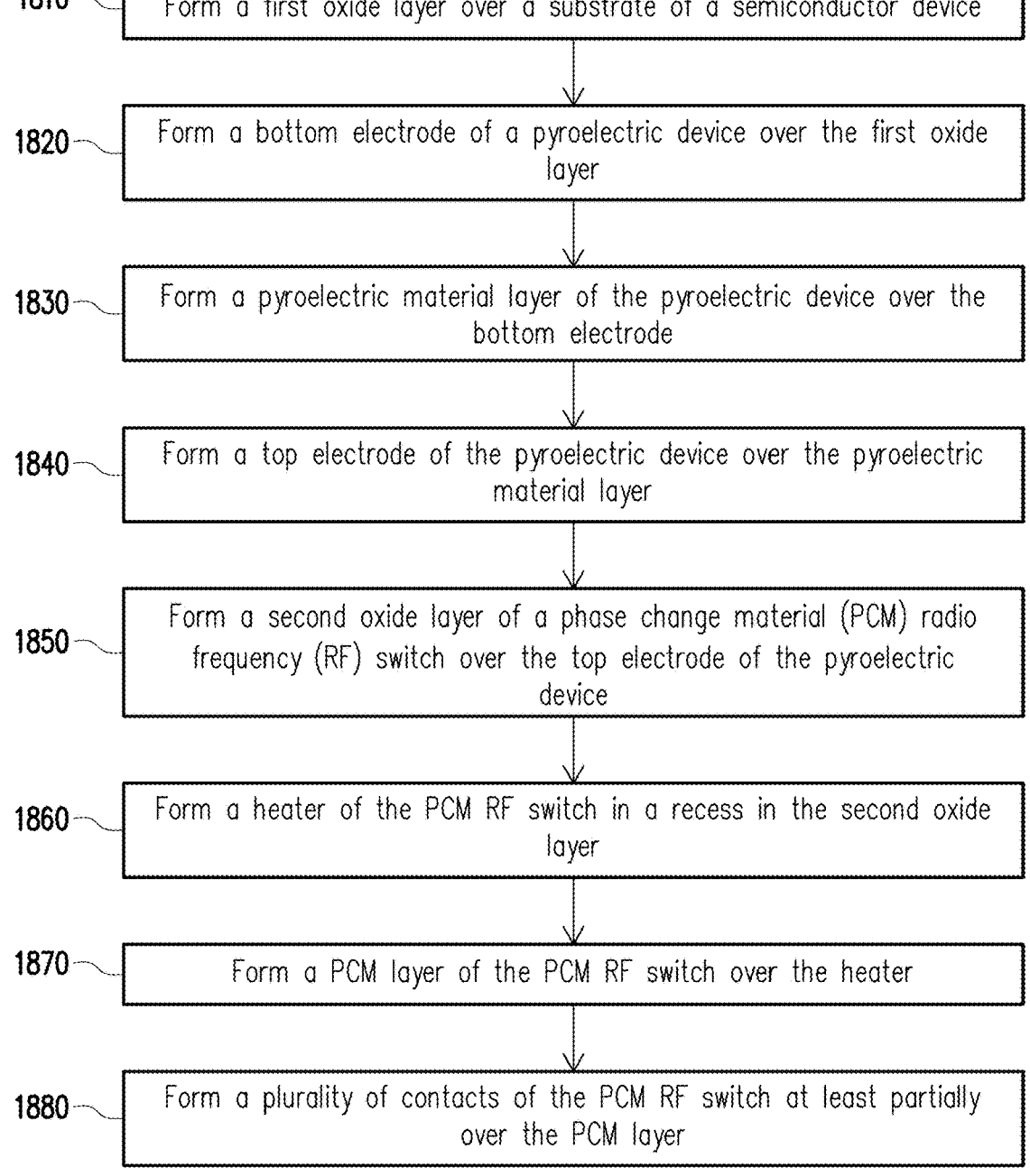

1810 — Form a first oxide layer over a substrate of a semiconductor device

1820 — Form a bottom electrode of a pyroelectric device over the first oxide layer 1830 — Form a pyroelectric material layer of the pyroelectric device over the bottom electrode 1840 — Form a top electrode of the pyroelectric device over the pyroelectric material layer 1850 — Form a second oxide layer of a phase change material (PCM) radio frequency (RF) switch over the top electrode of the pyroelectric device 1860 — Form a heater of the PCM RF switch in a recess in the second oxide layer 1870 — Form a PCM layer of the PCM RF switch over the heater 1880 — Form a plurality of contacts of the PCM RF switch at least partially over the PCM layer

FIG. 18

PYROELECTRIC DEVICE FOR A SEMICONDUCTOR DEVICE

BACKGROUND

Switches are often used in radio frequency (RF) applications to switch various RF components of a communication device between various RF configurations. For example, an RF system of a communication device may include one or more RF switches to configure antennas, filters, and/or multiband amplifiers to selectively enable transmission and/or reception on one or more frequency bands.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 is a flowchart of an example process associated with forming a semiconductor device.

DETAILED DESCRIPTION

Figure 1:
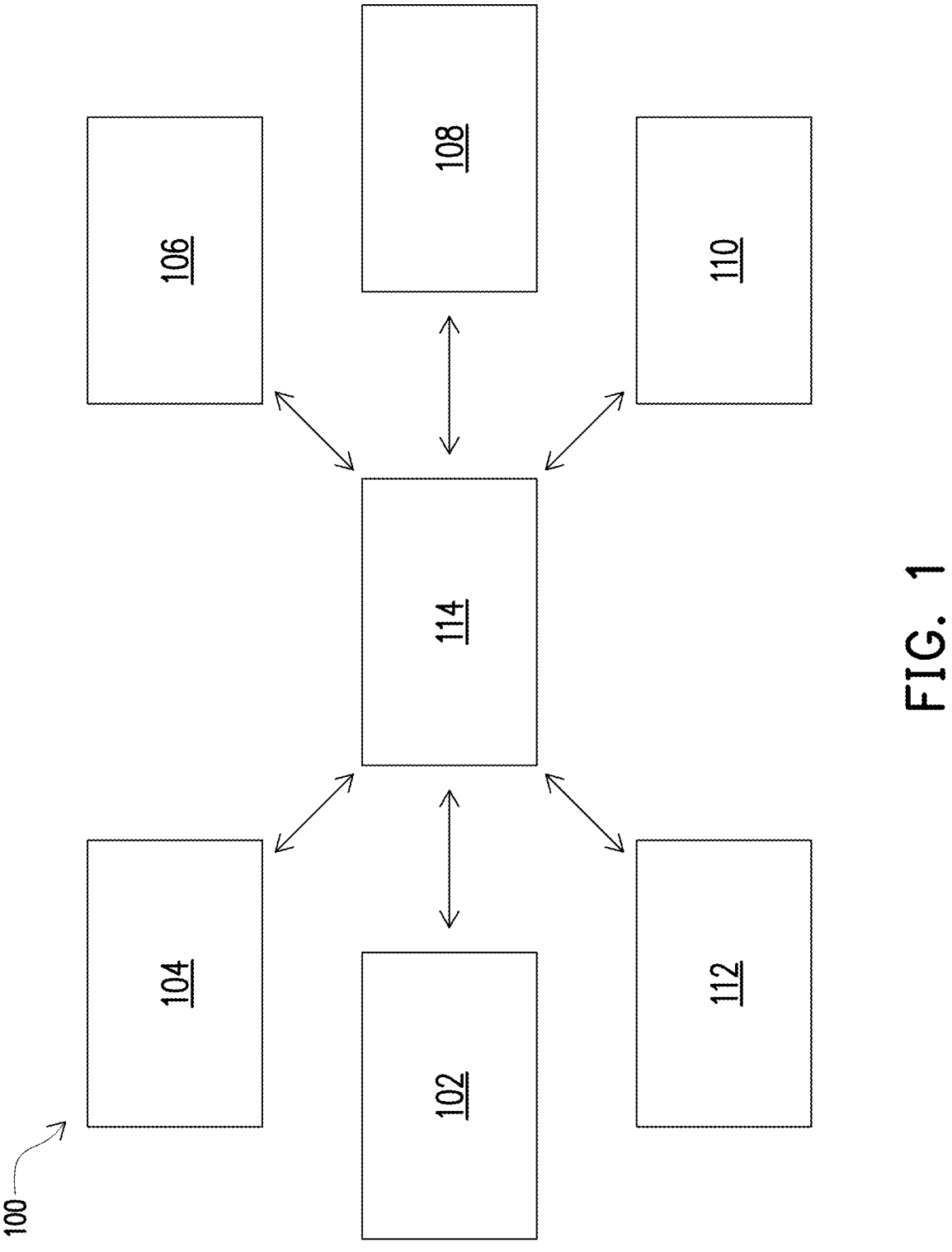
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A radio frequency (RF) switch may be implemented using complementary metal oxide semiconductor (CMOS) manufacturing processes. An example of an RF switch includes a phase-change material (PCM) RF switch. A PCM RF switch is an RF switch that selectively transitions (or switches) between an "on" state and an "off" state by selectively changing a phase of a switching material of the PCM RF switch between a crystalline phase and an amorphous phase. In the on state, an RF signal is permitted to flow through the switching material of the RF switch between an input and an output. In the off state, the RF signal is restricted from flowing through the channel.

A heater may be used to selectively heat the switching material to change the phase of the switching material. The heater may be used to heat the switching material to a temperature that is greater than the crystallization temperature of the switching material for a sufficient time duration to cause the switching material to transition from an amorphous phase to a crystalline phase. In the crystalline phase, an RF signal is permitted to traverse the switching material. Accordingly, the PCM RF switch is in the on state when the switching material is in the crystalline phase. The heater may be used to rapidly heat the switching material to a temperature that is greater than the crystallization temperature of the switching material, and that is greater than the melting temperature of the switching material, for a short time duration to cause the switching material to transition from the crystalline phase to the amorphous phase. In the amorphous phase, the RF signal is restricted from traversing the switching material. Accordingly, the PCM RF switch is in the off state when the switching material is in the amorphous phase.

While the PCM-based RF switch may achieve a low capacitance in the off state (and therefore, a low signal leakage at high frequency) relative to other types of RF switches, the operating principals of the PCM RF switch may result in inefficient operation of the PCM RF switch. In particular, the temperatures at which the heater of the PCM RF switch operates may be relatively high (e.g., up to approximately 1000 degrees Celsius or greater), which may result in high power consumption and wasted thermal energy. Moreover, the PCM RF switch may operate at relatively high frequencies, which may result in frequent switching and, therefore, frequency temperature cycling. The high-frequency temperature cycling of the PCM RF switch (e.g., the repeated heating the switching material and allowing the switching material of the PCM RF switch to cool down) may greatly increase the thermal energy that is wasted by the PCM RF switch.

Some implementations described herein provide a pyroelectric generator that is included in the same semiconductor device as an RF switch (e.g., a PCM RF switch and/or other types of RF switch). The pyroelectric generator includes a pyroelectric material layer between two electrodes. The pyroelectric generator is configured to scavenge thermal energy that is generated during the operation of the RF switch, and is configured to convert the scavenged thermal energy into electrical energy that may be stored and reused. Temperature changes in the RF switch cause temperature changes in the pyroelectric material layer. The temperature changes in the pyroelectric material layer result in changes in the polarization of charges in the pyroelectric material layer. The changes in charge polarization in the pyroelectric material layer results in opposing charges (e.g., electrons and holes) being attracted to different electrodes, which results in the generation of an electrical current. The electrical current may be rectified and stored in an electrical storage device (e.g., a battery, a capacitor) for use by the RF switch, for use by the electronic device in which the RF switch is included, and/or for use by another component of the electronic device.

The pyroelectric generator may more efficiently convert heat to electrical energy in an RF switch such as a PCM RF switch relative to other types of generators such as a thermoelectric generator. The pyroelectric generator is able to take advantage of the frequent temperature changes in a PCM RF switch to generate electricity, whereas other types of generators may rely on a constant temperature differential between a hot side and a cold side to generate electrical energy that may not frequently occur in a PCM RF switch.

In this way, the pyroelectric material layer can generate electricity when the pyroelectric material layer encounters temporal temperature gradients (e.g., temperature cycling). The pyroelectric material layer is configured to make use of the inherent temperature cycling during the switching operation in a PCM RF switch to recycle heat to electricity. This increases the operating efficiency of the PCM RF switch and decreases thermal waste in the PCM RF switch. Both processes for forming the PCM RF switch and the pyroelectric generator can be embedded in similar CMOS processing, which results in minimal impact to processing complexity for forming a semiconductor device that includes the PCM RF switch and the pyroelectric generator. Moreover, the operation of the pyroelectric generator may have minimal impact on the operating performance (e.g., the off state capacitance) of the PCM RF switch as the working temperature (e.g., the curie temperature) for the pyroelectric generator may be much lower (e.g., less than approximately half) than the working temperature of the PCM RF switch.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form an RF switch and a pyroelectric device adjacent to the RF switch. As another example, one or more of the semiconductor processing tools 102-112 and/or the wafer/die transport tool 114 may form a rectifier circuit electrically connected with the pyroelectric device, and may form an electrical storage device electrically connected with the rectifier circuit. As another example, one or more of the semiconductor processing tools 102-112 and/or the wafer/die transport tool 114 may form a plurality of conductive structures that electrically connect the pyroelectric device to the rectifier circuit.

As another example, one or more of the semiconductor processing tools 102-112 and/or the wafer/die transport tool 114 may form a first oxide layer over a substrate of a semiconductor device; may form a bottom electrode of a pyroelectric device over the first oxide layer; may form a pyroelectric material layer of the pyroelectric device over the bottom electrode; may form a top electrode of the pyroelectric device over the pyroelectric material layer; may form a second oxide layer of a PCM RF switch over the top electrode of the pyroelectric device; may form a heater of the PCM RF switch in a recess in the second oxide layer; may form a PCM layer of the PCM RF switch over the heater; and/or may form a plurality of contacts of the PCM RF switch at least partially over the PCM layer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
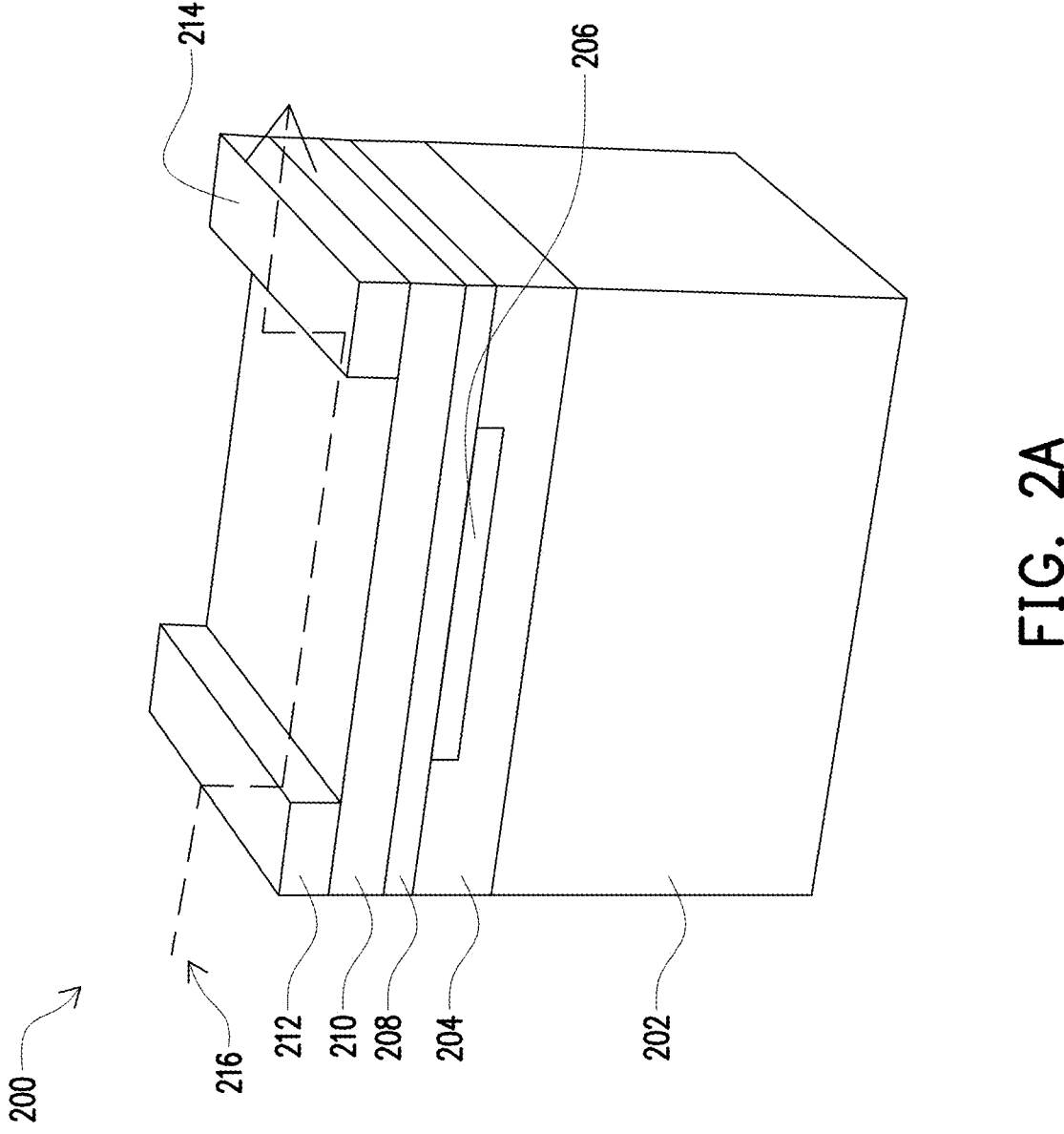
FIGS. 2A-2C are diagrams of an example phase change material (PCM) radio frequency (RF) switch described herein.
Figure 2B:
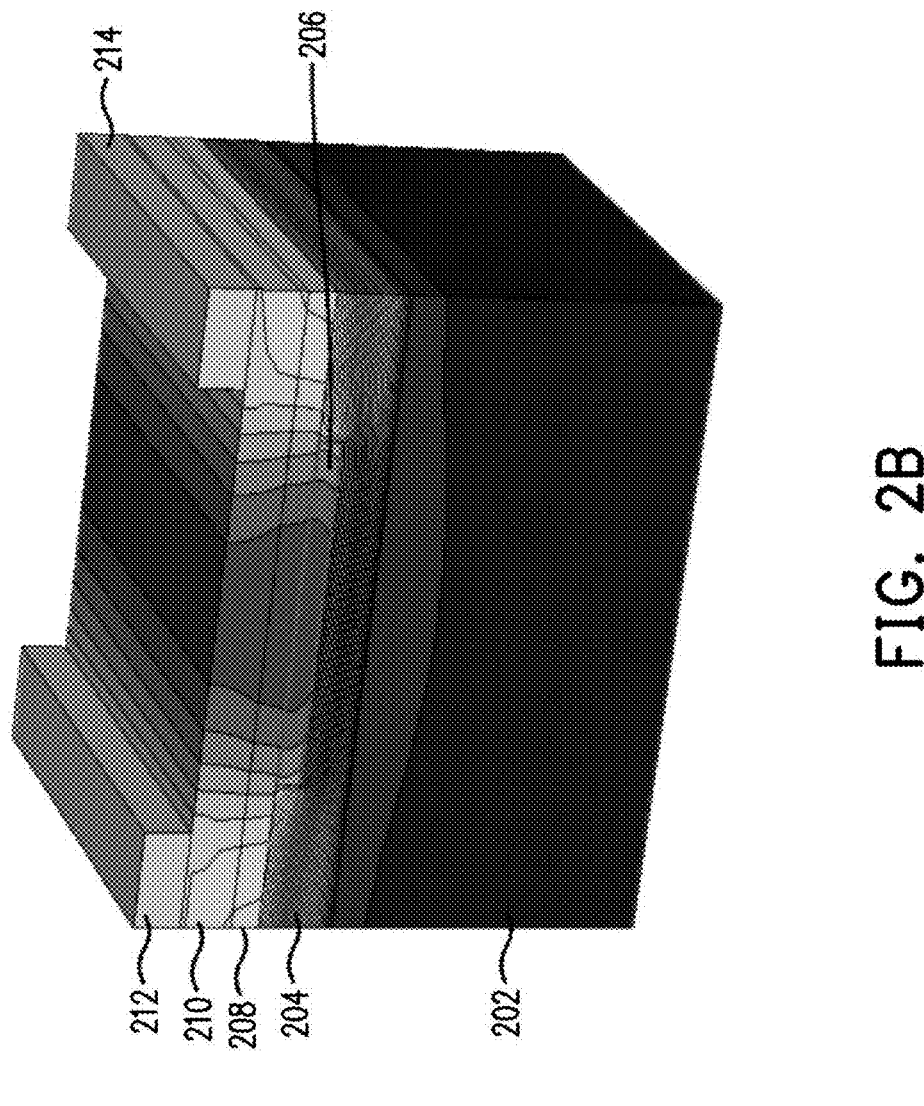
Figure 2C:
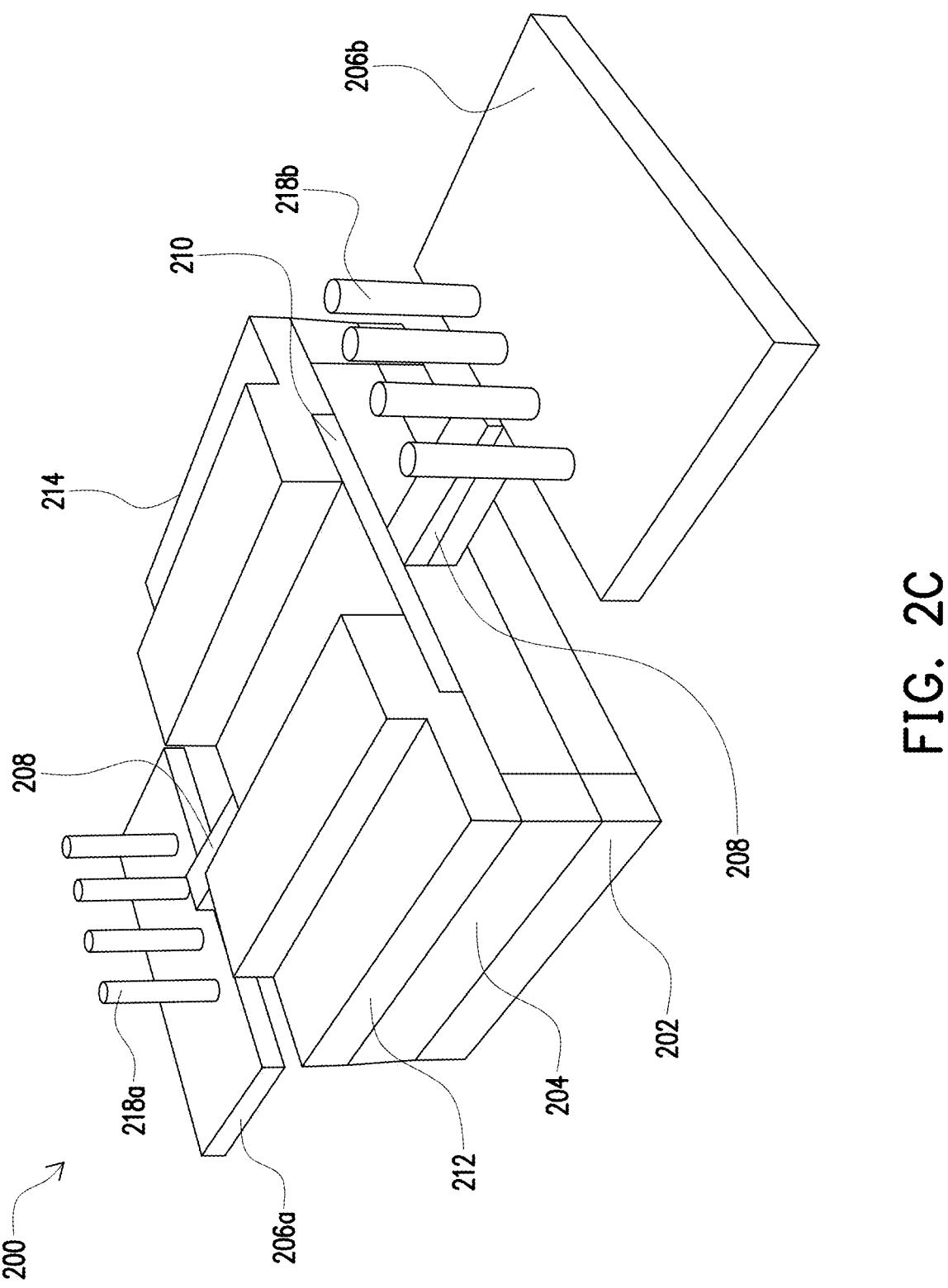

FIGS. 2A-2C are diagrams of an example PCM RF switch 200 described herein. The PCM RF switch 200 is an RF switch that selectively transitions (or switches) between an "on" state and an "off" state by selectively changing a phase of a switching material of the PCM RF switch 200 between a crystalline phase and an amorphous phase.

As shown in FIG. 2A, the PCM RF switch 200 may include a substrate 202. The PCM RF switch 200 may include an oxide layer 204 over and/or on the substrate 202. The PCM RF switch 200 may include a heater 206 over, on, and/or recessed in the oxide layer 204. The PCM RF switch 200 may include an insulator layer 208 over and/or on the heater 206. The PCM RF switch 200 may include a phase change material (PCM) layer 210 over and/or on the insulator layer 208. The PCM RF switch 200 may include an RF in electrode 212 and an RF out electrode 214 over and/or on portions of the PCM layer 210.

The substrate 202 may include a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. In some implementations, the substrate 202 is doped with one or more types of dopants to form one or more dopant wells in the substrate 202.

The oxide layer 204 may include a silicon oxide ($SiO_x$ such as $SiO_2$), a silicon oxynitride (SiON), and/or another oxide-containing material. Additionally and/or alternatively, the oxide layer 204 may include another insulating material or another dielectric layer having a suitable thermal conductivity. The oxide layer 204 may be formed to have a thermal conductivity that is included in a range of approximately 0.1 watts per meter kelvin (W/mk) to approximately 50 W/mk. However, other values for the range are within the scope of the present disclosure. The oxide layer 204 may be formed to have a horizontal width that is included in a range of approximately 0.1 microns to approximately 2 microns. However, other values for the range are within the scope of the present disclosure. The oxide layer 204 may be formed to have a horizontal length that is included in a range of approximately 2 microns to approximately 10 microns. However, other values for the range are within the scope of the present disclosure. The oxide layer 204 may be formed to have a vertical thickness that is included in a range of approximately 0.16 microns to approximately 1.2 microns. However, other values for the range are within the scope of the present disclosure.

The heater 206 includes a region of material that is configured to conduct heat. The heater 206 may include a conductive material having a low Seebeck coefficient and a high melting point (e.g., approximately equal to or greater than 1500 degrees Celsius) such as tungsten (W) or molybdenum (Mo), among other examples. The high melting point enables the heater 206 to effectively heat the PCM layer 210 to switch the phase of the PCM layer 210 without melting the heater 206. The heater 206 may be formed to have a horizontal width that is included in a range of approximately 0.1 microns to approximately 2 microns. However, other values for the range are within the scope of the present disclosure. The heater 206 may be formed to have a horizontal length that is included in a range of approximately 0.1 microns to approximately 10 microns. However, other values for the range are within the scope of the present disclosure. The heater 206 may be formed to have a vertical thickness that is included in a range of approximately 0.05 microns to approximately 0.15 microns. However, other values for the range are within the scope of the present disclosure.

The insulator layer 208 may include an insulating material having a low dielectric constant (e.g., in a range of approximately 3 to approximately 10, among other examples) and/or a high thermal conductivity (e.g., approximately equal to or greater than 100 W/mk, among other examples). The low dielectric constant may enable the insulator layer 208 to resist the propagation of RF into the substrate 202. The high thermal conductivity may enable heat generated by the heater 206 to propagate into the PCM layer 210 through the insulator layer 208. In some implementations, the insulator layer 208 includes silicon nitride ($Si_xN_y$ such as $Si_3N_4$). However, other materials may be used for the insulator layer 208.

The insulator layer 208 may be formed to have a horizontal width that is included in a range of approximately 5 microns to approximately 20 microns. However, other values for the range are within the scope of the present disclosure. The insulator layer 208 may be formed to have a horizontal length that is included in a range of approximately 5 microns to approximately microns. However, other values for the range are within the scope of the present disclosure. The insulator layer 208 may be formed to have a vertical thickness that is included in a range of approximately 0.01 microns to approximately 0.05 microns. However, other values for the range are within the scope of the present disclosure.

The PCM layer 210 may correspond to the switching material of the PCM RF switch 200. The phase of the PCM layer 210 may be switched to selectively permit the propagation of an RF signal 216 from the RF in electrode 212 to the RF out electrode 214 through the PCM layer 210. Thus, the PCM layer 210 functions as the channel of the PCM RF switch 200.

The PCM layer 210 includes one or more materials that are capable of transitioning between two or more material phases or crystal structure phases. In particular, the PCM layer 210 includes one or more materials that are capable of transitioning between a crystalline phase (or crystalline material structure) and an amorphous phase (or non-crystalline material structure). Examples of materials include chalcogenides (alloys containing group VI elements) such as binary chalcogenides, ternary chalcogenides, and/or quaternary chalcogenides, among other examples.

Examples of binary chalcogenides include germanium telluride (GeTe), germanium antimonide (GeSb), gallium antimonide (GaSb), indium antimonide (InSb), antimony telluride ($Sb_xTe_y$ such as $Sb_2Te_3$), and/or indium selenide (InSe), among other examples.

Examples of ternary chalcogenides include germanium antimony tellurium ($Ge_xSb_yTe_z$ such as $Ge_2Sb_2Te_5$), indium antimony tellurium (InSbTe), gallium selenide telluride (GaSeTe), tin antimony telluride ($SnSb_xTe_y$ such as $SnSb_2Te_4$), indium antimony germanium (InSbGe), and/or gallium antimony telluride (GaSbTe), among other examples. For germanium antimony tellurium, the respective concentration of germanium, antimony, and tellurium may be selected to achieve a particular phase transition speed and/or a particular high temperature data retention (HTDR), among other examples.

Examples of quaternary chalcogenides include silver indium antimony tellurium (AgInSbTe), germanium-doped antimony telluride ((Ge)SbTe), tin-doped antimony telluride ((Sn)SbTe), selenide-doped germanium antimonide (GeSb (Se)), tellurium-doped germanium antimonide (GeSb(Te)), tellurium germanium antimony sulfur ($Te_wGe_xSb_yS_z$ such as $Te_{81}Ge_{15}Sb_2S_2$), germanium antimony tellurium with oxygen ($Ge_xSb_yTe_z$:O such as $Ge_2Sb_2Te_5$:O), and/or germanium antimony tellurium with nitrogen ($Ge_xSb_yTe_z$:N such as $Ge_2Sb_2Te_5$:N), among other examples.

The PCM layer 210 may be formed to have a horizontal width that is included in a range of approximately 0.1 microns to approximately 10 microns. However, other values for the range are within the scope of the present disclosure. The PCM layer 210 may be formed to have a horizontal length that is included in a range of approximately 0.1 microns to approximately 10 microns. However, other values for the range are within the scope of the present disclosure. The PCM layer 210 may be formed to have a vertical thickness that is included in a range of approximately 0.05 microns to approximately 0.1 microns. However, other values for the range are within the scope of the present disclosure.

The RF in electrode 212 and the RF out electrode 214 may be spaced apart by a distance such that the RF signal 216 traverses through the PCM layer 210 between the RF in electrode 212 and the RF out electrode 214, as opposed to directly from the RF in electrode 212 to the RF out electrode 214. The RF in electrode 212 and the RF out electrode 214 may each include one or more conductive materials to enable the RF in electrode 212 and the RF out electrode 214 to conduct the RF signal 216 (which may include a time-varying electrical signal). Examples of conductive materials include gold (Au), titanium, and/or another conductive material.

Each of the RF in electrode 212 and the RF out electrode 214 may be formed to have a horizontal width that is included in a range of approximately 5 microns to approximately 10 microns. However, other values for the range are within the scope of the present disclosure. Each of the RF in electrode 212 and the RF out electrode 214 may be formed to have a horizontal length that is included in a range of approximately 5 microns to approximately 10 microns. However, other values for the range are within the scope of the present disclosure. Each of the RF in electrode 212 and the RF out electrode 214 may be formed to have a vertical thickness that is included in a range of approximately 0.05 microns to approximately 0.1 microns. However, other values for the range are within the scope of the present disclosure.

FIG. 2B illustrates an example temperature gradient in the PCM RF switch 200 during operation of the PCM RF switch 200. As shown in FIG. 2B, the temperature may be highest in the heater 206 as the heater 206 generates heat. The heat propagates through the insulator layer 208 and into the PCM layer 210. A high current (Theater) may be provided to the heater 206 to create joule heating in heater 206 to generate a high local temperature (e.g., approximately 1000 degrees kelvin or greater, among other examples). Different $I_{heater}$ profiles, and thus, different local temperature temporal profiles, may be used to transition the PCM layer 210 from a crystalline phase to an amorphous phase, and from an amorphous phase to a crystalline phase.

As shown in FIG. 2C, the PCM RF switch 200 may include additional structures and/or layers. For example, the PCM RF switch 200 may include a plurality of heater regions 206a and 206b to achieve an even distribution of heat under the PCM layer 210. Vias 218a and 218b may be respectively connected to the heater regions 206a and 206b to connect the heater regions 206a and 206b with heat sinks to provide rapid cooling of the heater regions 206a and 206b.

As indicated above, FIGS. 2A-2C are provided as examples. Other examples may differ from what is described with regard to FIGS. 2A-2C.

Figure 3A:
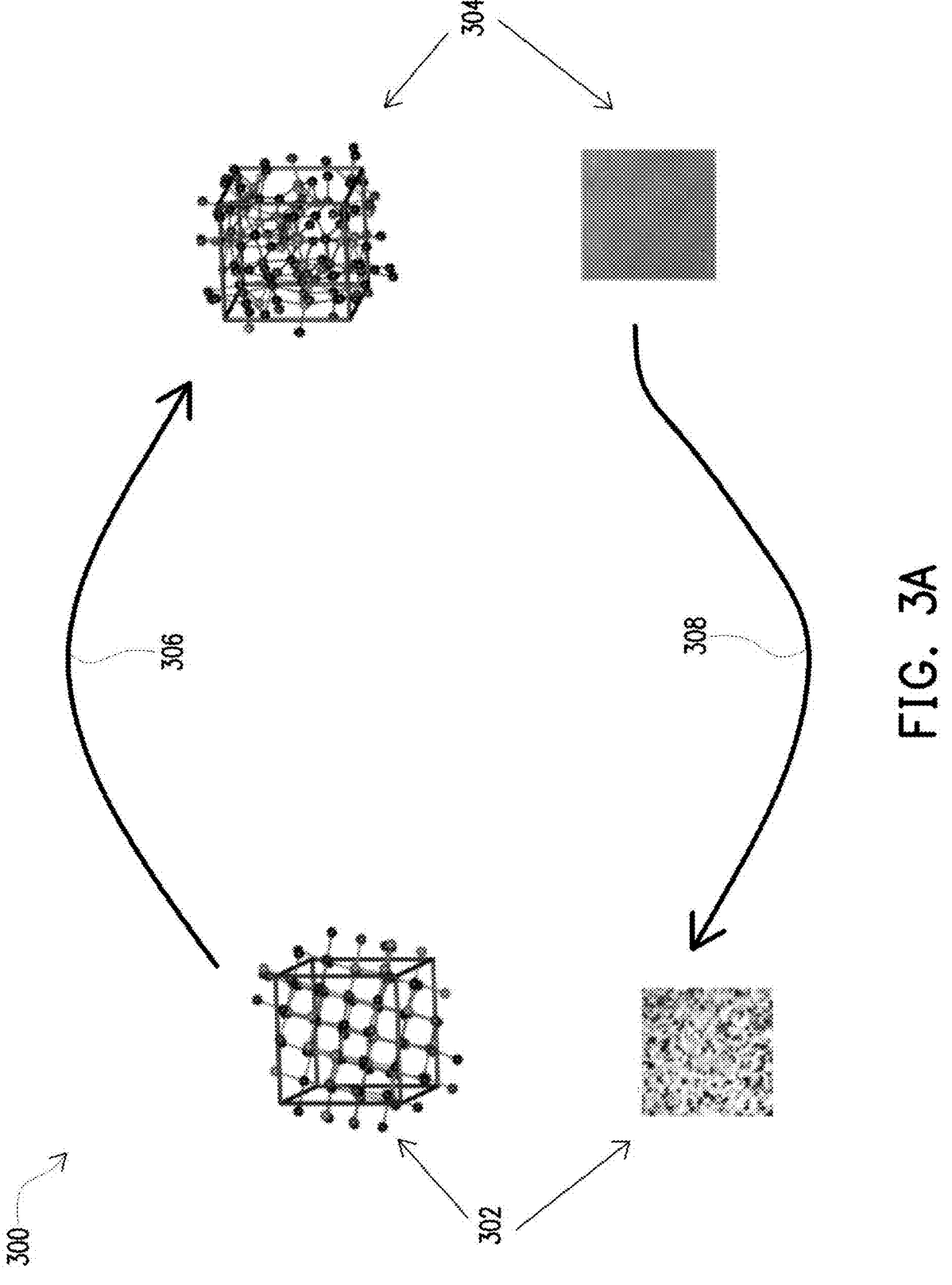
FIGS. 3A-3C are diagrams of example implementations of the operation of the PCM RF switch described herein.
Figure 3B:
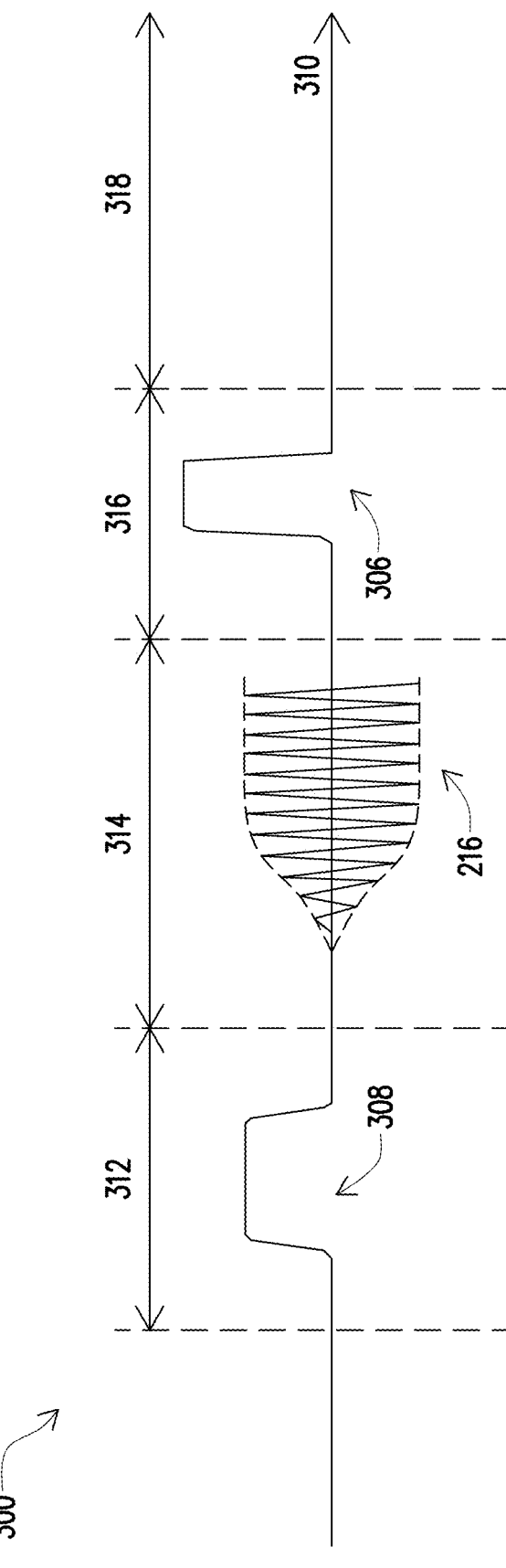
Figure 3C:
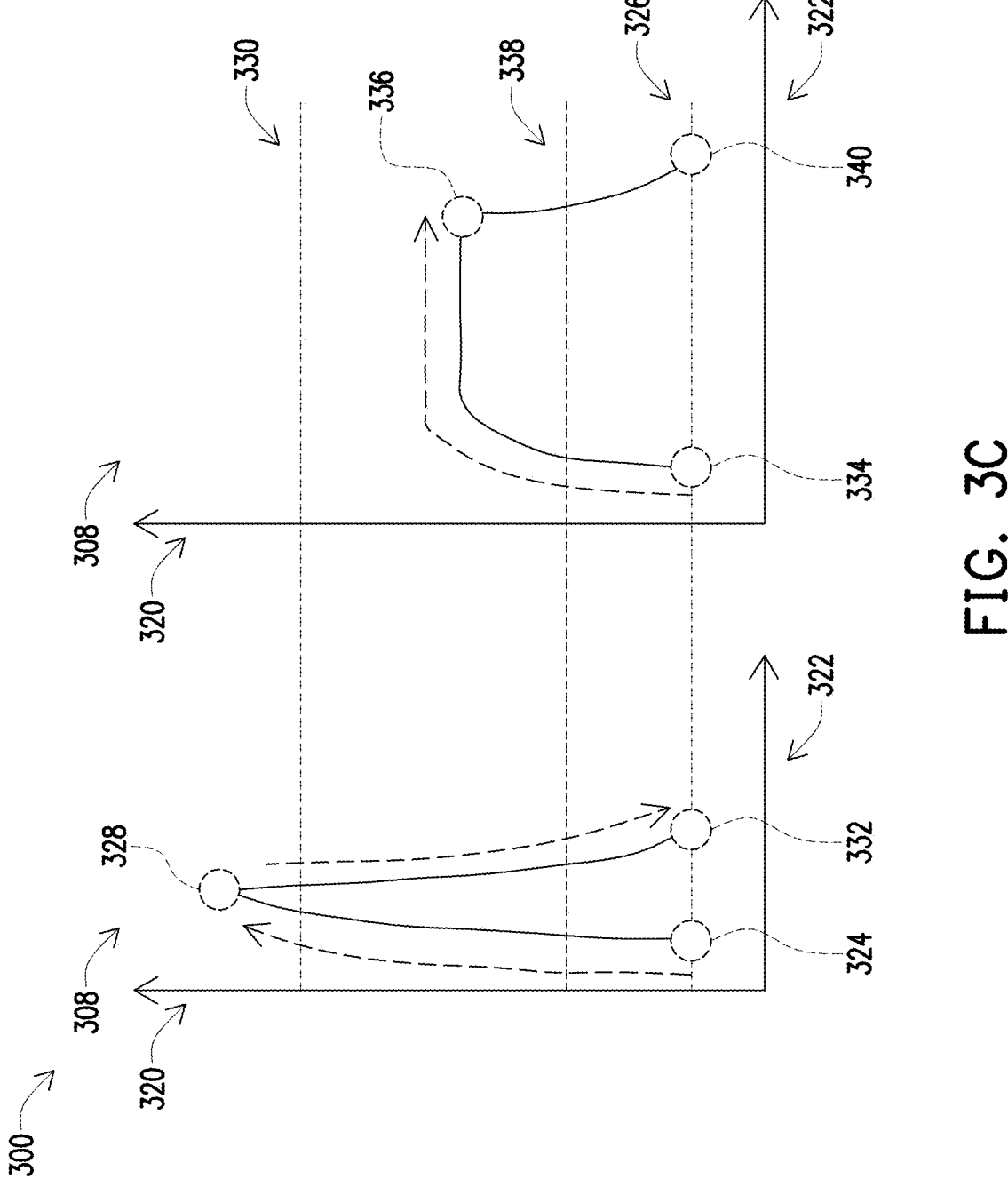

FIGS. 3A-3C are diagrams of example implementations 300 of the operation of the PCM RF switch 200 described herein.

As shown in FIG. 3A, the PCM layer 210 of the PCM RF switch 200 may be transitioned between a crystalline phase 302 and an amorphous phase 304. In the crystalline phase 302, the material structure of the PCM layer 210 is arranged in an ordered and approximately crystalline structure. In the amorphous phase 304, the material structure of the PCM layer 210 is non-crystalline and/or disordered. The crystalline phase 302 may correspond to the on state of the PCM RF switch 200. In the crystalline phase 302, the PCM layer 210 has relatively low resistivity (e.g., relative to the resistivity in the off state), which enables the RF signal 216 to propagate through the PCM layer 210. The amorphous phase 304 may correspond to the off state of the PCM RF switch 200. In the amorphous phase 304, the PCM layer 210 has relatively high resistivity (e.g., relative to the resistivity in the on state), which prevents the RF signal 216 from propagating through the PCM layer 210.

As further shown in FIG. 3A, a reset operation 306 may be performed to transition the PCM layer 210 from the crystalline phase 302 to the amorphous phase 304. A set operation 308 may be performed to transition the PCM layer 210 from the amorphous phase 304 to the crystalline phase 302. The reset operation 306 and the set operation 308 may each include providing a current (Theater) to the heater 206 to cause the heater 206 to heat (increase the temperature of) the PCM layer 210 to a particular temperature and for a particular time duration.

As shown in FIG. 3B, the set operation 308 may be performed for a transition period 312 along a timeline 310 to transition the PCM RF switch 200 to the on state. In the on state, the RF signal 216 may propagate through the PCM layer 210 from the RF in electrode 212 to the RF out electrode 214. In an example use case, the RF signal 216 may propagate from a modem of a wireless communication device to an antenna of the wireless communication device through the PCM RF switch 200 during a signal transmission period 314 so that the RF signal 216 may be wirelessly transmitted. Subsequently, the reset operation 306 may be performed for a transition period 316 to transition the PCM RF switch 200 from the on state to the off state. In the off state, the PCM layer 210 block the propagation of RF signals between the RF in electrode 212 to the RF out electrode 214 for an off duration 318.

FIG. 3C illustrates example temperature profiles for the reset operation 306 and for the set operation 308. The temperature profiles are illustrated as a function of the temperature 320 of the PCM layer 210 and time 322.

In the temperature profile for the reset operation 306, the temperature 320 of the PCM layer 210 may be at a starting temperature 324, which may correspond to a baseline temperature 326 (e.g., room temperature or a baseline operating temperature of the PCM RF switch 200 with the heater 206 off). The heater 206 is subsequently activated by providing a current to the heater 206, which causes the heater 206 to generate heat and increase in temperature. The heat generated by the heater 206 causes the temperature 320 of the PCM layer 210 to also increase from the starting temperature 324.

In the reset operation 306, the temperature 320 of the PCM layer 210 is quickly and rapidly increases to a reset temperature 328. The reset temperature 328 is greater than a melting temperature 330 of the PCM layer 210. Heating the PCM layer 210 such that the temperature 320 of the PCM layer 210 increases to greater than the melting temperature 330 of the PCM layer 210 causes the material of the PCM layer 210 to melt. An example of the melting temperature 330 may be approximately 1000 degrees kelvin. However, other values for the melting temperature 330 are within the scope of the present disclosure.

The heater 206 is subsequently deactivated, and the material of the PCM layer 210 is quenched such that the temperature 320 of the PCM layer 210 rapidly decreases back to an ending temperature 332 corresponding to the baseline temperature 326. The rapid heating (above the melting temperature 330) and cooling of the PCM layer 210 causes the material of the PCM layer 210 to transition from the crystalline phase 302 to the amorphous phase 304.

In the temperature profile for the set operation 308, the temperature 320 of the PCM layer 210 may be at a starting temperature 334, which may correspond to a baseline temperature 326 (e.g., room temperature or a baseline operating temperature of the PCM RF switch 200 with the heater 206 off). The heater 206 is subsequently activated by providing a current to the heater 206, which causes the heater 206 to generate heat and increase in temperature. The heat generated by the heater 206 causes the temperature 320 of the PCM layer 210 to also increase from the starting temperature 334.

In the set operation 308, the temperature 320 of the PCM layer 210 is increased to and maintained at a set temperature 336. The PCM layer 210 is maintained at the set temperature 336 for a greater time duration than the reset temperature 328. For example, the time duration of the set operation 308 may be on the order of a few microseconds (e.g., 1-5 microsections), whereas the time duration of the reset operation 306 may be on the order of nanoseconds (e.g., 100-200 nanoseconds). The set temperature 336 is less than the reset temperature 328. In particular, the set temperature 336 is greater than a crystallization temperature 338 of the material of the PCM layer 210 and less than the melting temperature 330 of the material of the PCM layer 210. An example of the crystallization temperature 338 may be approximately 500 degrees kelvin. However, other values for the crystallization temperature 338 are within the scope of the present disclosure. A greater voltage magnitude may be applied to the heater 206 to heat the PCM layer 210 to a greater temperature in the reset operation 306 relative to the voltage magnitude that is applied to the heater 206 to heat the PCM layer 210 in the set operation 308.

Heating the PCM layer 210 such that the temperature 320 of the PCM layer 210 increases to greater than the crystallization temperature 338 and less than the melting temperature 330 causes the material of the PCM layer 210 to crystalize (or recrystallize), which causes the material of the PCM layer 210 to transition from the amorphous phase 304 to the crystalline phase 302. The heater 206 is subsequently deactivated, and the material of the PCM layer 210 is quenched such that the temperature 320 of the PCM layer 210 decreases to an ending temperature 340 that corresponds to the baseline temperature 326.

As indicated above, FIGS. 3A-3C are provided as examples. Other examples may differ from what is described with regard to FIGS. 3A-3C.

Figure 4:
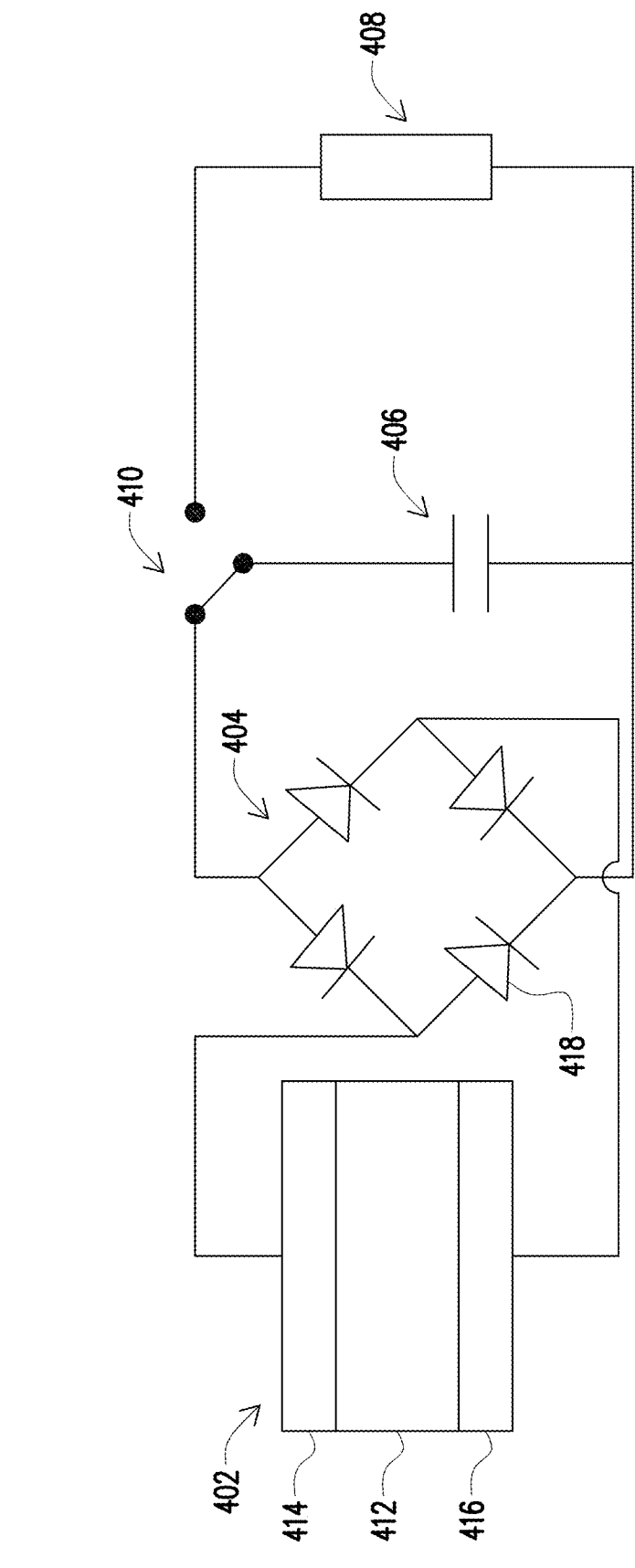
FIG. 4 is a diagram of an example pyroelectric generator described herein.

FIG. 4 is a diagram of an example pyroelectric generator 400 described herein. The pyroelectric generator 400 may be included in a semiconductor device described herein along with the PCM RF switch 200 (or another type of RF switch). The pyroelectric generator 400 may be configured to scavenge heat from the PCM RF switch 200 during operation of the PCM RF switch 200, and may be configured to convert the scavenged heat to an electrical current. The pyroelectric generator 400 may store the electrical current for later use, which conserves energy in the semiconductor device, reduces energy consumption in the semiconductor device, and/or reduces thermal waste in the semiconductor device, among other examples.

The pyroelectric generator 400 is a type of electricity generator that generates electricity based on changes in temperature (e.g., as opposed to based on a temperature difference between a hot plate and a cold plate). Thus, the pyroelectric generator 400 may be particularly suitable for generating electricity based on the operation of the PCM RF switch 200 because of the high rate of switching between the crystalline phase 302 and the amorphous phase 304 using the temperature profiles described in connection with FIG. 3C.

As shown in FIG. 4, the pyroelectric generator 400 may include a pyroelectric device 402, a rectifier circuit 404, an electrical storage device 406, a load 408, and a switch 410, among other examples. The pyroelectric generator 400 is electrically connected with the rectifier circuit 404. The rectifier circuit 404 may be selectively electrically connected with the electrical storage device 406 or the load 408 based on the position or configuration of the switch 410.

The pyroelectric device 402 includes a pyroelectric material layer 412 between a top electrode 414 and a bottom electrode 416. The pyroelectric material layer 412 is configured to generate an electrical current based on changes in temperature in the PCM RF switch 200. For example, the pyroelectric material layer 412 may generate an electrical current during a set operation 308 in a transition period 312 to transition the PCM RF switch 200 to the on state. As another example, the pyroelectric material layer 412 may generate an electrical current during a reset operation 306 in a transition period 316 to transition the PCM RF switch 200 to the off state.

The pyroelectric material layer 412 may include a pyroelectric material or ferroelectric (FE) material that has an electrical polarization that can be reversed by the application of a temporal change in temperature. Examples of materials that may be used for the pyroelectric material layer 412 include a hafnium oxide ($HfO_x$ such as $HFO_2$), a doped hafnium oxide, lead zirconate titanate (PZT), strontium bismuth tantalate (SBT), triglycine sulfate (TGS), lithium niobate ($LiNbO_x$ such as $LiNbO_3$), lithium tantalate ($LiTaO_x$ such as $LiTaO_3$), gallium nitride (GaN), lead magnesium niobate-lead titanate ($PMN_x$-$PT_y$ such as $PMN_{67}PT_{33}$), hafnium zirconate ($Hf_xZr_yO_z$ such as $Hf_{0.36}Zr_{0.64}O_2$ or $Hf_{0.5}Zr_{0.5}O_2$), polyvinylidene fluoride (PVDF), aluminum nitride (MN), and/or polyvinylidene fluoride-trifluoroethylene ($PVDF_x$-$TrFE_y$ such as $PVDF_{70}$-$TrFE_{30}$), among other examples. Examples of doped hafnium oxide materials include a zirconium-doped hafnium oxide, a silicon-doped hafnium oxide, an aluminum-doped hafnium oxide, a lanthanum-doped hafnium oxide, gadolinium-doped hafnium oxide, and/or strontium-doped hafnium oxide, among other examples.

The electrical current is generated based on charge polarization in the pyroelectric material layer 412. Remnant charge polarization in the pyroelectric material layer 412 causes electrons and holes in the pyroelectric material layer 412 to be attracted to opposing electrodes of the top electrode 414 and the bottom electrode 416. This causes the electrical current to flow from top electrode 414 and the bottom electrode 416 to the rectifier circuit 404. The top electrode 414 and the bottom electrode 416 may each include a conductive material such as tungsten (W), titanium nitride (TiN), tantalum nitride (Tan), and/or molybdenum (Mo), among other examples.

The rectifier circuit 404 includes a plurality of diodes 418 that may be arranged as a bridge rectifier. The rectifier circuit 404 is configured to rectify the electrical current that is generated by the pyroelectric device 402. Polarity of charges (e.g., electrons and holes) in the pyroelectric material layer 412, and therefore the polarity of a rectified current that is output from the pyroelectric device 402, may be different depending on the type of temperature change that occurs in the pyroelectric material layer 412. For example, electrons may migrate toward the top electrode 414 and holes may migrate toward the bottom electrode 416 when the temperature change that occurs in the pyroelectric material layer 412 is an increase in temperature. As another example, holes may migrate toward the top electrode 414 and electrons may migrate toward the bottom electrode 416 when the temperature change that occurs in the pyroelectric material layer 412 is a decrease in temperature. Accordingly, the rectifier circuit 404 may be included in the pyroelectric generator 400 to generate rectified current output that has the same polarity regardless of the polarity of the electrical current received from the pyroelectric device 402.

The electrical storage device 406 may include a capacitor, a battery, and/or another type of device that is configured to store the rectified current output from the rectifier circuit 404. The load 408 may include any electrical load in the semiconductor device and/or in another device. For example, the load 408 may include the heater 206. In this way, heat may be scavenged from the PCM RF switch 200 and converted to an electrical current that may be reused to operate the heater 206. However, other uses for the electrical current stored in the electrical storage device 406 are within the scope of the present disclosure.

As indicated above, FIG. 4 is provided as an example. Other examples may differ from what is described with regard to FIG. 4.

Figure 5B:
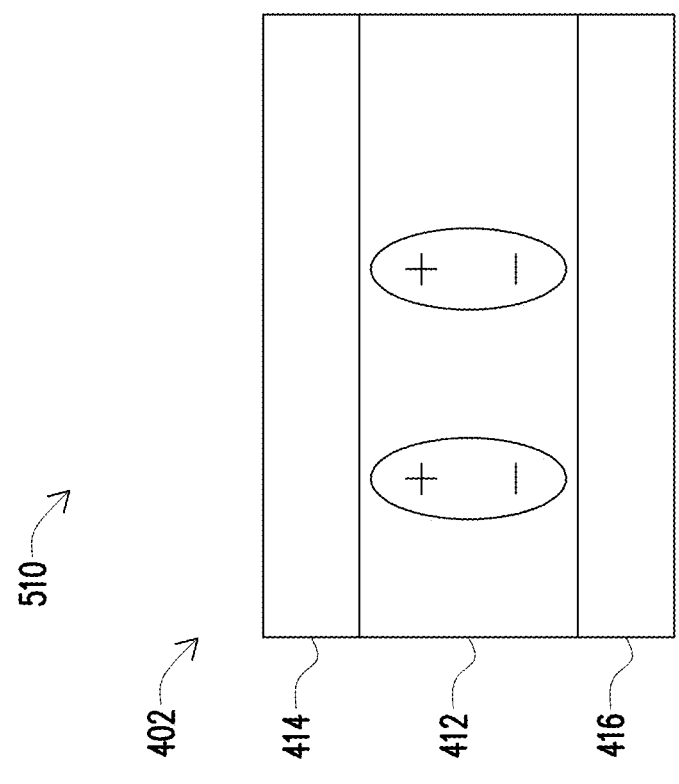
FIGS. 5A, 5B, 6A, 6B, and 7A-7D are diagrams of example implementations of the operation of a pyroelectric device described herein.
Figure 5A:
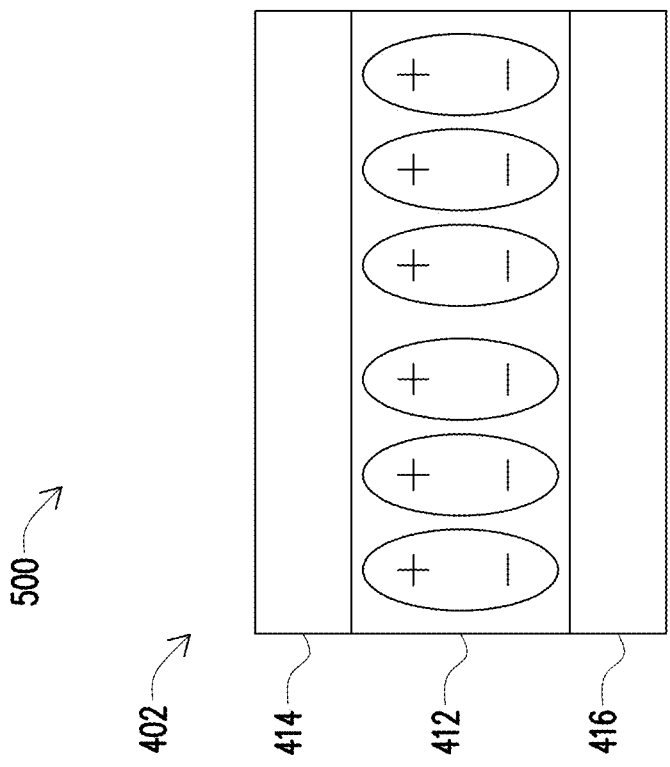

FIGS. 5A and 5B are diagrams of example implementations of the operation of the pyroelectric device 402 described herein. FIG. 5A illustrates an example implementation 500 of remnant polarization charges in the pyroelectric material layer 412 of the pyroelectric device 402. FIG. 5B illustrates an example implementation 510 of time varying temperature causing remnant polarization changes in the pyroelectric material layer 412. The remnant polarization changes (which are reversable) in the pyroelectric material layer 412 changes the external charges that are attracted at each of the top electrode 414 and the bottom electrode 416 by electrostatic force. The change in external charges results in the generation of an electrical current, which may be stored in the electrical storage device 406 for energy harvesting. The electrical current $I_p$ generated by the pyroelectric material layer 412 may be determined as:

$$I_p = Ap\frac{dT}{dt}$$

where the electrical current $I_p$ generated by the pyroelectric material layer 412 corresponds to a product of the electrode area A of the top electrode 414 and the bottom electrode 416, the pyroelectric coefficient p of the pyroelectric material layer 412, and the temperature change dT per time dt in the pyroelectric material layer 412. For a constant electrode area A, the electrical current $I_p$ generated by the pyroelectric material layer 412 is directly proportional to the temperature change dT per time dt and the pyroelectric coefficient. Thus, the frequent temperature changes that occur in the PCM RF switch 200 enables the pyroelectric device 402 to achieve a high rate of electrical current generation.

As indicated above, FIGS. 5A and 5B are provided as examples. Other examples may differ from what is described with regard to FIGS. 5A and 5B.

Figure 6A:
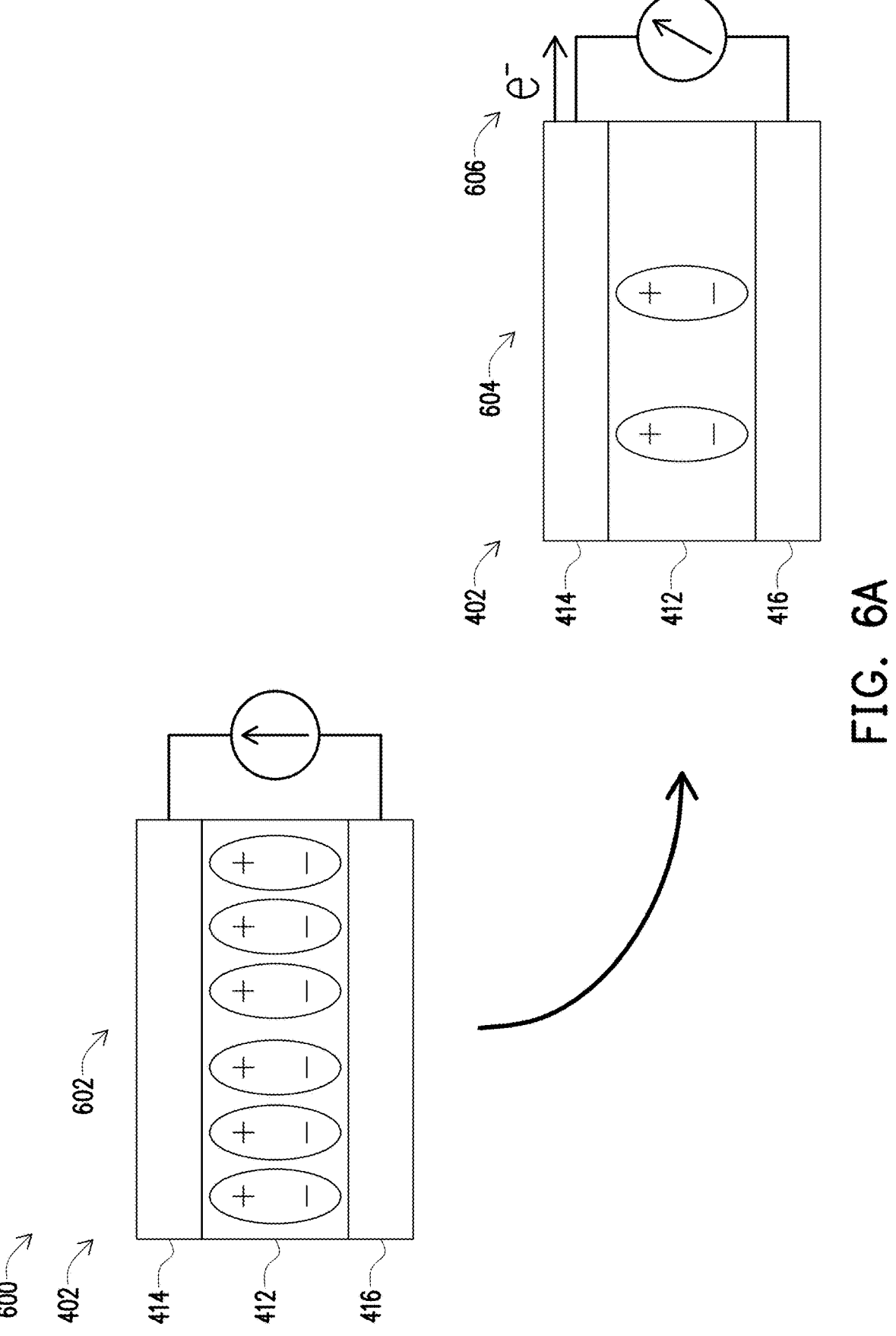
Figure 6B:
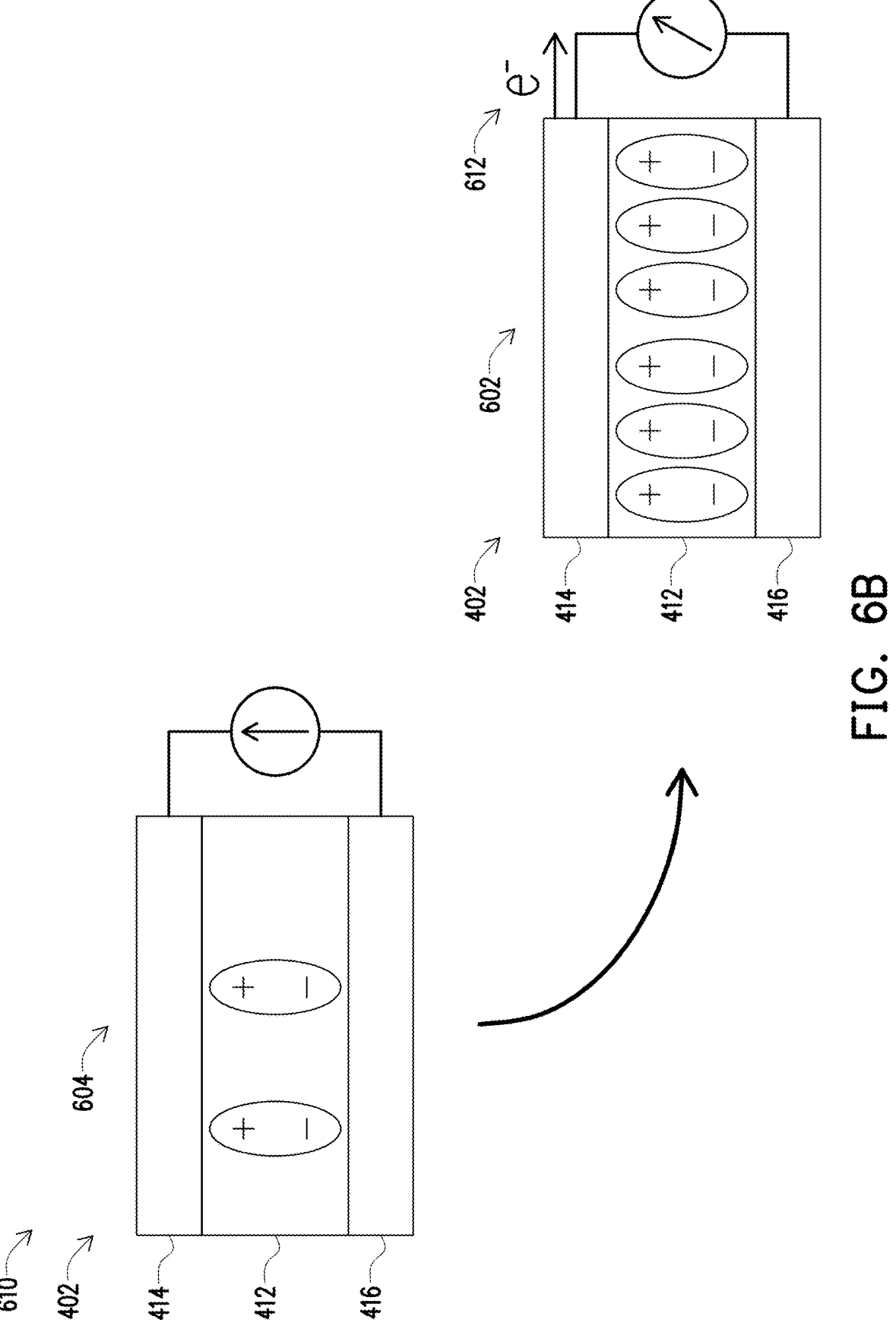

FIGS. 6A and 6B are diagrams of example implementations of the operation of the pyroelectric device 402 described herein. FIG. 6A illustrates an example implementation 600 in which the pyroelectric material layer 412 transitions from a cold temperature 602 (e.g., the baseline temperature 326) to a hot temperature 604 (e.g., the reset temperature 328, the set temperature 336, among other examples). At the cold temperature 602, the temperature change dT per time dt in the pyroelectric material layer 412 is approximately zero, and the pyroelectric material layer 412 is not generating an electrical current. As the pyroelectric material layer 412 transitions from the cold temperature 602 to the hot temperature 604, the temperature change dT per time dt in the pyroelectric material layer 412 increases. The pyroelectric material layer 412 generates an electrical current 606 as the pyroelectric material layer 412 transitions from the cold temperature 602 to the hot temperature 604.

FIG. 6B illustrates an example implementation 610 in which the pyroelectric material layer 412 transitions from the hot temperature 604 (e.g., the reset temperature 328, the set temperature 336, among other examples) to the cold temperature 602 (e.g., the baseline temperature 326). At the hot temperature 604, the temperature change dT per time dt in the pyroelectric material layer 412 is approximately zero, and the pyroelectric material layer 412 is not generating an electrical current. As the pyroelectric material layer 412 transitions from the hot temperature 604 to the cold temperature 602, the temperature change dT per time dt in the pyroelectric material layer 412 increases. The pyroelectric material layer 412 generates an electrical current 612 as the pyroelectric material layer 412 transitions from the hot temperature 604 to the cold temperature 602.

As described above in connection with FIG. 4, the polarity of charges in the pyroelectric material layer 412, and therefore the polarity of electrical current that is output from the pyroelectric device 402, may be different depending on the type of temperature change that occurs in the pyroelectric material layer 412. As a result, the electrical current 606 that is generated as the pyroelectric material layer 412 transitions from the cold temperature 602 to the hot temperature 604, and the electrical current 612 that is generated as the pyroelectric material layer 412 transitions from the hot temperature 604 to the cold temperature 602, may have different polarizations. The rectifier circuit 404 may rectify the electrical current 606 and the electrical current 612 such that the rectified current that is output from the rectifier circuit 404 has the same polarization.

As indicated above, FIGS. 6A and 6B are provided as examples. Other examples may differ from what is described with regard to FIGS. 6A and 6B.

Figure 7A:
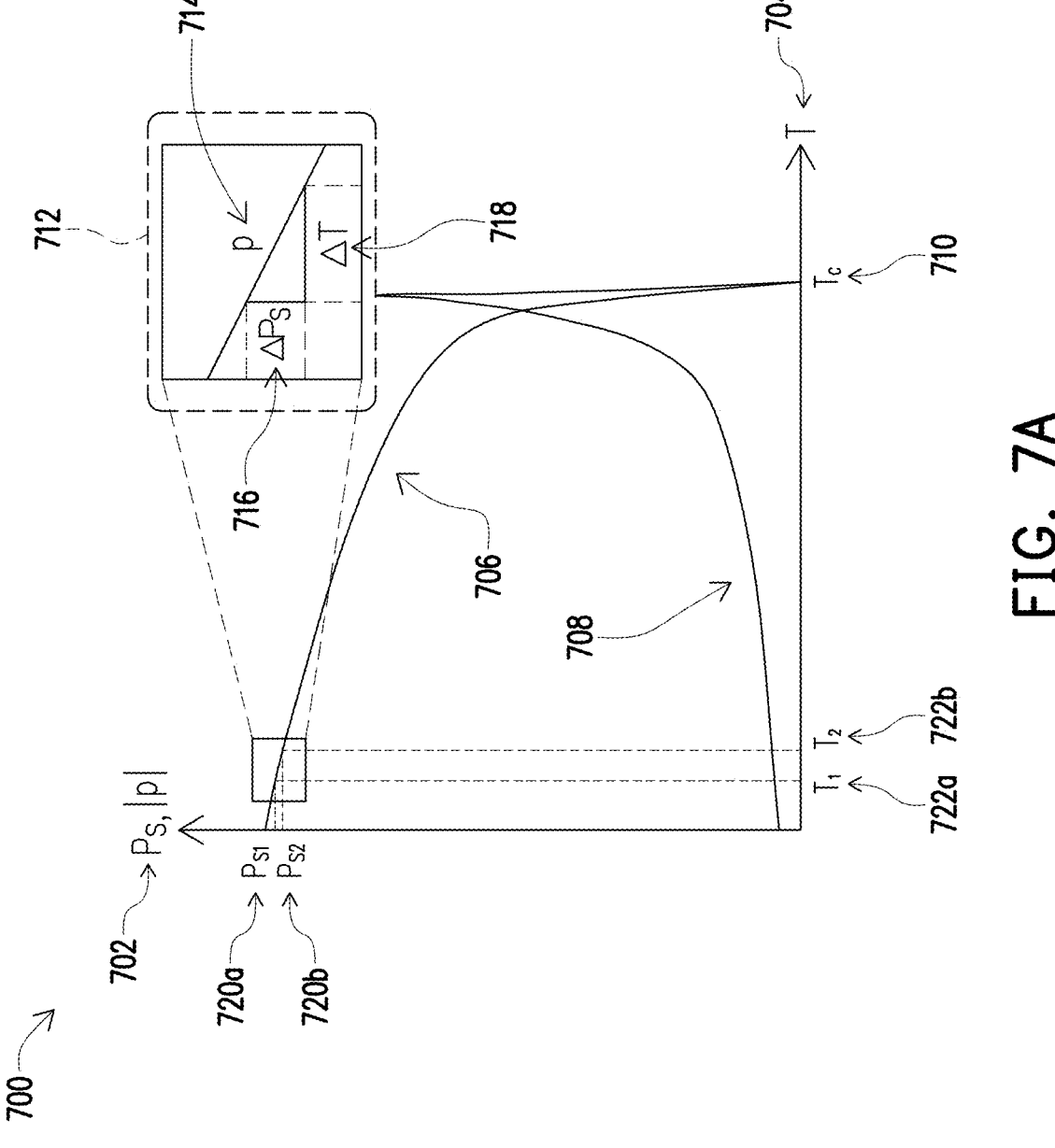

FIGS. 7A-7D are diagrams of example implementations of the operation of the pyroelectric device 402 described herein. FIG. 7A illustrates an example implementation 700 of remnant polarization curves as a function of spontaneous polarization ($P_s$) 702 and temperature (T) 704. The remnant polarization curves include a remnant polarization curve 706 for remnant polarization at or near the baseline temperature 326 and a remnant polarization curve 706 for remnant polarization at a high temperature such as the reset temperature 328 or the set temperature 336, among other examples. The curie temperature 710 is also illustrated in the data plot in FIG. 7A, and may correspond to the working temperature of the pyroelectric device 402.

As shown in a close-up view 712 along the remnant polarization curve 706 FIG. 7A, the pyroelectric coefficient (p) 714 may correspond to the slope of the remnant polarization curve 706. Thus, the pyroelectric coefficient (p) 714 at a given segment along the remnant polarization curve 706 (or the remnant polarization curve 708) is based on the change in spontaneous polarization ($\Delta P_s$) 716 and the change in temperature ($\Delta T$) 718 of the segment along the remnant polarization curve 706, and not necessarily on the actual value of the spontaneous polarization and the actual value of the temperature. The pyroelectric coefficient (p) 714 at a given segment along the remnant polarization curve 706 (or the remnant polarization curve 708) may be determined as:

$$p = \frac{dP_s}{dT}$$

where pyroelectric coefficient (p) 714 corresponds to the derivative of spontaneous polarization with respect to the temperature.

The change in spontaneous polarization (ΔP_s) 716 corresponds to a different in spontaneous polarization between two points P_{S1} 720a and P_{S2} 720b of the segment. The change in temperature (ΔT) 718 corresponds to a different in temperature between two points T_1 722a and T_2 722b of the segment.

Figures 7B, 7C:
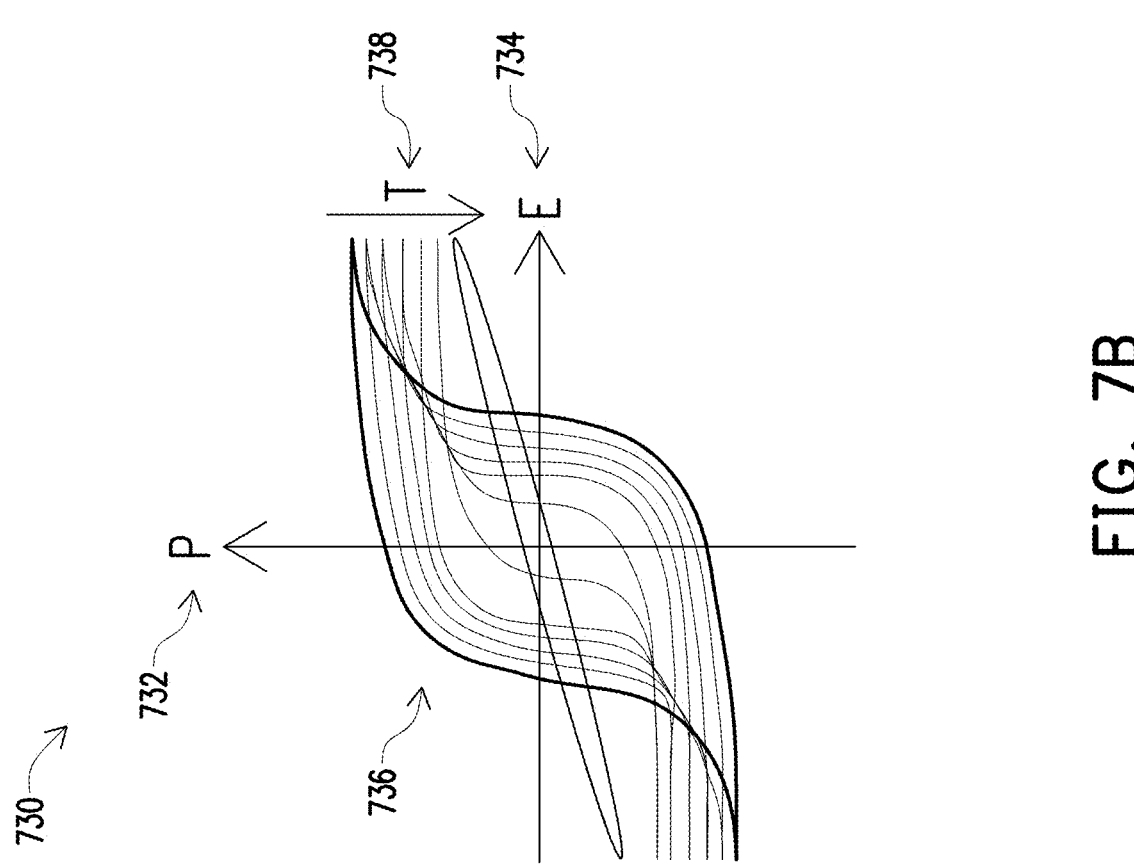

FIG. 7B illustrates an example implementation 730 of polarization-electric field hysteresis in the pyroelectric material layer 412. The polarization-electric field hysteresis in the pyroelectric material layer 412 is illustrated as a function of polarization (P) 732 and electric field (E) 734. As shown in FIG. 7B, a plurality of hysteresis loops 736 are represented across a change (reduction) in temperature 738. In particular, the polarization-electric field hysteresis in the pyroelectric material layer 412 may become more and more "pinched" as temperature increases in the pyroelectric material layer 412.

FIG. 7C illustrates an example implementation 740 of remnant polarization reversal in the pyroelectric material layer 412. As shown in FIG. 7C, remnant polarization 742 is illustrated as a function of polarization 744 and temperature 746. The remnant polarization 742 may be reversable with temperature 746. In some implementations, the remnant polarization 742 in a particular temperature range. The remnant polarization 742 may be reversable in that changes in the remnant polarization 742 may not be permanent in the pyroelectric material layer 412 within the temperature range.

Figure 7D:
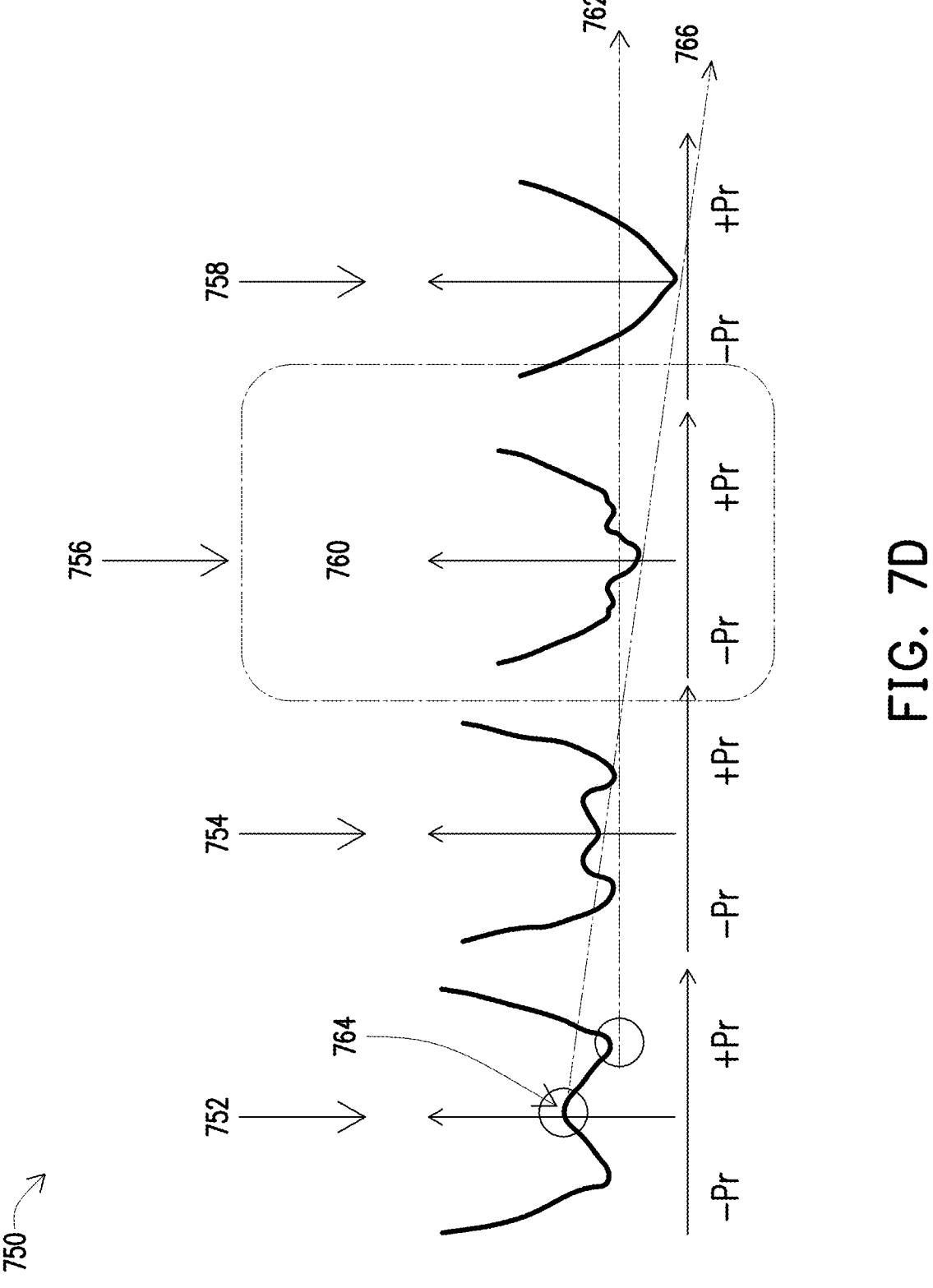

FIG. 7D illustrates an example implementation 750 of orthorhombic phases 752-758 of the pyroelectric material layer 412. The orthorhombic phase 756 may occur at or near the curie temperature 760 of the pyroelectric material layer 412. As shown in FIG. 7D, the orthorhombic phase of the pyroelectric material layer 412 may change as a function of temperature, and may be reversable as within a temperature range in a similar manner as the remnant polarization 742. Each of the orthorhombic phases 752-758 may include a tetragonal component 762 at a non-polar region 764 of the orthorhombic phases 752-758, and an orthorhombic component 766.

As indicated above, FIGS. 7A-7D are provided as examples. Other examples may differ from what is described with regard to FIGS. 7A-7D.

Figures 8A, 8B:
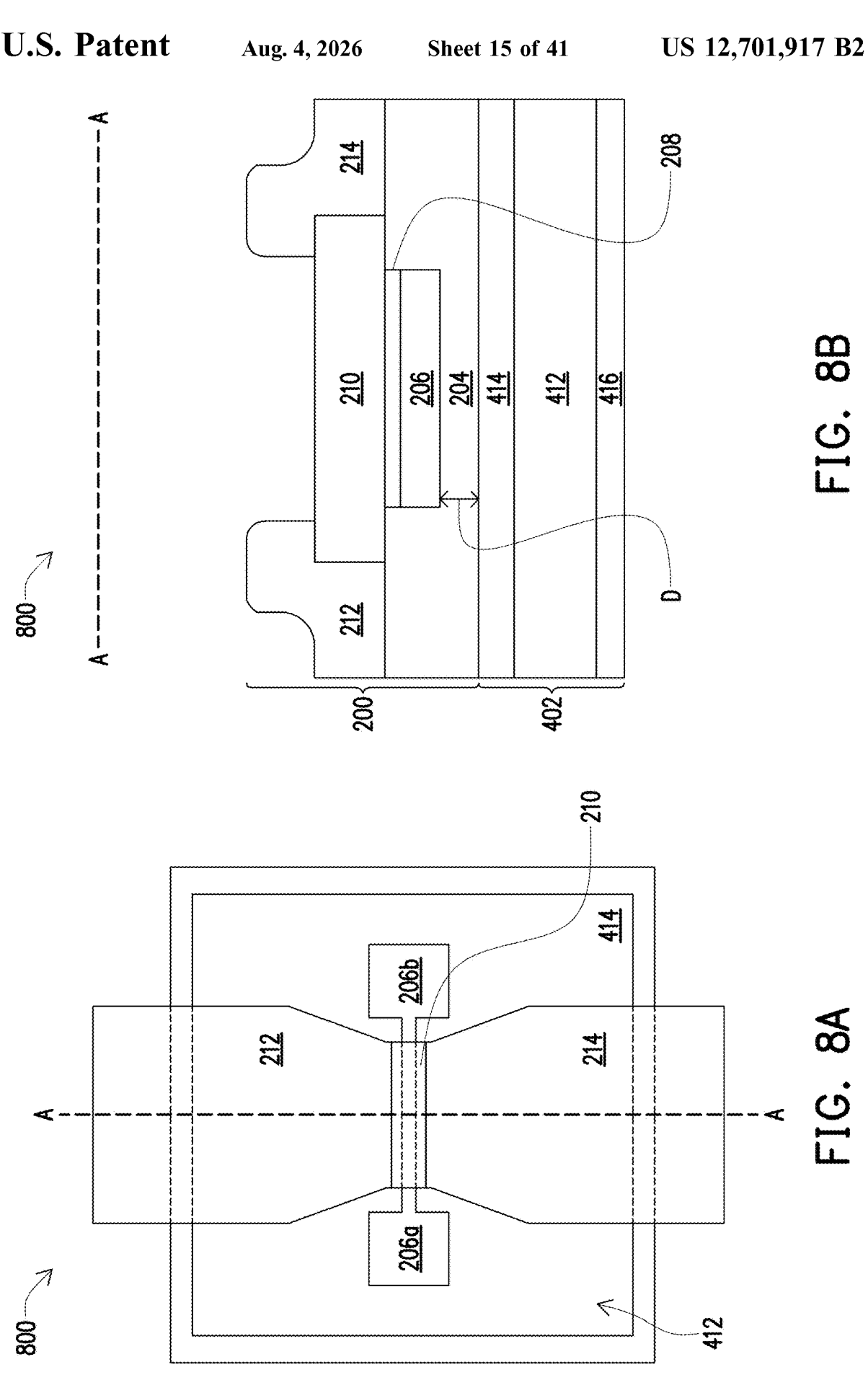
FIGS. 8A and 8B are diagrams of an example semiconductor device described herein.

FIGS. 8A and 8B are diagrams of an example semiconductor device 800 described herein. FIG. 8A illustrates a top-down view of the semiconductor device 800. FIG. 8B illustrates a cross-sectional view of the semiconductor device 800 in a cross-sectional plane along the line AA in FIG. 8A. As shown in FIGS. 8A and 8B, the semiconductor device 800 includes a combination of the PCM RF switch 200 and the pyroelectric device 402 of the pyroelectric generator 400. In some implementations, the semiconductor device 800 may also include other components of the pyroelectric generator 400, such as the rectifier circuit 404, the electrical storage device 406, the load 408, and/or the switch 410. In some implementations, one or more of the rectifier circuit 404, the electrical storage device 406, the load 408, and/or the switch 410 are included in a different semiconductor device from the semiconductor device 800.

As shown in FIGS. 8A and 8B, the pyroelectric device 402 may be adjacent to the PCM RF switch 200 in the semiconductor device 800. As an example, and as shown in FIGS. 8A and 8B, the pyroelectric device 402 may be below and/or under at least a portion of the PCM RF switch 200 in the semiconductor device 800 such that the PCM RF switch 200 (and/or one or more structures or layers thereof) is over at least a portion of the pyroelectric device 402. In other examples, the pyroelectric device 402 may be next to and/or above the PCM RF switch 200 in the semiconductor device 800.

As shown in FIG. 8B, the pyroelectric device 402 includes the bottom electrode 416, the pyroelectric material layer 412 over and/or on the bottom electrode 416, and the top electrode 414 over and/or on the pyroelectric material layer 412. As further shown in FIG. 8B, the PCM RF switch 200 may include the oxide layer 204, the heater 206 on and/or in a recess of the oxide layer 204, the insulator layer 208 over and/or on the heater 206, the PCM layer 210 over and/or on the insulator layer 208, and a plurality of contacts (e.g., the RF in electrode 212 and the RF out electrode 214) at least partially over and/or on the PCM layer 210.

As further shown in FIG. 8B, the heater 206 and the pyroelectric device 402 (e.g., the heater 206 and the top electrode 414 of the pyroelectric device 402) may be spaced apart by a distance (D) (e.g., a vertical distance) in the semiconductor device 800. The distance (D) may be included in a range of approximately 0.1 microns to approximately 1 micron to achieve good responsivity for temperature changes for the temperature range in which the pyroelectric device 402 is configured to operate. However, other values for the range are within the scope of the present disclosure. If the pyroelectric device 402 is positioned too close to the heater 206, the pyroelectric device 402 will always be too hot and will not experience enough of a change in temperature to efficiently generate current. Conversely, if the pyroelectric device 402 is positioned too far away from the heater 206, the pyroelectric device 402 will always be too cold and will not experience enough of a temperature change to efficiently generate current.

Referring back to FIG. 8A, the RF in electrode 212 and the RF out electrode 214 extend outward and/or away from the PCM layer 210, and over the top electrode 414 and the pyroelectric material layer 412, on opposing sides of the PCM layer 210. The heater regions 206a and 206b extend outward and/or away from the PCM layer 210, and over the top electrode 414 and the pyroelectric material layer 412, on opposing sides of the PCM layer 210. The RF in electrode 212 and the RF out electrode 214, and the heater regions 206a and 206b, may extend outward and/or away from the PCM layer 210 in approximately perpendicular directions.

As further shown in FIG. 8A, the top electrode 414 and the pyroelectric material layer 412 (and the bottom electrode 416, which is not illustrated in FIG. 8A) may occupy a larger horizonal physical area relative to the PCM RF switch 200. Thus, portions of the top electrode 414 and the pyroelectric material layer 412 (and the bottom electrode 416, which is not illustrated in FIG. 8A) extend outward from and are not directly under the heater 206, the PCM layer 210, the RF in electrode 212, and/or the RF out electrode 214.

As indicated above, FIGS. 8A and 8B are provided as examples. Other examples may differ from what is described with regard to FIGS. 8A and 8B.

Figure 9A:
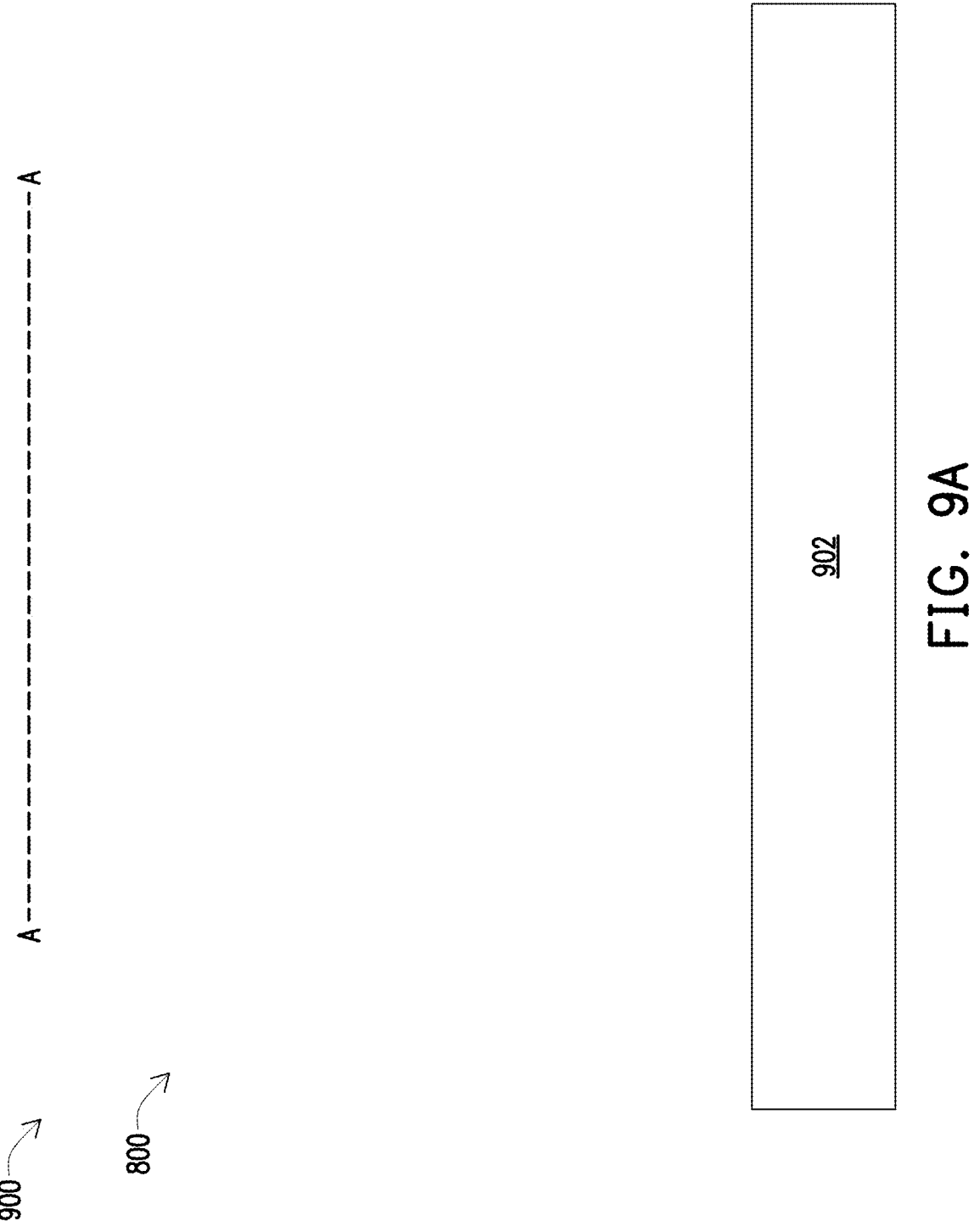
FIGS. 9A-90 are diagrams of an example implementation described herein.
Figure 90:
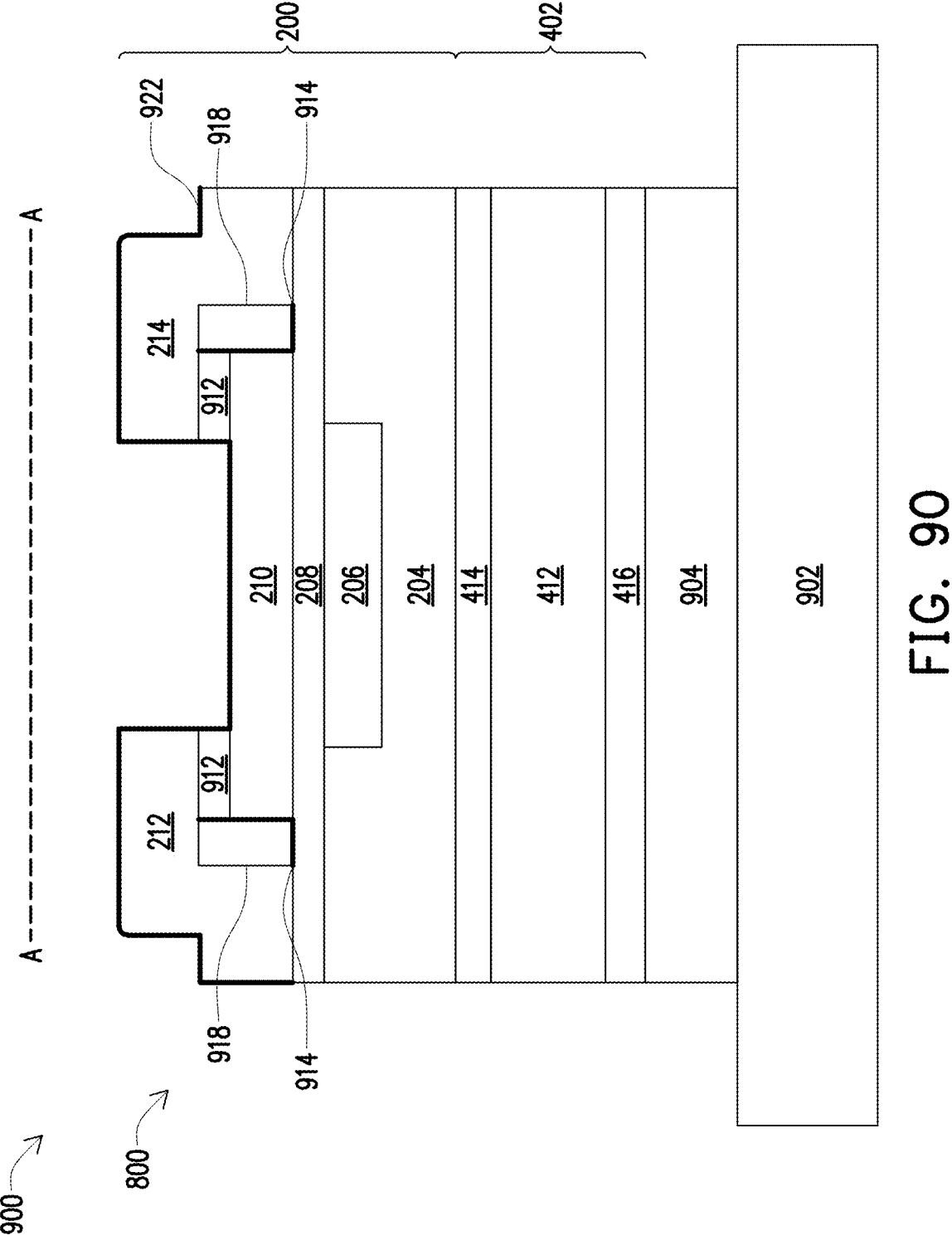

FIGS. 9A-90 are diagrams of an example implementation 900 described herein. The example implementation 900 includes an example process for forming the semiconductor device 800 described herein. As shown in FIG. 9A, the example process for forming the semiconductor device 800 described herein may be performed on a substrate 902, which may include a wafer, a carrier substrate, and/or another type of semiconductor processing substrate.

Figure 9B:
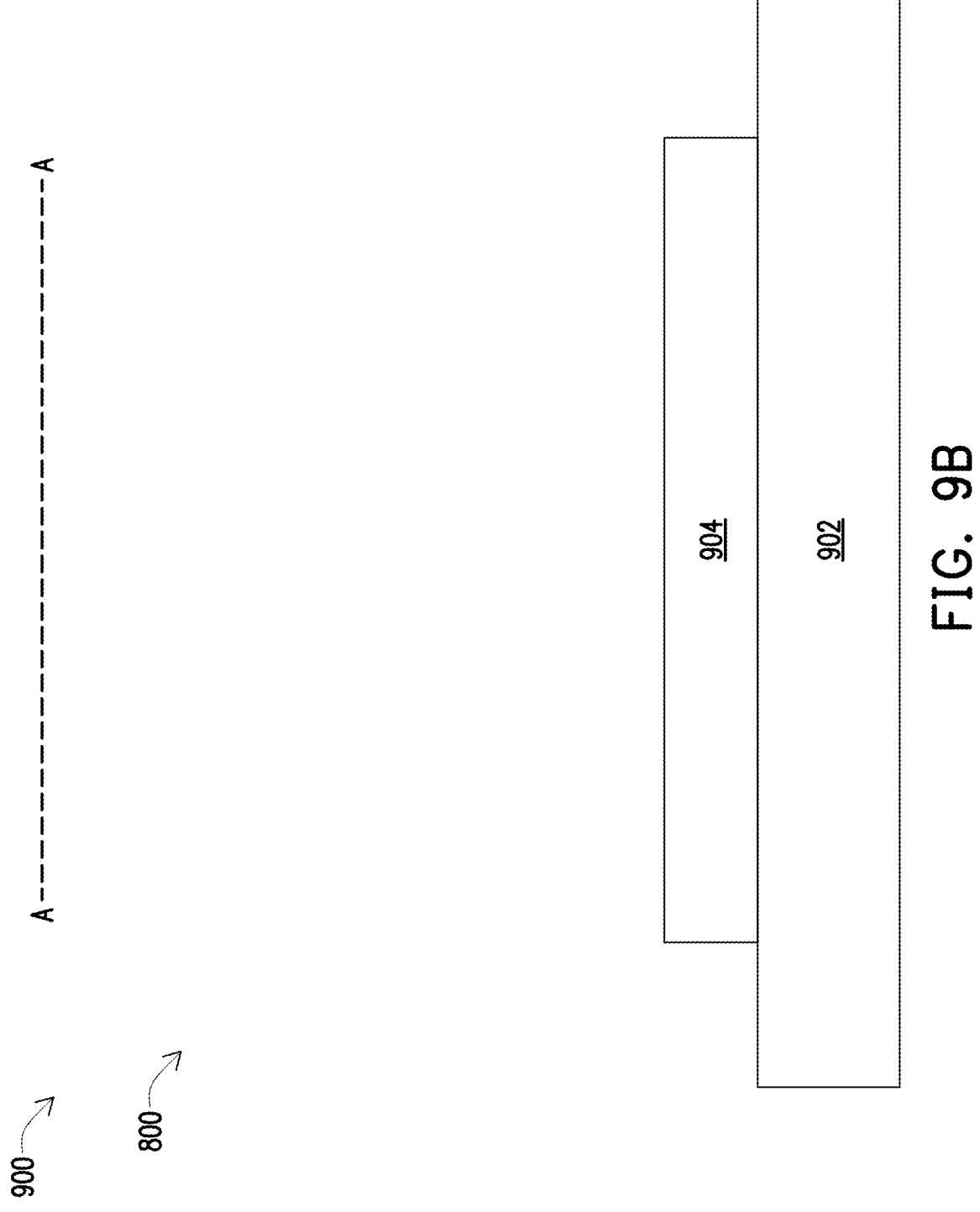

As shown in FIG. 9B, an oxide layer 904 may be formed over and/or on the substrate 902. The deposition tool 102 may deposit the oxide layer 904 in a chemical oxidation operation, a thermal oxidation operation, a PVD operation, an ALD operation, a CVD operation, another type of deposition operation described in connection with FIG. 1, and/or another suitable deposition operation. In some implementations, the planarization tool 110 planarizes the oxide layer 904 after the deposition tool 102 deposits the oxide layer 904.

Figure 9C:
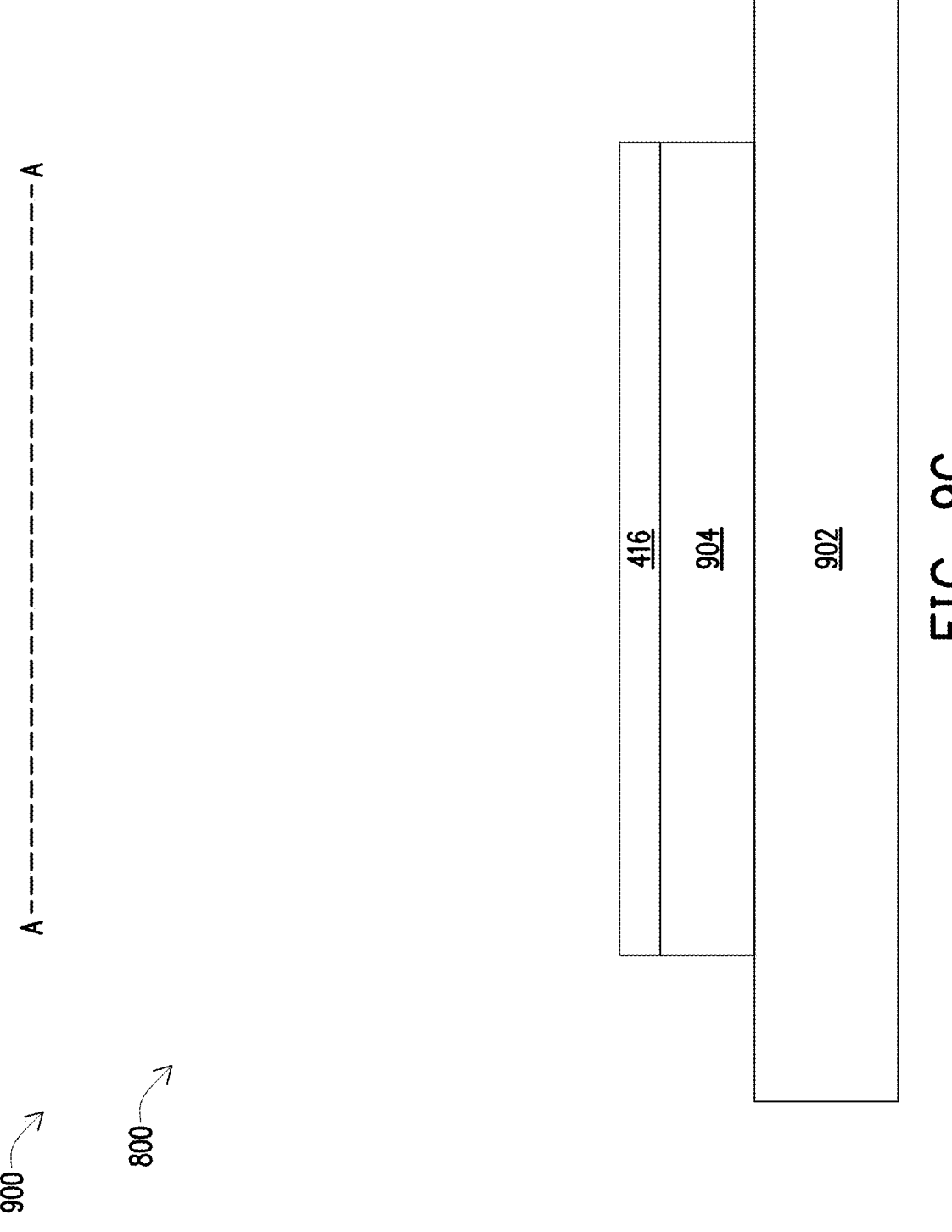

As shown in FIG. 9C, the bottom electrode 416 is formed over and/or on the oxide layer 904. The deposition tool 102 and/or the plating tool 112 may deposit the bottom electrode 416 in a CVD operation, a PVD operation, an ALD operation, an electroplating operation, another deposition operation described above in connection with FIG. 1, and/or another suitable deposition operation. In some implementations, the planarization tool 110 planarizes the bottom electrode 416 after the deposition tool 102 and/or the plating tool 112 deposits the bottom electrode 416.

Figure 9D:
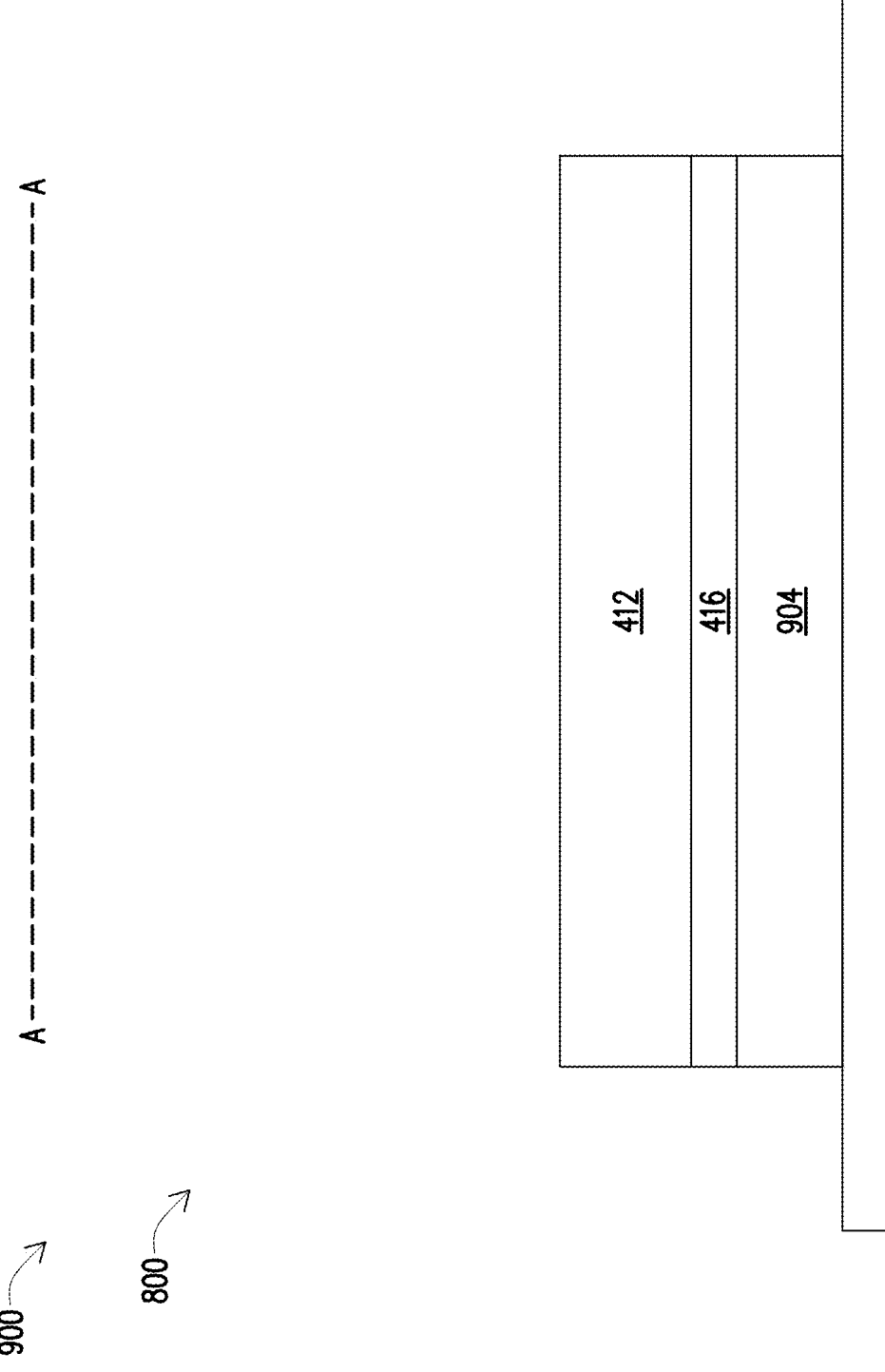

As shown in FIG. 9D, the pyroelectric material layer 412 is formed over and/or on the bottom electrode 416. The deposition tool 102 may deposit the pyroelectric material layer 412 in a PVD operation, an ALD operation, a CVD operation, another type of deposition operation described in connection with FIG. 1, and/or another suitable deposition operation. In some implementations, the planarization tool 110 planarizes the pyroelectric material layer 412 after the deposition tool 102 deposits the pyroelectric material layer 412.

Figure 9E:
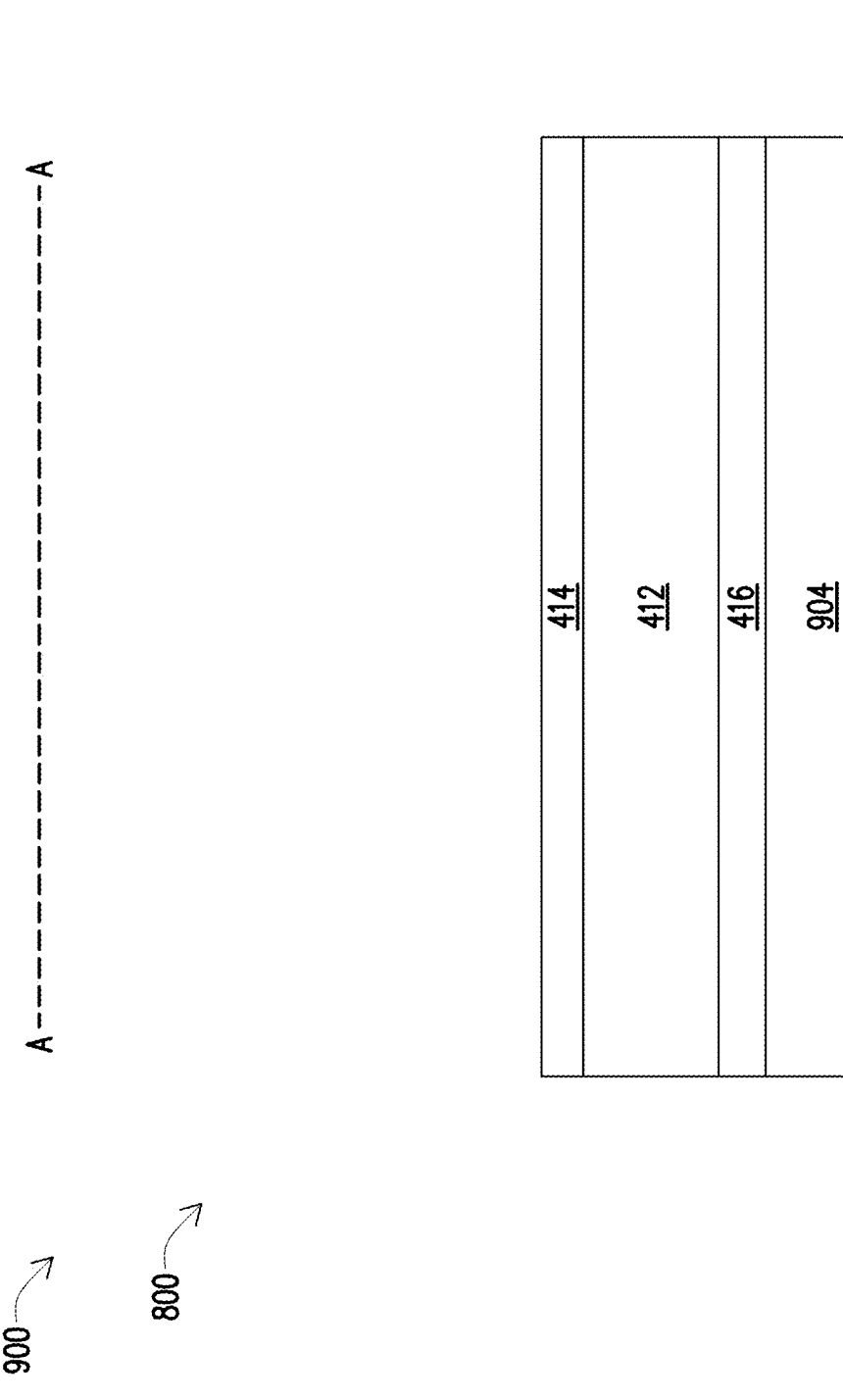

As shown in FIG. 9E, the top electrode 414 is formed over and/or on the pyroelectric material layer 412. The deposition tool 102 and/or the plating tool 112 may deposit the top electrode 414 in a CVD operation, a PVD operation, an ALD operation, an electroplating operation, another deposition operation described above in connection with FIG. 1, and/or another suitable deposition operation. In some implementations, the planarization tool 110 planarizes the top electrode 414 after the deposition tool 102 and/or the plating tool 112 deposits the top electrode 414.

Figure 9F:
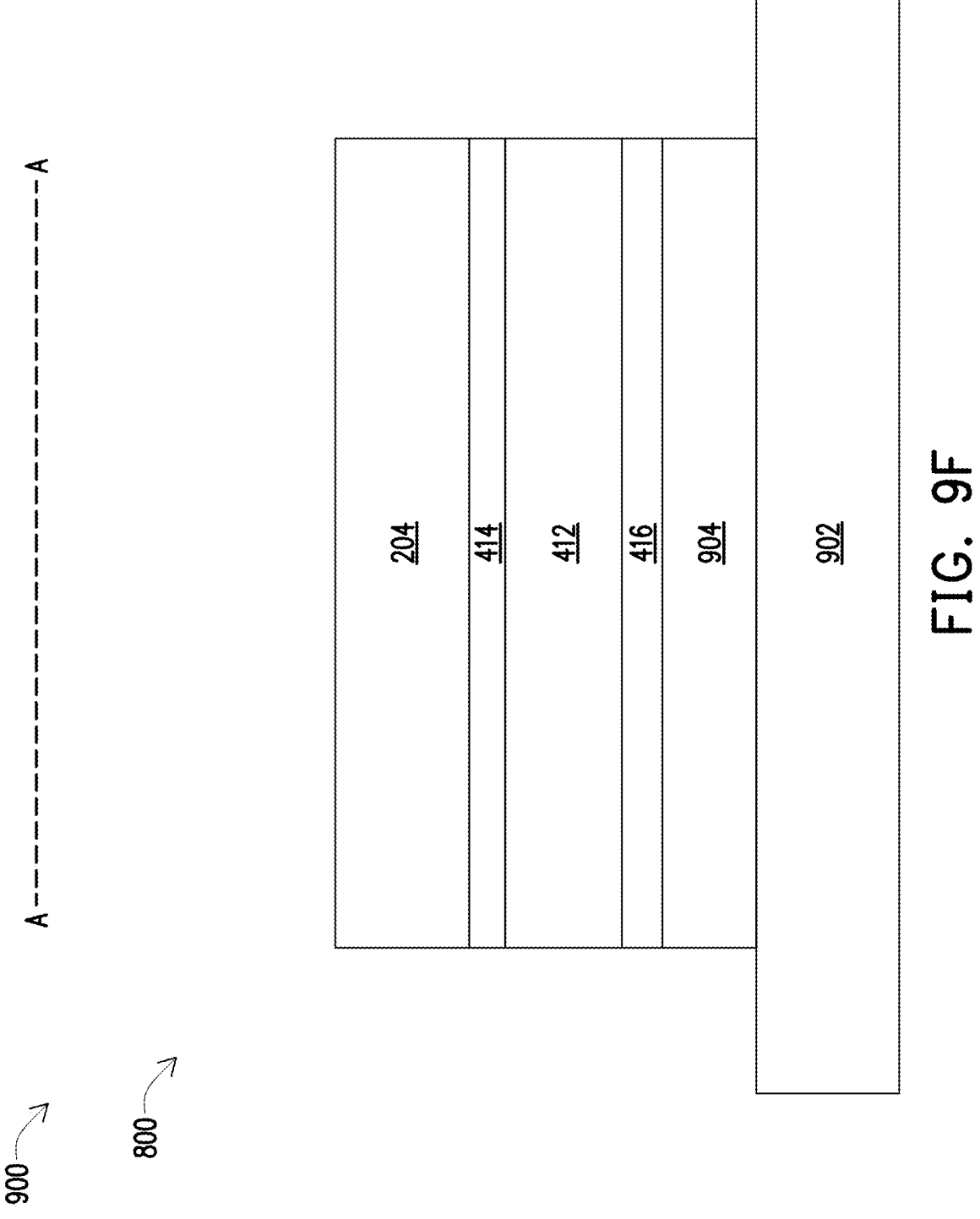

As shown in FIG. 9F, the oxide layer 204 may be formed over and/or on the top electrode 414. The deposition tool 102 may deposit the oxide layer 204 in a chemical oxidation operation, a thermal oxidation operation, a PVD operation, an ALD operation, a CVD operation, another type of deposition operation described in connection with FIG. 1, and/or another suitable deposition operation. In some implementations, the planarization tool 110 planarizes the oxide layer 204 after the deposition tool 102 deposits the oxide layer 204.

Figure 9G:
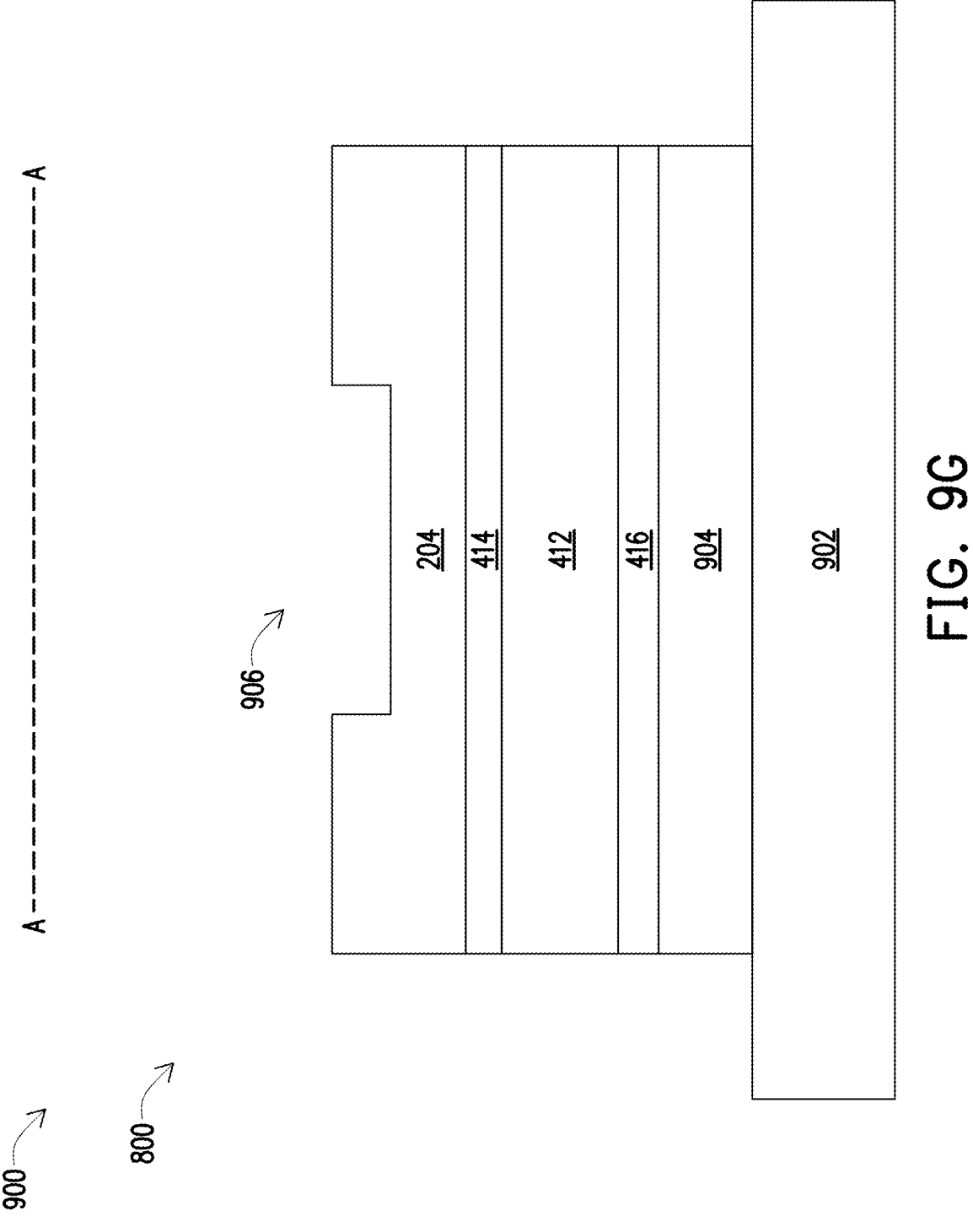

As shown in FIG. 9G, a recess 906 may be formed in the oxide layer 204. In some implementations, a pattern in a photoresist layer is used to form the recess 906 in the oxide layer 204. In these implementations, the deposition tool 102 forms the photoresist layer on the oxide layer 204. The exposure tool 104 exposes the photoresist layer to a radiation source to pattern the photoresist layer. The developer tool 106 develops and removes portions of the photoresist layer to expose the pattern. The etch tool 108 performs an etch operation to etch into the oxide layer 204 to form the recess 906 in the oxide layer 204. In some implementations, the etch operation includes the use of a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 9H:
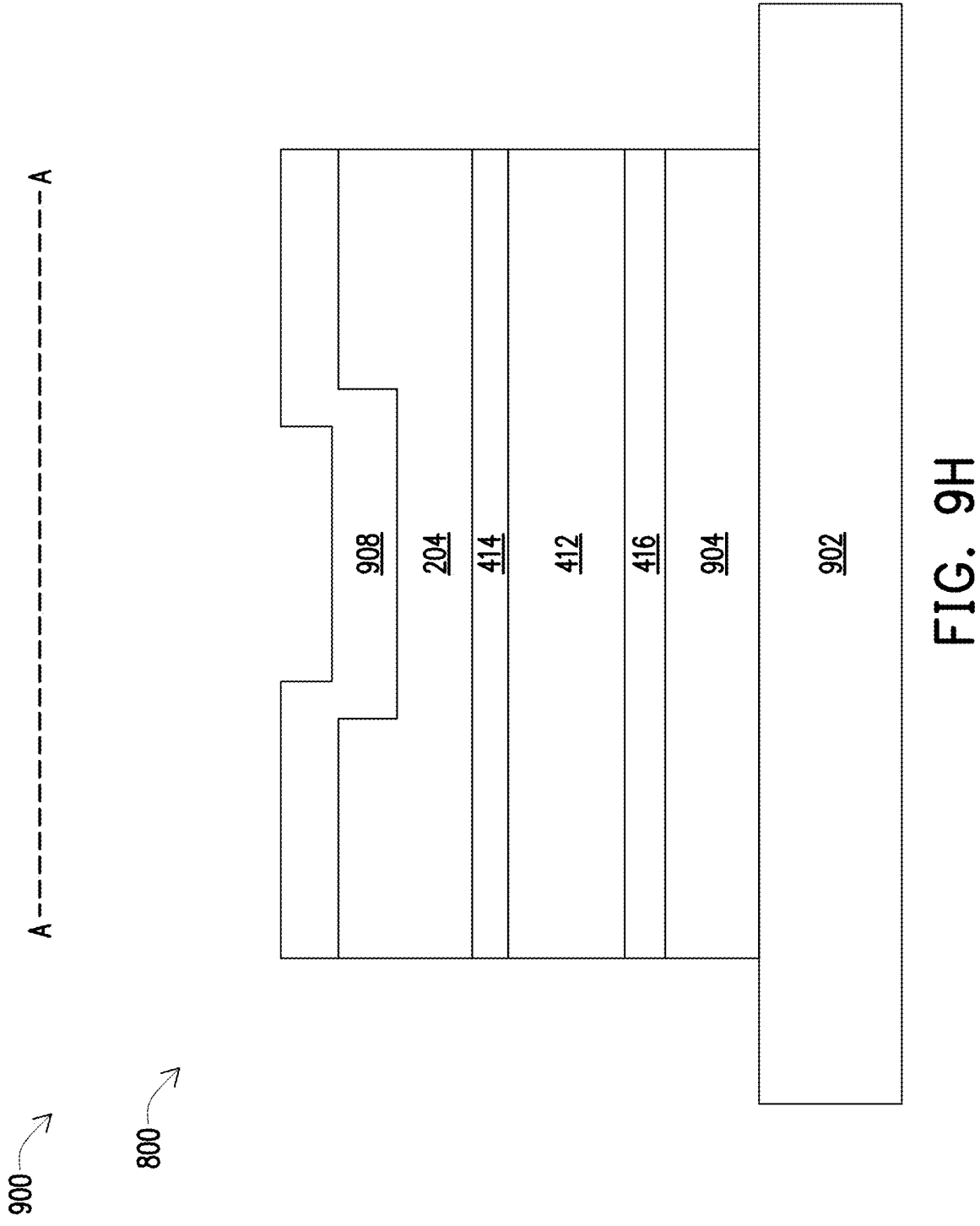

As shown in FIG. 9H, a conductive layer 908 may be formed over and/or on the oxide layer 204 and in the recess 906. The conductive layer 908 may be formed to a thickness such that the conductive layer 908 fully fills the recess 906.

The deposition tool 102 and/or the plating tool 112 may deposit the conductive layer 908 in a CVD operation, a PVD operation, an ALD operation, an electroplating operation, another deposition operation described above in connection with FIG. 1, and/or another suitable deposition operation. In some implementations, an anneal operation may be performed on the semiconductor device 800 to reflow the conductive layer 908 to remove voids and other defects in the conductive layer 908.

Figure 9I:
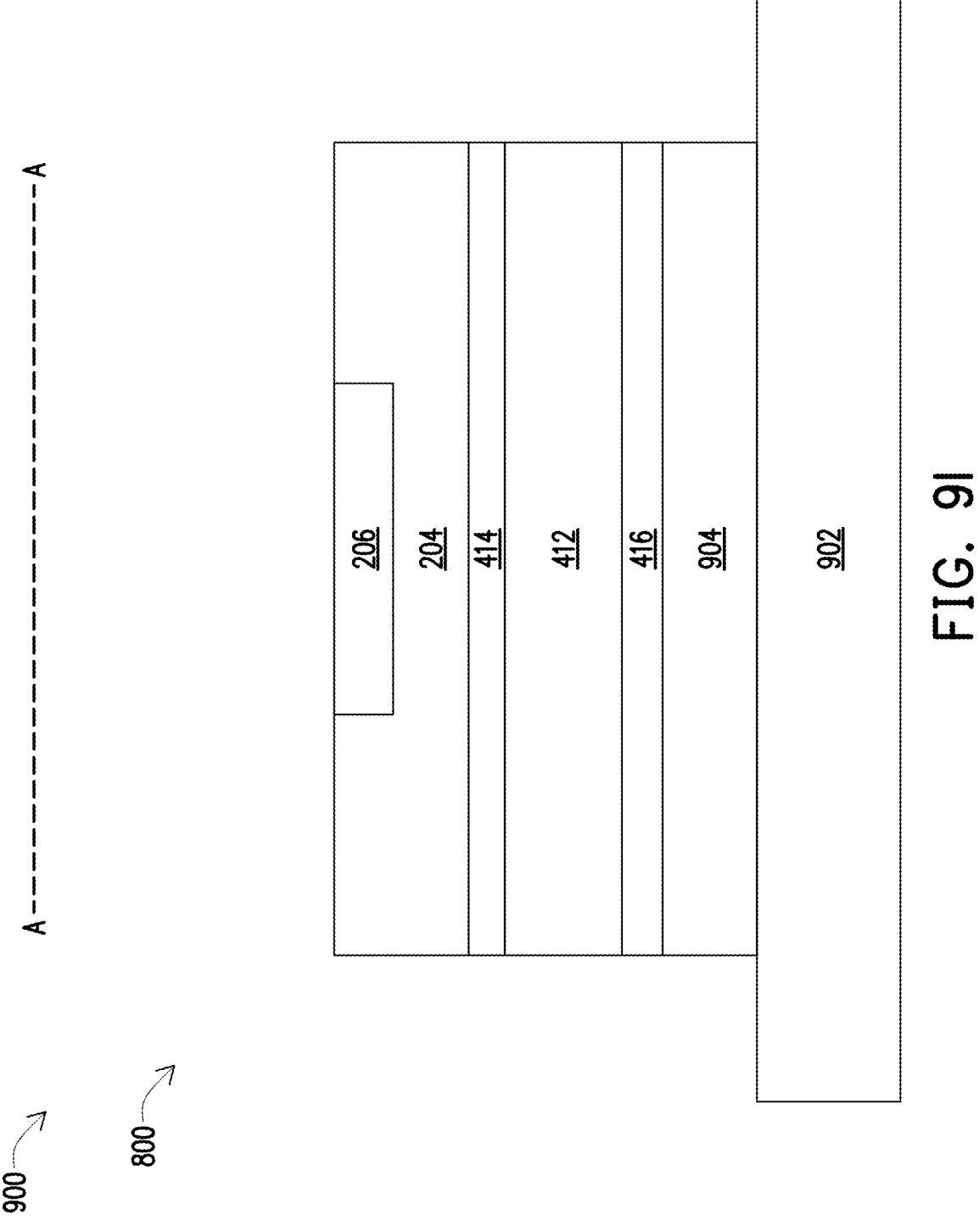

As shown in FIG. 9I, the planarization tool 110 may planarize the conductive layer 908 after the deposition tool 102 and/or the plating tool 112 deposits the conductive layer 908. The planarization tool 110 may planarize the conductive layer 908 to remove excess material of the conductive layer 908 on the oxide layer 204 surrounding the recess 906. The remaining material of the conductive layer 908 in the recess 906 corresponds to the heater 206. Thus, the heater 206 is deposited in the recess 906.

Figure 9J:
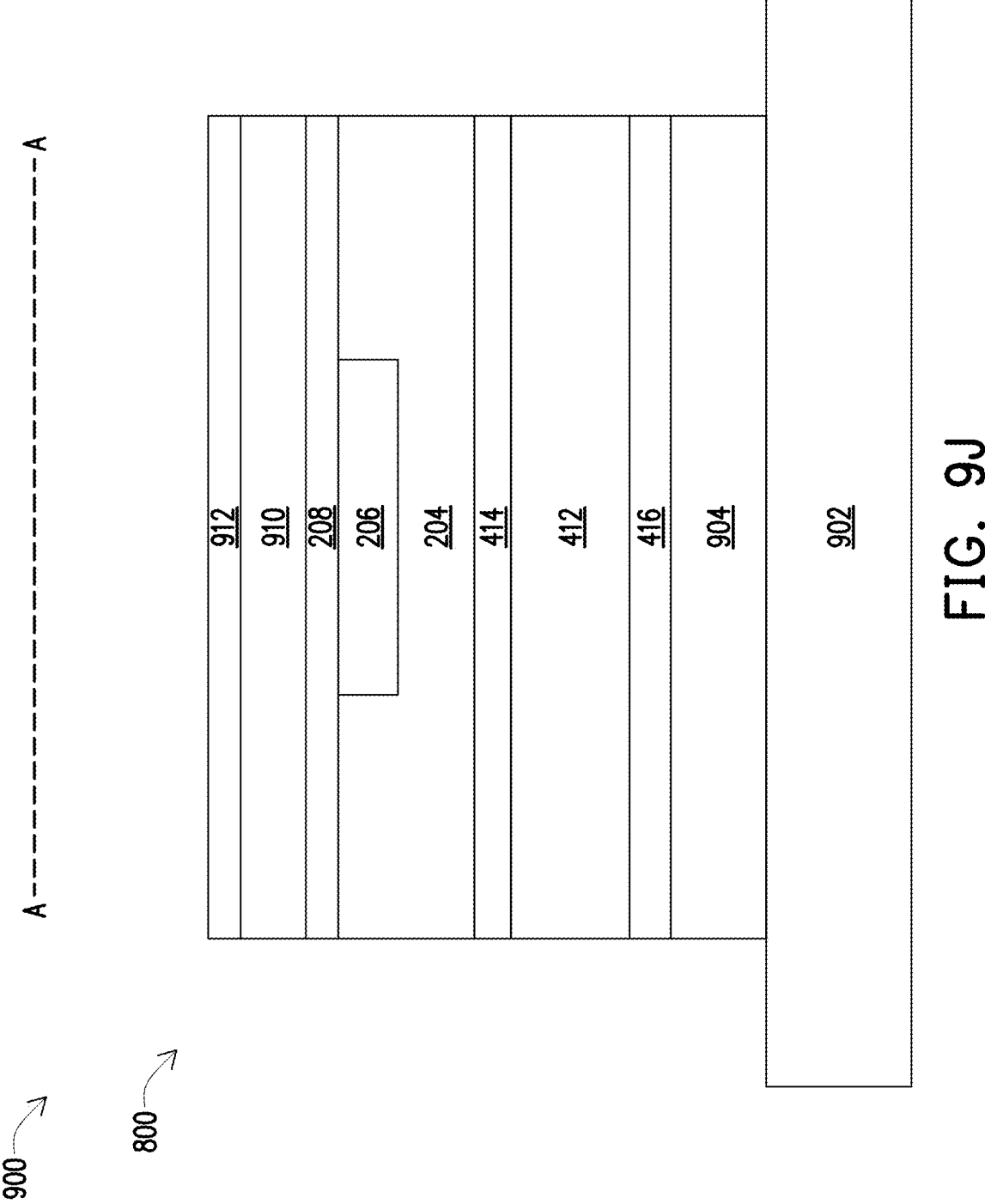

As shown in FIG. 9J, the insulator layer 208 may be formed over and/or on the oxide layer 204, and over and/or on the heater 206. The deposition tool 102 may deposit the insulator layer 208 in a PVD operation, an ALD operation, a CVD operation, another type of deposition operation described in connection with FIG. 1, and/or another suitable deposition operation. In some implementations, the planarization tool 110 planarizes the insulator layer 208 after the deposition tool 102 deposits the insulator layer 208.

As further shown in FIG. 9J, a phase change material 910 may be formed over and/or on the insulator layer 208. The deposition tool 102 may deposit the phase change material 910 in a PVD operation, an ALD operation, a CVD operation, another type of deposition operation described in connection with FIG. 1, and/or another suitable deposition operation. In some implementations, the planarization tool 110 planarizes the phase change material 910 after the deposition tool 102 deposits the phase change material 910.

As further shown in FIG. 9J, a barrier layer 912 may be formed over and/or on the phase change material 910. The deposition tool 102 may deposit the barrier layer 912 in a PVD operation, an ALD operation, a CVD operation, another type of deposition operation described in connection with FIG. 1, and/or another suitable deposition operation. In some implementations, the planarization tool 110 planarizes the barrier layer 912 after the deposition tool 102 deposits the barrier layer 912.

Figure 9K:
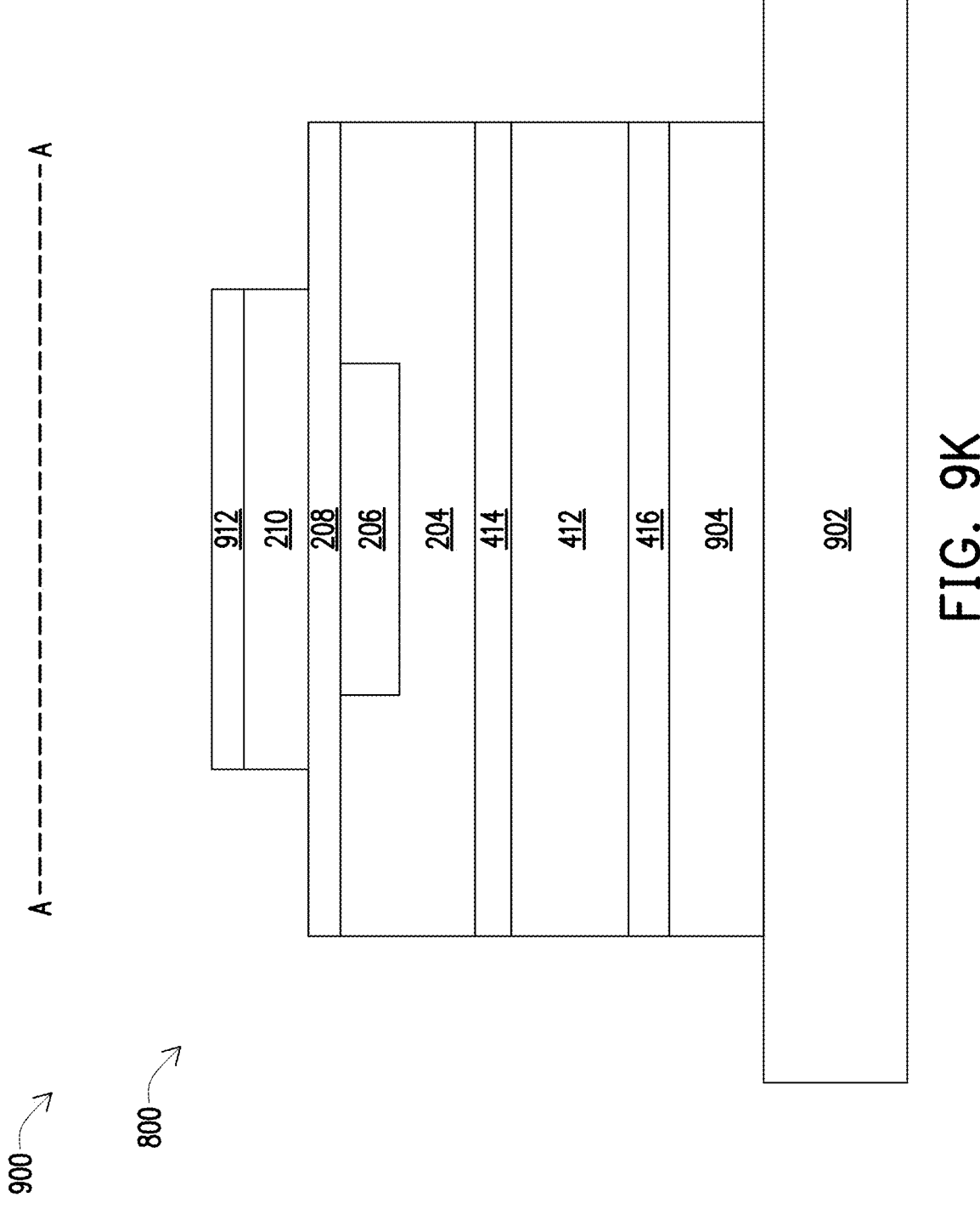

As shown in FIG. 9K, portions of the phase change material 910 and portions of the barrier layer 912 may be removed from the semiconductor device 800. The remaining portions of the phase change material 910 correspond to the PCM layer 210. Accordingly, the PCM layer 210 is formed over and/or on the insulator layer 208. In some implementations, portions of the insulator layer 208 are also such that the width of the insulator layer 208 is approximately equal to the width of the PCM layer 210.

In some implementations, a pattern in a photoresist layer is used to etch the phase change material 910 and the barrier layer 912. In these implementations, the deposition tool 102 forms the photoresist layer on the barrier layer 912. The exposure tool 104 exposes the photoresist layer to a radiation source to pattern the photoresist layer. The developer tool 106 develops and removes portions of the photoresist layer to expose the pattern. The etch tool 108 performs an etch operation to etch into the phase change material 910 and the barrier layer 912 to remove the portions of the phase change material 910 and the portions of the barrier layer 912. In some implementations, the etch operation includes the use of a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 9L:
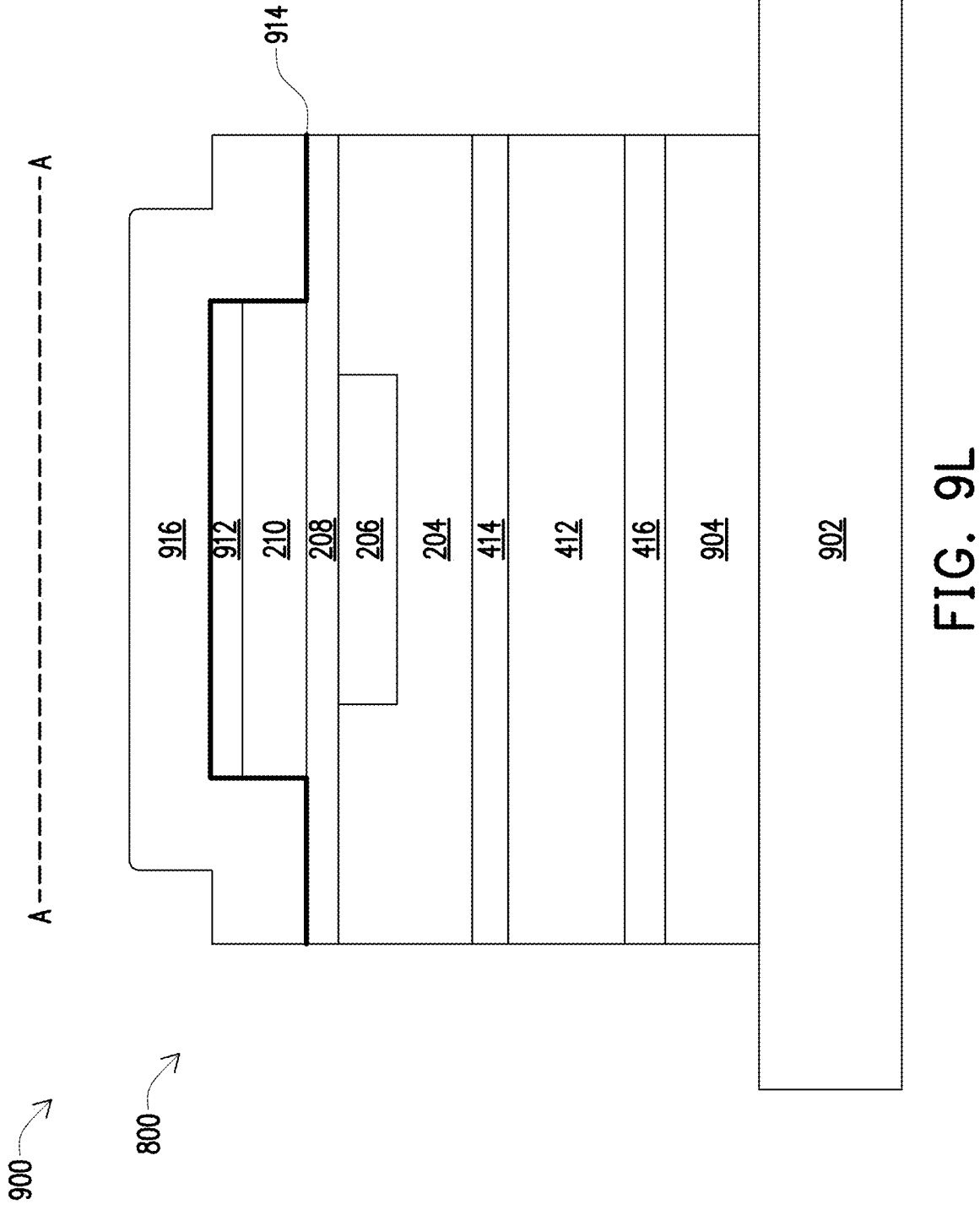

As shown in FIG. 9L, a liner 914 may be conformally formed over the PCM layer 210, over and/or on portions of the insulator layer 208, and/or over and/or on the barrier layer 912. The deposition tool 102 may deposit the liner 914 in a PVD operation, an ALD operation, a CVD operation, another type of deposition operation described in connection with FIG. 1, and/or another suitable deposition operation.

As further shown in FIG. 9L, a spacer layer 916 may be formed over and/or on the liner 914. The deposition tool 102 may deposit the spacer layer 916 in a PVD operation, an ALD operation, a CVD operation, another type of deposition operation described in connection with FIG. 1, and/or another suitable deposition operation. In some implementations, the planarization tool 110 planarizes the spacer layer 916 after the deposition tool 102 deposits the spacer layer 916. The spacer layer 916 may include a silicon nitride $(Si_xN_y)$ and/or another suitable spacer material.

Figure 9M:
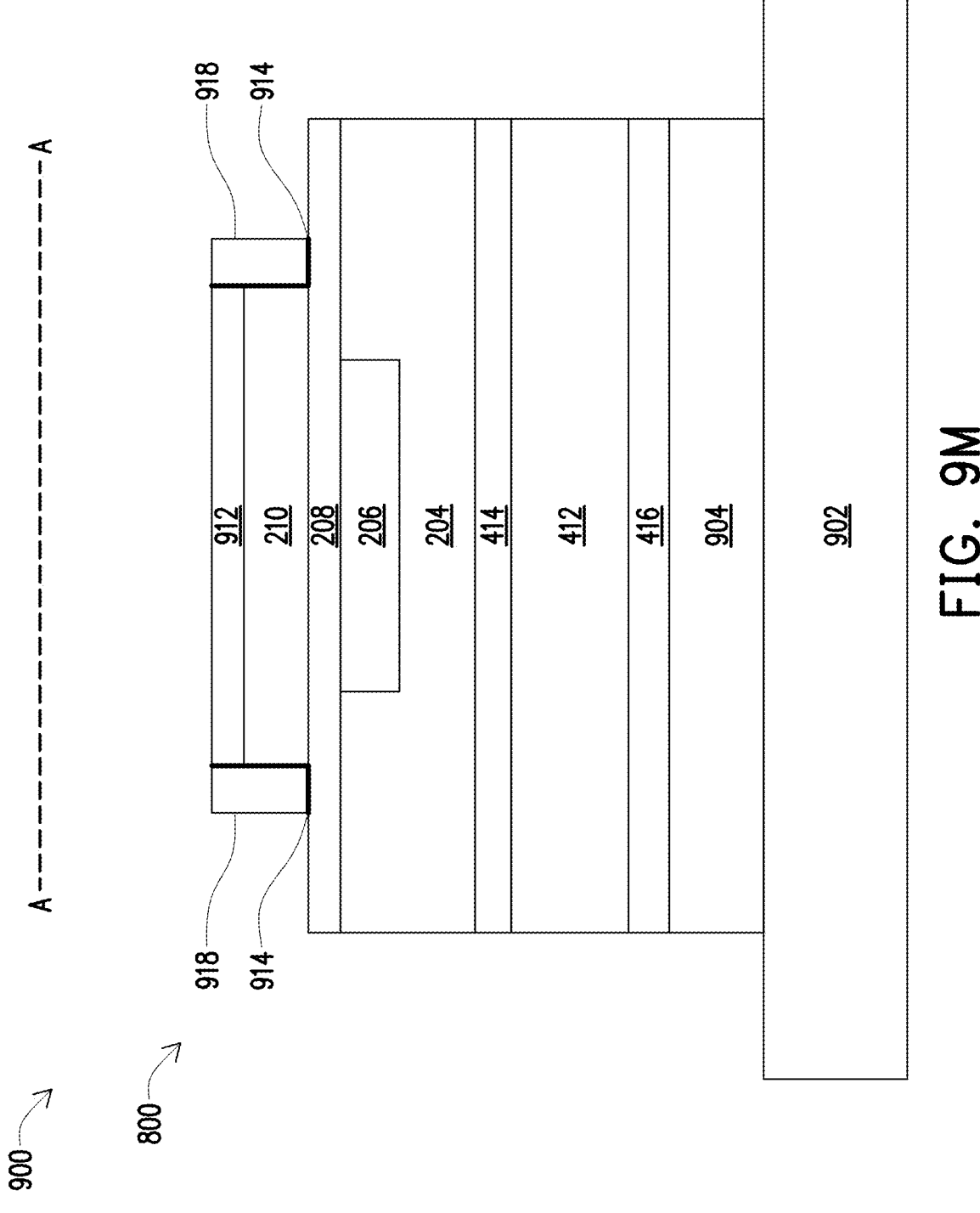

As shown in FIG. 9M, portions of the liner 914 and portions of the spacer layer 916 are removed from the semiconductor device 800 such that spacers 918 are formed on sidewalls of the PCM layer 210 and on sidewalls of the barrier layer 912. In some implementations, a pattern in a photoresist layer is used to etch the liner 914 and the spacer layer 916. In these implementations, the deposition tool 102 forms the photoresist layer on the spacer layer 916. The exposure tool 104 exposes the photoresist layer to a radiation source to pattern the photoresist layer. The developer tool 106 develops and removes portions of the photoresist layer to expose the pattern. The etch tool 108 performs an etch operation to etch into the liner 914 and the spacer layer 916 to remove the portions of the liner 914 and the portions of the spacer layer 916 to form the spacers 918. In some implementations, the etch operation includes the use of a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 9N:
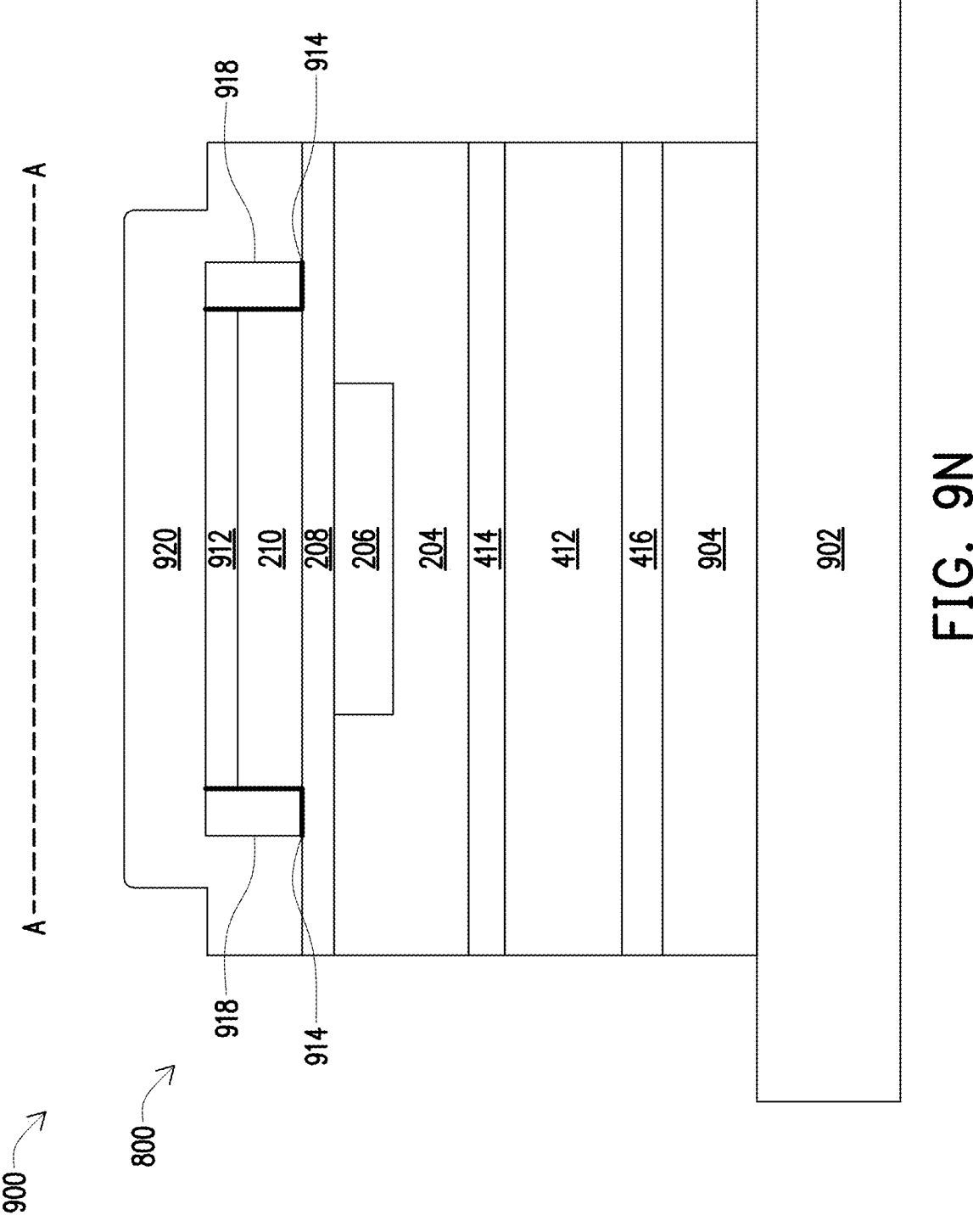

As shown in FIG. 9N, a conductive layer 920 may be formed over and/or on portions of the insulator layer 208, over the PCM layer 210, over and/or on the barrier layer 912, and/or over and/or on the spacers 918. The deposition tool 102 and/or the plating tool 112 may deposit the conductive layer 920 in a CVD operation, a PVD operation, an ALD operation, an electroplating operation, another deposition operation described above in connection with FIG. 1, and/or another suitable deposition operation. In some implementations, an anneal operation may be performed on the semiconductor device 800 to reflow the conductive layer 920 to remove voids and other defects in the conductive layer 920.

As shown in FIG. 9O, portions of the conductive layer 920 may be removed to form the RF in electrode 212 and the RF out electrode 214. Moreover, portions of the barrier layer 912 may be removed from above the PCM layer 210 between the RF in electrode 212 and the RF out electrode 214. Remaining portions of the barrier layer 912 are located between the PCM layer 210 and the RF in electrode 212, and between the PCM layer 210 and the RF out electrode 214.

In some implementations, a pattern in a photoresist layer is used to etch the conductive layer 920 and the barrier layer 912. In these implementations, the deposition tool 102 forms the photoresist layer on the conductive layer 920. The exposure tool 104 exposes the photoresist layer to a radiation source to pattern the photoresist layer. The developer tool 106 develops and removes portions of the photoresist layer to expose the pattern. The etch tool 108 performs an etch operation to etch into the conductive layer 920 and into the barrier layer 912 to remove the portions of the conductive layer 920 to form the RF in electrode 214 and the RF out electrode 214, and to remove the portions of the barrier layer 912. In some implementations, the etch operation includes the use of a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

As further shown in FIG. 9O, a liner 922 is conformally formed over and/or on the RF in electrode 212, over and/or on the RF out electrode 214, and/or over and/or on portions of the PCM layer 210 between the RF in electrode 212 and the RF out electrode 214. The deposition tool 102 may deposit the liner 922 in a PVD operation, an ALD operation, a CVD operation, another type of deposition operation described in connection with FIG. 1, and/or another suitable deposition operation. The liner 922 may be formed to protect the RF in electrode 212, the RF out electrode 214, and the PCM layer 210 from oxidation and other types of contamination.

As indicated above, FIGS. 9A-9O are provided as examples. Other examples may differ from what is described with regard to FIGS. 9A-9O.

Figure 10A:
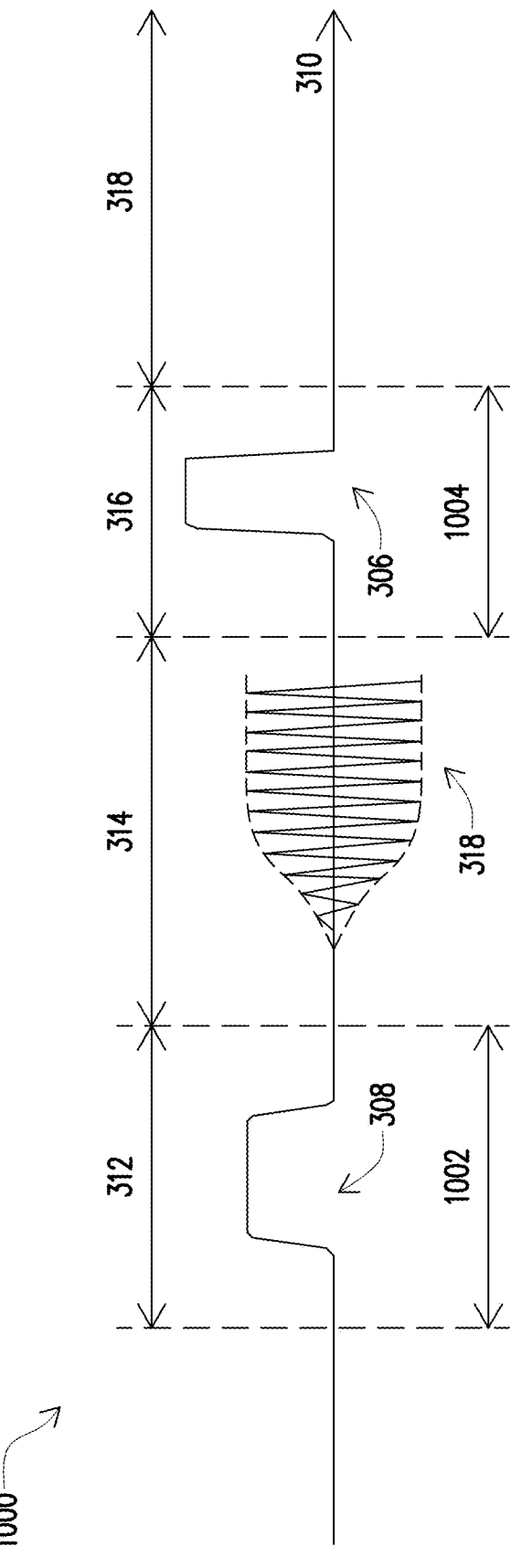
FIGS. 10A-10C are diagrams of example implementations of the operation of a semiconductor device described herein.
Figure 10B:
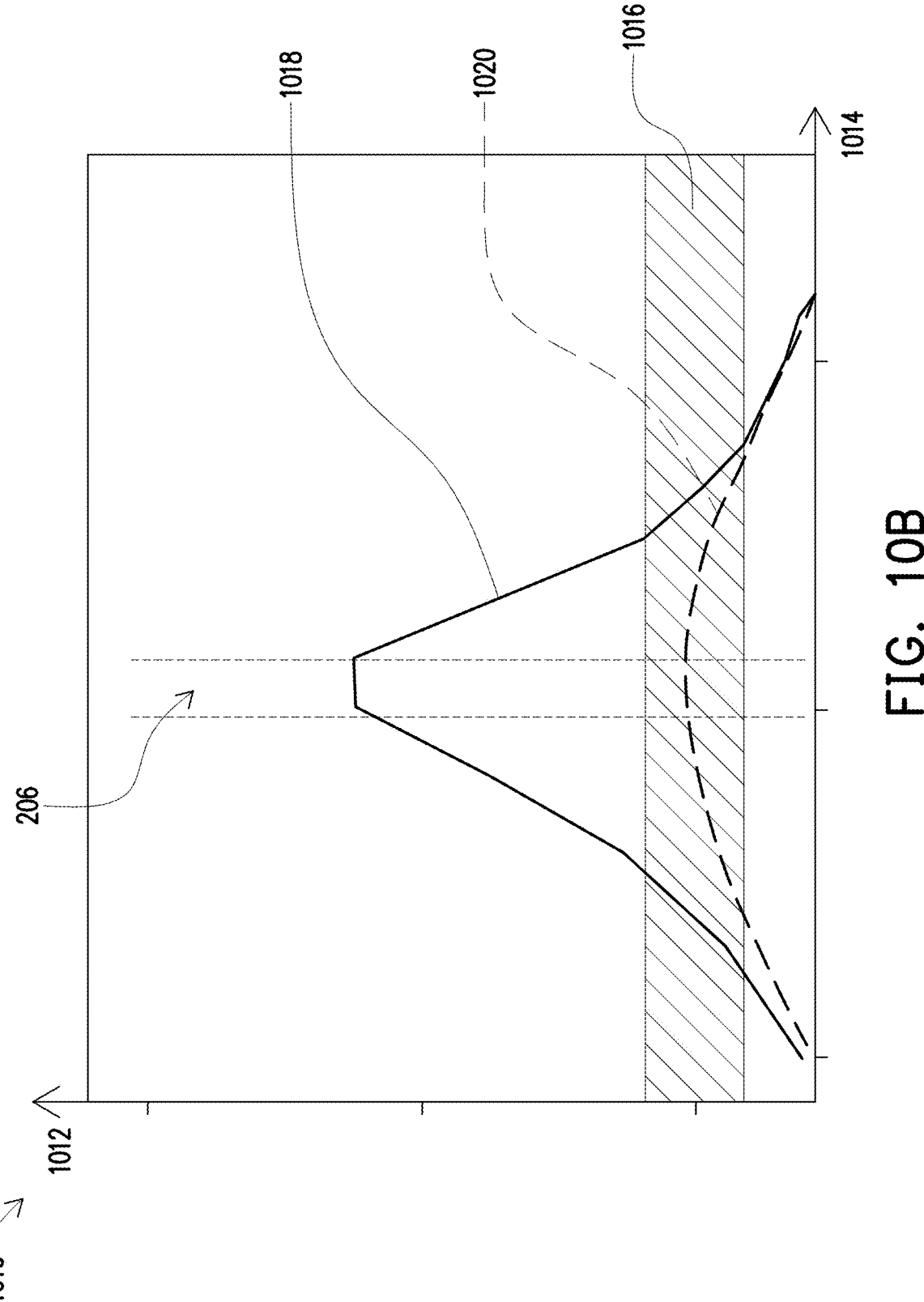
Figure 10C:
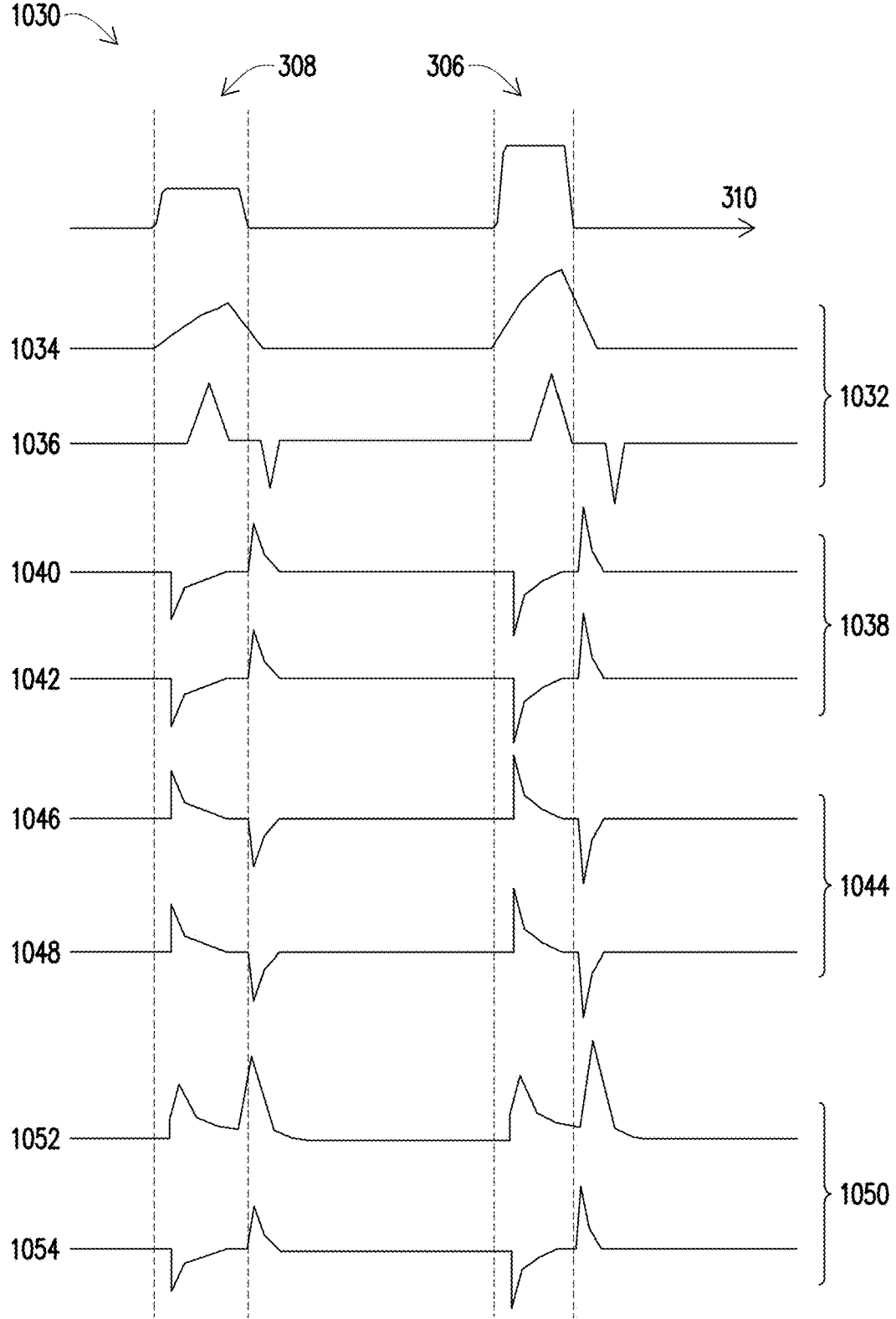

FIGS. 10A-10C are diagrams of example implementations of the operation of the semiconductor device 800 described herein. FIG. 10A illustrates an example implementation 1000. As shown in FIG. 10A, the pyroelectric device 402 of the semiconductor device 800 may be configured to generate an electrical current during one or more operation durations of the PCM RF switch 200 of the semiconductor device 800. For example, the pyroelectric device 402 generate an electrical current for a generation period 1002, which may occur during a set operation 308 of the PCM RF switch 200 in which the PCM RF switch 200 transitions from an off state to an on state. In particular, the pyroelectric device 402 generate an electrical current as the temperature of the PCM layer 210 of the PCM RF switch 200 increases in the set operation 308, and as the temperature of the PCM layer 210 of the PCM RF switch 200 decreases in the set operation 308.

As another example, the pyroelectric device 402 generates an electrical current for a generation period 1004, which may occur during a reset operation 306 of the PCM RF switch 200 in which the PCM RF switch 200 transitions from an on state to an off state. In particular, the pyroelectric device 402 generate an electrical current as the temperature of the PCM layer 210 of the PCM RF switch 200 increases in the reset operation 306, and as the temperature of the PCM layer 210 of the PCM RF switch 200 decreases in the reset operation 306.

FIG. 10B illustrates an example implementation 1010 of temperature 1012 in the semiconductor device 800 as a function of depth 1014 in the semiconductor device 800. The location of the heater 206 is illustrated along the depth 1014 in the semiconductor device 800. The operating temperature range 1016 of the pyroelectric device 402 is also illustrated in FIG. 10B. As shown in FIG. 10B, a temperature curve 1018 is illustrated as a function of the depth 1014 in the semiconductor device 800. The temperature curve 1018 corresponds to the temperature a high temperature of the PCM layer 210, such as the reset temperature 328 or the set temperature 336. The temperature along the temperature curve 1018 is highest at or near the depth of the heater 206, and decreases along temperature curve 1018 above and below the heater 206. As further shown in FIG. 10B, a temperature curve 1020 is illustrated as a function of the depth 1014 in the semiconductor device 800. The temperature curve 1020 corresponds to the temperature a low temperature of the PCM layer 210, such as the baseline temperature 326. Similar to the temperature curve 1018, the temperature along the temperature curve 1020 is highest at or near the depth of the heater 206, and decreases along temperature curve 1020 above and below the heater 206.

The depth of the placement of the pyroelectric device 402 in the semiconductor device 800 may be based on the temperature curve 1018 and the temperature curve 1020. If the pyroelectric device 402 is placed too close to the heater 206 (and thus, too shallow in the semiconductor device 800), the temperature curve 1020 may be too high within the operating temperature range 1016 of the pyroelectric device 402, which provides a small portion of the operating temperature range 1016 (the upper portion of the operating temperature range 1016) within which that pyroelectric device 402 device can generate an electrical current. If the pyroelectric device 402 is placed too far away from the heater 206 (and thus, too deep in the semiconductor device 800), the temperature differential between the temperature curve 1018 and the temperature curve 1020 may be too small, which may result in little to no change in temperature in the pyroelectric device 402 as the PCM RF switch 200 operates. In some implementations, the pyroelectric device 402 may be placed at a depth in the semiconductor device 800 to maximize or optimize the amount of the temperature curve 1018 and the temperature curve 1020 that are located within the operating temperature range 1016 of the pyroelectric device 402 at the position of the pyroelectric device 402. In other words, the pyroelectric device 402 may be placed at a depth in the semiconductor device 800 such that the temperature curve 1020 is close to the bottom of the operating temperature range 1016 at the location of the pyroelectric device 402, and such that the temperature curve 1018 is close to the top of the operating temperature range 1016 at the location of the pyroelectric device 402.

FIG. 10C illustrates an example implementation 1030 of operating temperatures, temperature differences, voltages, and currents associated with the pyroelectric device 402 during the set operation 308 and during the reset operation 306 of the PCM RF switch 200.

As shown in FIG. 10C, the cyclic temperature change 1032 of the pyroelectric device 402 may include the temperature 1034 and the change in temperature as a function of change in time 1036. Forward connection parameters 1038 may include a voltage output 1040 of the pyroelectric device 402 and a current output 1042 of the pyroelectric device 402. Reverse connection parameters 1044 may include a voltage output 1046 of the pyroelectric device 402 and a current output 1048 of the pyroelectric device 402. Rectification parameters 1050 include a voltage output 1052 after rectification by the rectifier circuit 404 and a current output 1054 after rectification by the rectifier circuit 404.

As indicated above, FIGS. 10A-10C are provided as examples. Other examples may differ from what is described with regard to FIGS. 10A-10C.

Figure 11:
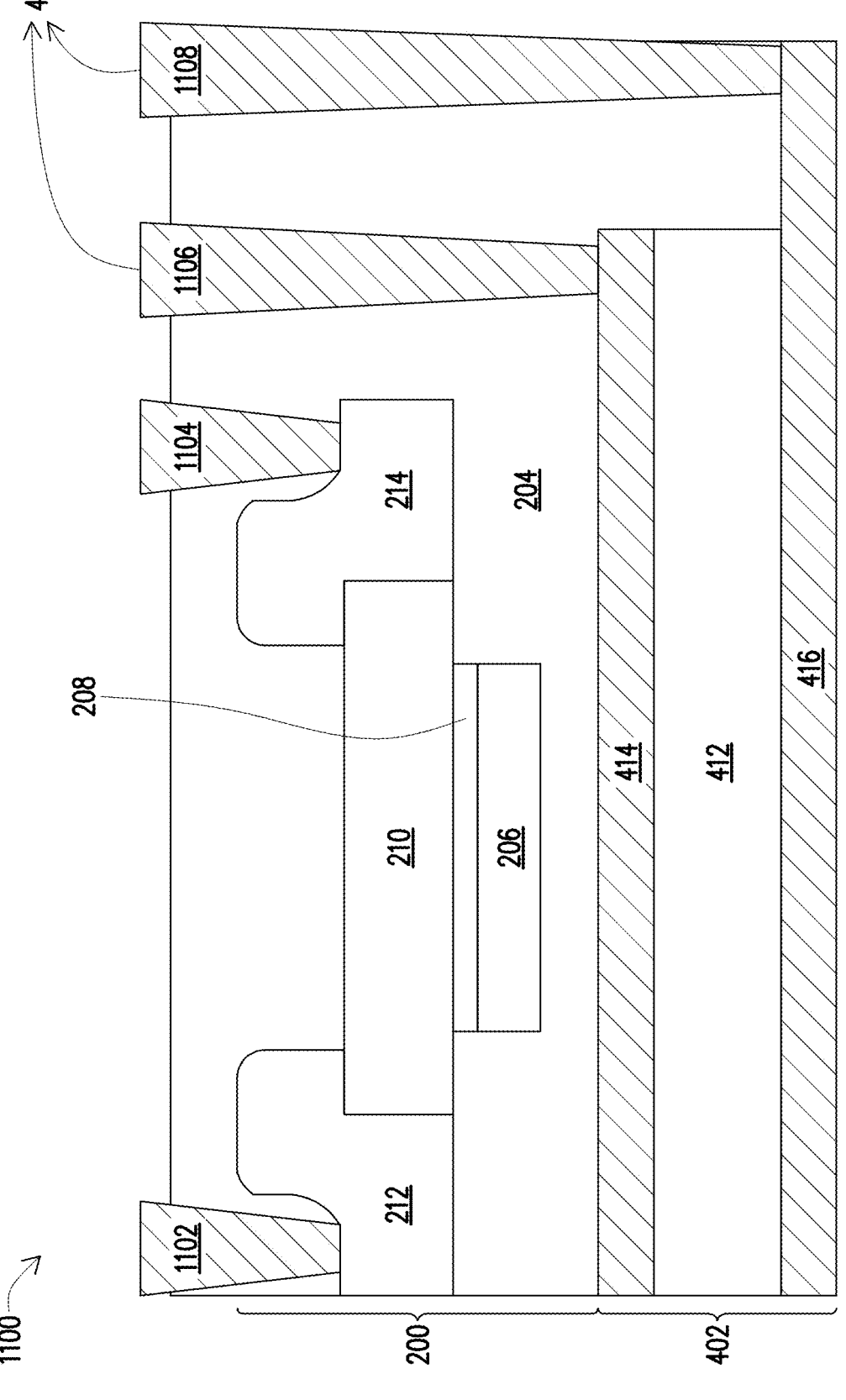
FIGS. 11-16 are diagrams of example semiconductor devices described herein.

FIG. 11 is a diagram of an example semiconductor device 1100 described herein. As shown in FIG. 11, the semiconductor device 1100 may include a similar configuration as the semiconductor device 800. For example, the semiconductor device 1100 includes the PCM RF switch 200 and the pyroelectric device 402 below the PCM RF switch 200. The semiconductor device 1100 includes a plurality of conductive structures to electrically connect various structures and/or layers of the pyroelectric device 402 and/or the PCM RF switch 200 to other structures and/or layers in the semiconductor device 1100. The conductive structures may include one or more conductive materials, such as copper (Cu), tungsten (W), titanium (Ti), cobalt (Co), ruthenium (Ru), and/or another conductive material.

As shown in FIG. 11, a conductive structure includes a via 1102 (or an interconnect) that is electrically connected with the RF in electrode 212. Another conductive structure includes a via 1104 (or an interconnect) that is electrically connected with the RF out electrode 214. Another conductive structure includes a via 1106 (or an interconnect) that is electrically connected with the top electrode 414. Another conductive structure includes a via 1108 (or an interconnect) that is electrically connected with the bottom electrode 416.

The via 1106 electrically connects the top electrode 414 of the pyroelectric device 402 with the rectifier circuit 404. The via 1108 electrically connects the bottom electrode 416 of the pyroelectric device 402 with the rectifier circuit 404. The vias 1106 and 1108 enable the pyroelectric device 402 to be electrically connected with the rectifier circuit 404 and the electrical storage device 406, which may be included on another chip that may be bonded to the semiconductor device 1100 with wafer-on-wafer (WoW) technology.

The via 1106 and the via 1108 may extend approximately vertical in the semiconductor device 1100 and may extend above the PCM RF switch 200. The via 1106 and the via 1108 may extend in an approximately parallel direction and/or may be adjacent. The bottom electrode 416 may extend laterally outward from the pyroelectric material layer 412 and laterally outward from the top electrode 414 to enable the via 1106 and the via 1108 to extend approximately parallel and adjacent.

As indicated above, FIG. 11 is provided as an example. Other examples may differ from what is described with regard to FIG. 11.

Figure 12:
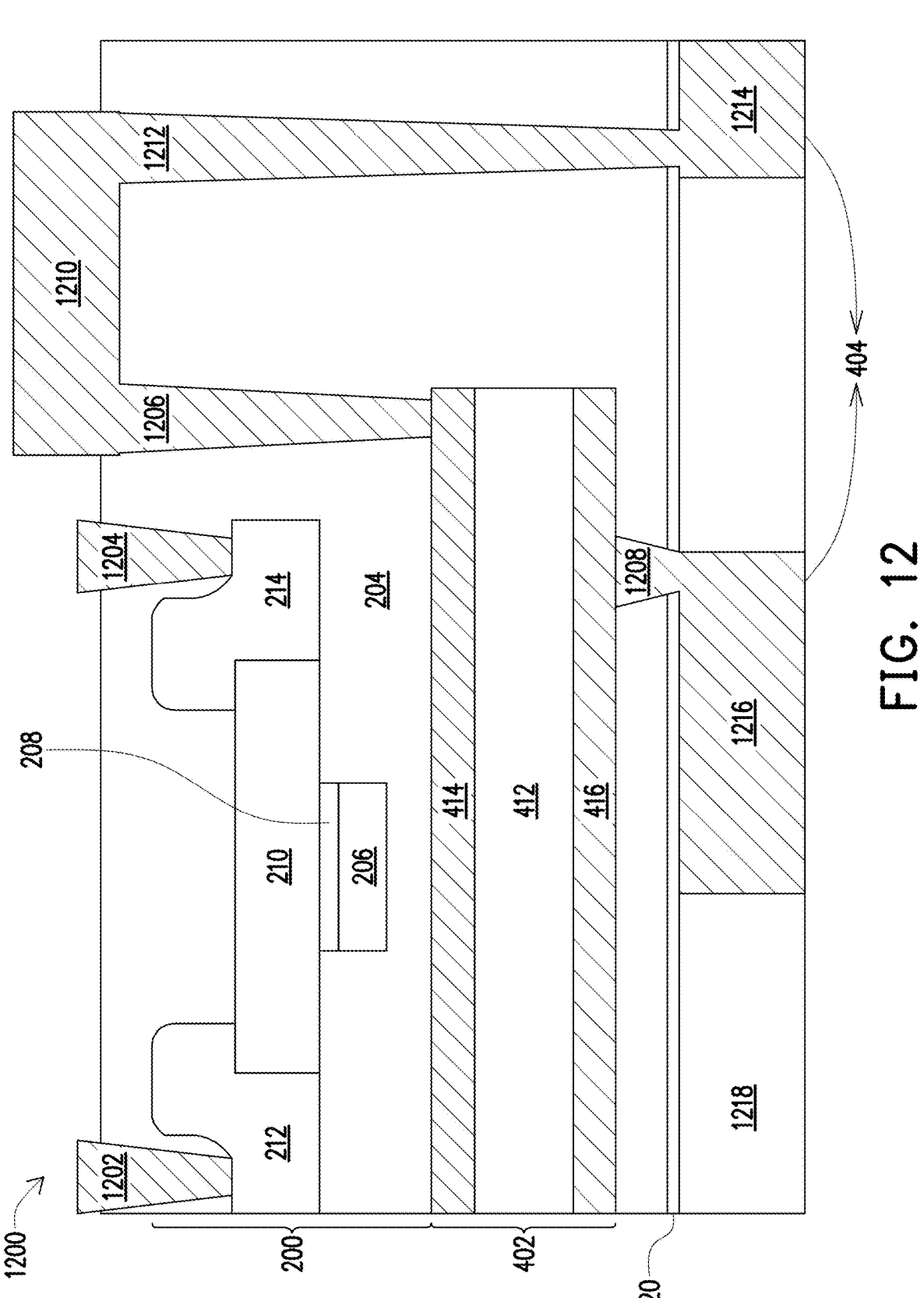

FIG. 12 is a diagram of an example semiconductor device 1200 described herein. As shown in FIG. 12, the semiconductor device 1200 may include a similar configuration as the semiconductor device 800. For example, the semiconductor device 1200 includes the PCM RF switch 200 and the pyroelectric device 402 below the PCM RF switch 200. The semiconductor device 1200 includes a plurality of conductive structures to electrically connect various structures and/or layers of the pyroelectric device 402 and/or the PCM RF switch 200 to other structures and/or layers in the semiconductor device 1200. The conductive structures may include one or more conductive materials, such as copper (Cu), tungsten (W), titanium (Ti), cobalt (Co), ruthenium (Ru), and/or another conductive material.

As shown in FIG. 12, a conductive structure includes a via 1202 (or an interconnect) that is electrically connected with the RF in electrode 212. Another conductive structure includes a via 1204 (or an interconnect) that is electrically connected with the RF out electrode 214. Another conductive structure includes a via 1206 (or an interconnect) that is electrically connected with and extends above the top electrode 414 in the semiconductor device 1200. Another conductive structure includes a via 1208 (or an interconnect) that is electrically connected with and extends below the bottom electrode 416 in the semiconductor device 1200. The via 1206 and the via 1208 may extend in an approximately parallel direction in the semiconductor device 1200 on opposing sides of the pyroelectric device 402.

The via 1206 electrically connects the top electrode 414 of the pyroelectric device 402 with conductive structure including a metallization layer 1210, which may be located in the semiconductor device 1200 at a position that is higher relative to the PCM RF switch 200. The metallization layer 1210 electrically connects the via 1206 with a via 1212 that extends below the metallization layer 1210 and approximately parallel with and adjacent to the via 1206. The via 1212 electrically connects the metallization layer 1210 with a metallization layer 1214 below the pyroelectric device 402. The metallization layer 1214 is electrically connected with the rectifier circuit 404. Accordingly, the top electrode 414 is electrically connected with the rectifier circuit 404 by the via 1206, the metallization layer 1210, the via 1212, and the metallization layer 1214.

The via 1208 electrically connects the bottom electrode 416 of the pyroelectric device 402 with a metallization layer 1216 below the via 1208 and below the pyroelectric device 402. The via 1208 and the metallization layer 1216 may electrically connect the bottom electrode 416 with the rectifier circuit 404.

The metallization layer 1214 and the metallization layer 1216 may be included in an oxide layer 1218 that is below and/or under the oxide layer 204. An etch stop layer (ESL) 1220 may be included between the oxide layer 204 and the oxide layer 1218. The etch stop layer 1220 may include a silicon nitride ($Si_xN_y$) and/or another material that provides etch selectivity between the etch stop layer 1220 and the oxide layers 204 and 1218. The via 1212 and the via 1208 may extend through the etch stop layer 1220 and into the oxide layer 1218. In some implementations, the metallization layer 1214 and the metallization layer 1216 may be electrically connected with the rectifier circuit 404, the electrical storage device 406, the load 408, and the switch 410, which may be included in the semiconductor device 1200.

As indicated above, FIG. 12 is provided as an example. Other examples may differ from what is described with regard to FIG. 12.

Figure 13:
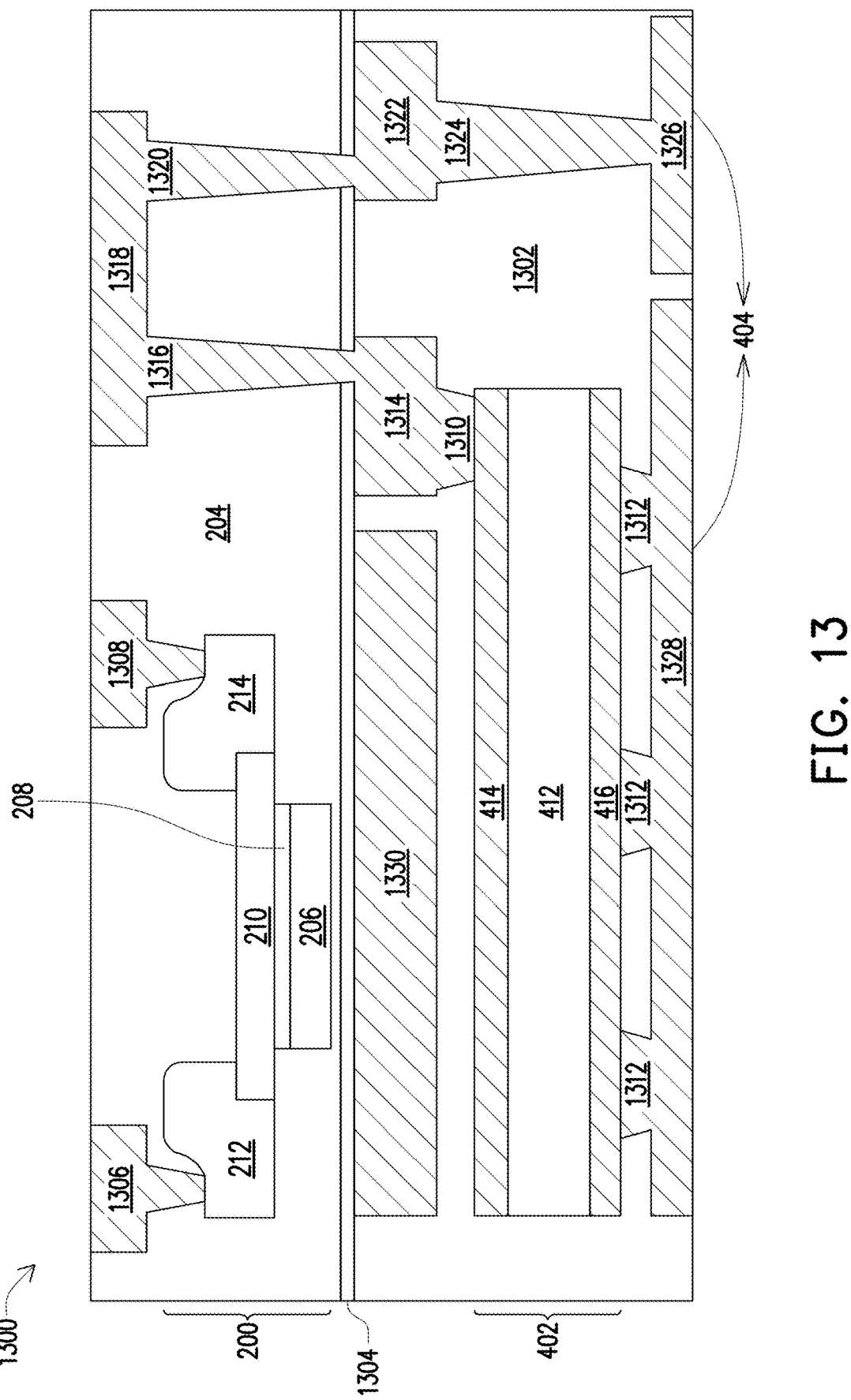

FIG. 13 is a diagram of an example semiconductor device 1300 described herein. As shown in FIG. 13, the semiconductor device 1300 may include a similar configuration as the semiconductor device 800. For example, the semiconductor device 1300 includes the PCM RF switch 200 and the pyroelectric device 402 below the PCM RF switch 200. The semiconductor device 1300 includes a plurality of conductive structures to electrically connect various structures and/or layers of the pyroelectric device 402 and/or the PCM RF switch 200 to other structures and/or layers in the semiconductor device 1300. The conductive structures may include one or more conductive materials, such as copper (Cu), tungsten (W), titanium (Ti), cobalt (Co), ruthenium (Ru), and/or another conductive material.

As shown in FIG. 13, the PCM RF switch 200 and the pyroelectric device 402 are included in different oxide layers of the semiconductor device 1300. The semiconductor device 1300 may include the oxide layer 204 over an oxide layer 1302. An etch stop layer 1304 may be included between the oxide layer 204 and the oxide layer 1302. The PCM RF switch 200 and the pyroelectric device 402 may be included in different oxide layers of the semiconductor device 1300 in implementations where the thickness of the oxide layer 204 is not sufficiently thick to accommodate the PCM RF switch 200 and the pyroelectric device 402 to be vertically arranged in a single oxide layer. This may occur, for example, where logic circuit requirements in the semiconductor device 1300 require thinner interlayer dielectrics and/or thinner intermetal dielectrics.

As shown in FIG. 13, a conductive structure includes a via 1306 (or an interconnect) that is electrically connected with the RF in electrode 212. Another conductive structure includes a via 1308 (or an interconnect) that is electrically connected with the RF out electrode 214. Another conductive structure includes a via 1310 (or an interconnect) that is electrically connected with and extends above the top electrode 414 in the semiconductor device 1300. A plurality of conductive structures includes a plurality of vias 1312 (or interconnects) that are electrically connected with and that extend below the bottom electrode 416 in the semiconductor device 1300. The via 1310 and the vias 1312 may extend in an approximately parallel direction in the semiconductor device 1300 on opposing sides of the pyroelectric device 402. The via 1310 and the vias 1312 are included in the oxide layer 1302.

The via 1310 electrically connects the top electrode 414 of the pyroelectric device 402 with conductive structure including a metallization layer 1314, which may be located in the semiconductor device 1300 at a position that is at a height between the PCM RF switch 200 and the pyroelectric device 402. The metallization layer 1314 is included in the oxide layer 1302. The metallization layer 1314 electrically connects the via 1310 with a via 1316 that extends above the metallization layer 1314 and between the oxide layer 1302 and the oxide layer 204 through the etch stop layer 1304. The via 1316 electrically connects the metallization layer 1314 with a conductive structure that includes a metallization layer 1318. The metallization layer 1318 may be located at a height in the semiconductor device 1300 that is above the PCM RF switch 200. The metallization layer 1318 may be electrically with a conductive structure that includes a via 1320. The via 1320 extends below the metallization layer 1318 and between the oxide layer 1302 and the oxide layer 204 through the etch stop layer 1304. The via 1320 may extend in a direction that is approximately parallel with the via 1316. The via 1320 electrically connects the metallization layer 1318 with a conductive structure that includes a metallization layer 1322 that is below the PCM RF switch 200 and is included in the oxide layer 1302. The metallization layer 1322 electrically connects the via 1320 with a conductive structure that includes a via 1324 that is included in the oxide layer 1302. The via 1324 extends below the metallization layer 1322. The via 1324 electrically connects the metallization layer 1322 with a conductive structure that includes a metallization layer 1326 that is included in the oxide layer 1302 below the via 1324. The metallization layer 1326 is electrically connected with the rectifier circuit 404. Accordingly, the top electrode 414 is electrically connected with the rectifier circuit 404 by the via 1310, the metallization layer 1314, the via 1316, the metallization layer 1318, the via 1320, the metallization layer 1322, the via 1324, and the metallization layer 1326.

The vias 1312 electrically connects the bottom electrode 416 of the pyroelectric device 402 with a metallization layer 1328 below the vias 1312 and below the pyroelectric device 402. The vias 1312 and the metallization layer 1328 may electrically connect the bottom electrode 416 with the rectifier circuit 404. Another metallization layer 1330 may be included in the oxide layer 1302 and may be included between the PCM RF switch 200 and the pyroelectric device 402.

As indicated above, FIG. 13 is provided as an example. Other examples may differ from what is described with regard to FIG. 13.

Figure 14:
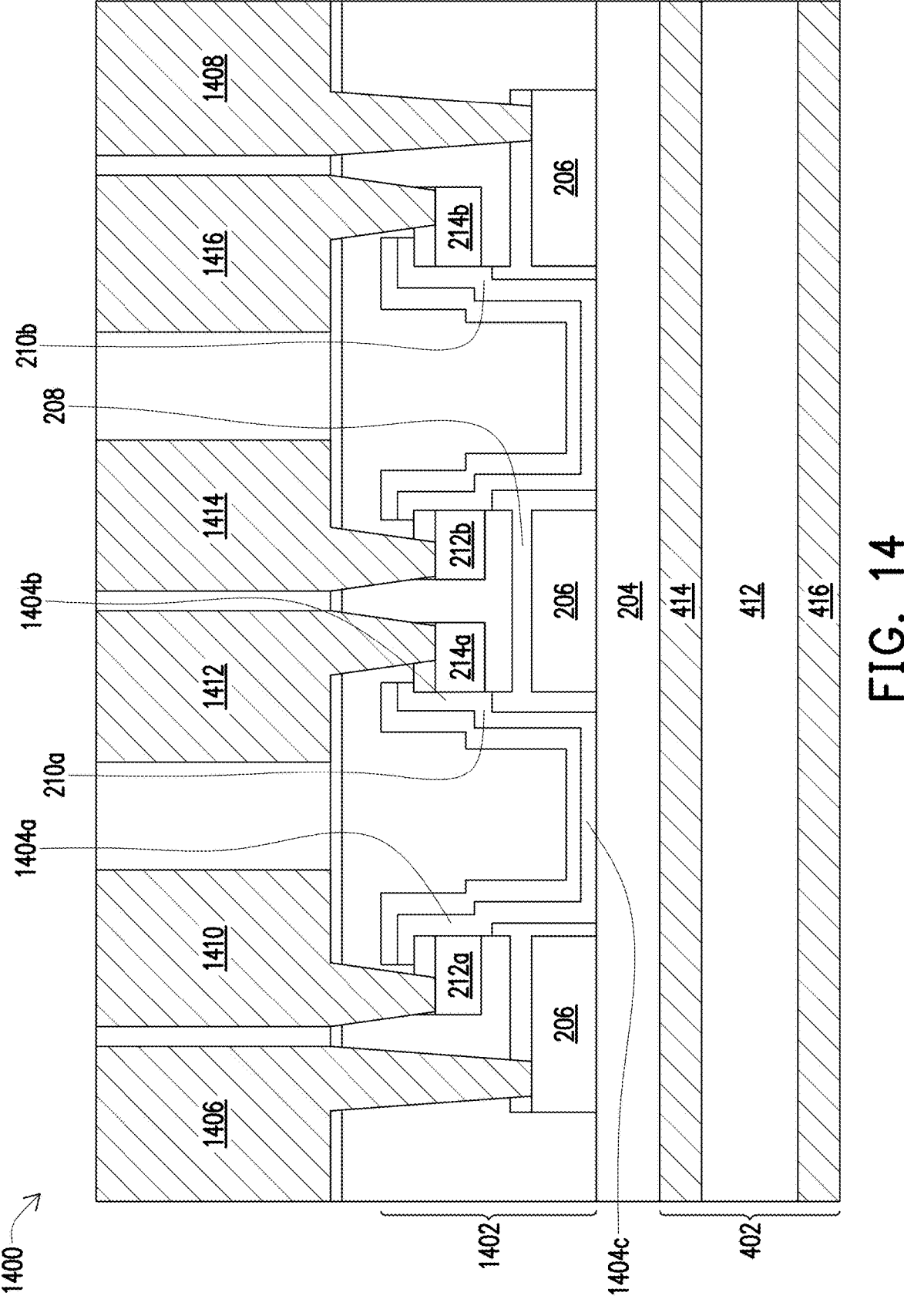

FIG. 14 is a diagram of an example semiconductor device 1400 described herein. As shown in FIG. 14, the semiconductor device 1400 may include a similar configuration as the semiconductor device 800. For example, the semiconductor device 1400 includes the PCM RF switch 200 and the pyroelectric device 402 below the PCM RF switch 200. However, the semiconductor device 1400 includes an array 1402 of a plurality of PCM RF switches 200. The pyroelectric device 402 is configured to scavenge heat from the plurality of PCM RF switches 200 in the array 1402, and is configured to convert the scavenged heat to an electrical current.

As shown in FIG. 14, the array 1402 includes a plurality of heaters 206 for the plurality of PCM RF switches 200. Each PCM RF switch 200 includes an RF in electrode 212 and an RF out electrode 214. For example, a PCM RF switch 200 may include an RF in electrode 212a and an RF out electrode 214a, another PCM RF switch 200 may include an RF in electrode 212b and an RF out electrode 214b, and so on. Moreover, each PCM RF switch 200 includes a PCM layer 210. For example, a PCM RF switch 200 may include a PCM layer 210a, another PCM RF switch 200 may include another PCM layer 210b, and so on.

The PCM RF switches 200 in the array 1402 may be vertically arranged PCM RF switches. The PCM RF switches 200 may be vertically arranged in that the PCM layers 210a, 210b, and so on may each extend in a vertical direction in the semiconductor device 1400 for at least a portion of the PCM layers, and the heaters 206 and electrodes 212, 214 may be vertically arranged. The vertically arranged PCM RF switches 200 may provide increased operational efficiency in that the PCM layers 210 are thinner (and therefore, more easily heated to transition be between phases) than PCM layers 210 in other types of PCM RF switches.

As shown in FIG. 14, the PCM layers 210a, 210b, may be approximately U-shaped. For example, the PCM layer 210a may include a first approximately vertical segment 1404a adjacent to the RF in electrode 212a, may include a second approximately vertical segment 1404b adjacent to the RF out electrode 214a, and may include an approximately horizontal segment 1404c connected with the first approximately vertical segment 1404a and the second approximately vertical segment 1404b.

As further shown in FIG. 14, the semiconductor device 1400 may include a plurality of conductive structures. A conductive structure includes a via 1406 (or an interconnect) that is electrically connected with a heater 206. Another conductive structure includes a via 1408 (or an interconnect) that is electrically connected with another heater 206. Another conductive structure includes a via 1410 (or an interconnect) that is electrically connected with the RF in electrode 212a. Another conductive structure includes a via 1412 (or an interconnect) that is electrically connected with the RF out electrode 214a. Another conductive structure includes a via 1414 (or an interconnect) that is electrically connected with the RF in electrode 212b. Another conductive structure includes a via 1416 (or an interconnect) that is electrically connected with the RF out electrode 214b.

In this way, a PCM RF switch array includes a plurality of PCM RF switches above a pyroelectric device. The PCM RF switch array includes respective sets of contacts for each of the plurality of PCM RF switches, a plurality of heaters under the respective sets of contacts, and respective PCM layers that extend between contacts in the respective sets of contacts. Respective PCM layers are approximately U-shaped PCM layers.

As indicated above, FIG. 14 is provided as an example. Other examples may differ from what is described with regard to FIG. 14.

Figure 15:
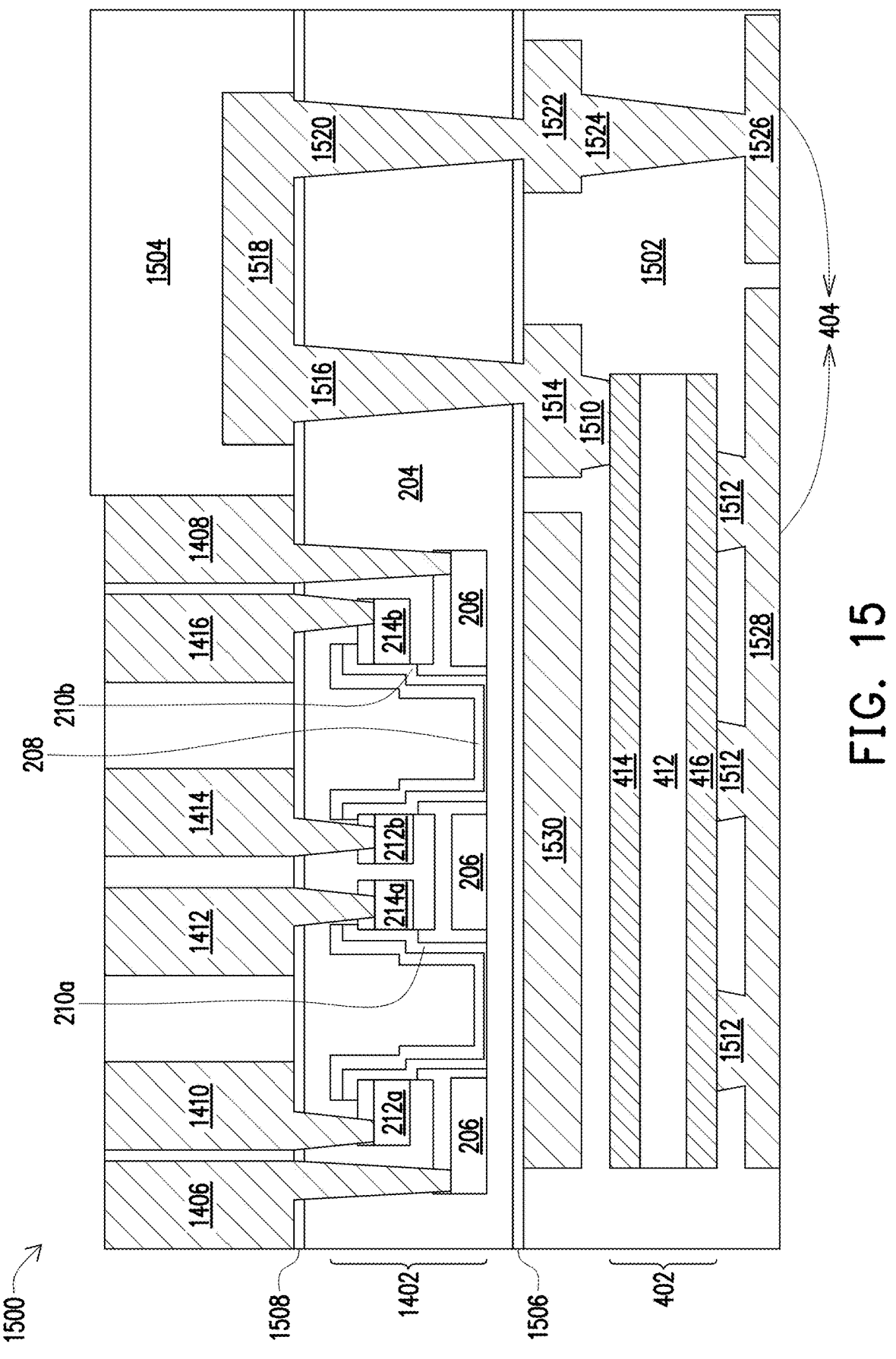

FIG. 15 is a diagram of an example semiconductor device 1500 described herein. As shown in FIG. 15, the semiconductor device 1500 may include a similar configuration as the semiconductor device 1400. For example, the semiconductor device 1500 includes the array 1402 of vertically arranged PCM RF switches 200, the pyroelectric device 402 below the array 1402 of PCM RF switches 200, and the vias 1406-1416. The semiconductor device 1500 includes a plurality of additional conductive structures to electrically connect various structures and/or layers of the pyroelectric device 402 and/or the PCM RF switch 200 to other structures and/or layers in the semiconductor device 1500. The additional conductive structures may include one or more conductive materials, such as copper (Cu), tungsten (W), titanium (Ti), cobalt (Co), ruthenium (Ru), and/or another conductive material.

As shown in FIG. 15, the array 1402 of PCM RF switches 200 and the pyroelectric device 402 are included in different oxide layers of the semiconductor device 1500 as opposed to in the same oxide layer 204 in the semiconductor device 1400. The semiconductor device 1500 may include the oxide layer 204 between an oxide layer 1502 and an oxide layer 1504. An etch stop layer 1506 may be included between the oxide layer 204 and the oxide layer 1502. An etch stop layer 1508 may be included between the oxide layer 204 and the oxide layer 1504. The array 1402 of PCM RF switches 200 may be included in the oxide layer 204. The pyroelectric device 402 may be included in the oxide layer 1502 below the oxide layer 204.

The array 1402 of PCM RF switches 200 and the pyroelectric device 402 may be included in different oxide layers of the semiconductor device 1500 in implementations where the thickness of the oxide layer 204 is not sufficiently thick to accommodate the array 1402 of PCM RF switches 200 and the pyroelectric device 402 to be vertically arranged in a single oxide layer. This may occur, for example, where logic circuit requirements in the semiconductor device 1500 require thinner interlayer dielectrics and/or thinner intermetal dielectrics.

As shown in FIG. 15, a conductive structure includes a via 1410 (or an interconnect) that is electrically connected with the RF in electrode 212. Another conductive structure includes a via 1412 (or an interconnect) that is electrically connected with the RF out electrode 214. Another conductive structure includes a via 1510 (or an interconnect) that is electrically connected with and extends above the top electrode 414 in the semiconductor device 1500. A plurality of conductive structures includes a plurality of vias 1512 (or interconnects) that are electrically connected with and that extend below the bottom electrode 416 in the semiconductor device 1500. The via 1510 and the vias 1512 may extend in an approximately parallel direction in the semiconductor device 1500 on opposing sides of the pyroelectric device 402. The via 1510 and the vias 1512 are included in the oxide layer 1502.

The via 1510 electrically connects the top electrode 414 of the pyroelectric device 402 with conductive structure including a metallization layer 1514, which may be located in the semiconductor device 1500 at a position that is at a height between the PCM RF switch 200 and the pyroelectric device 402. The metallization layer 1514 is included in the oxide layer 1502. The metallization layer 1514 electrically connects the via 1510 with a via 1516 that extends above the metallization layer 1514 and between the oxide layer 1502 and the oxide layer 204 through the etch stop layers 1506 and 1508. The via 1516 electrically connects the metallization layer 1514 with a conductive structure that includes a metallization layer 1518. The metallization layer 1518 may be located at a height in the semiconductor device 1500 that is above the PCM RF switch 200 and may be included in the oxide layer 1504. The metallization layer 1518 may be electrically with a conductive structure that includes a via 1520. The via 1520 extends below the metallization layer 1518 and between the oxide layer 1502 and the oxide layer 204 through the etch stop layers 1506 and 1508. The via 1520 may extend in a direction that is approximately parallel with the via 1516. The via 1520 electrically connects the metallization layer 1518 with a conductive structure that includes a metallization layer 1522 that is below the PCM RF switch 200 and is included in the oxide layer 1502. The metallization layer 1522 electrically connects the via 1520 with a conductive structure that includes a via 1524 that is included in the oxide layer 1502. The via 1524 extends below the metallization layer 1522. The via 1524 electrically connects the metallization layer 1522 with a conductive structure that includes a metallization layer 1526 that is included in the oxide layer 1502 below the via 1524. The metallization layer 1526 is electrically connected with the rectifier circuit 404. Accordingly, the top electrode 414 is electrically connected with the rectifier circuit 404 by the via 1510, the metallization layer 1514, the via 1516, the metallization layer 1518, the via 1520, the metallization layer 1522, the via 1524, and the metallization layer 1526.

The vias 1512 electrically connects the bottom electrode 416 of the pyroelectric device 402 with a metallization layer 1528 below the vias 1512 and below the pyroelectric device 402. The vias 1512 and the metallization layer 1528 may electrically connect the bottom electrode 416 with the rectifier circuit 404. Another metallization layer 1530 may be included in the oxide layer 1502 and may be included between the PCM RF switch 200 and the pyroelectric device 402.

As indicated above, FIG. 15 is provided as an example. Other examples may differ from what is described with regard to FIG. 15.

Figure 16:
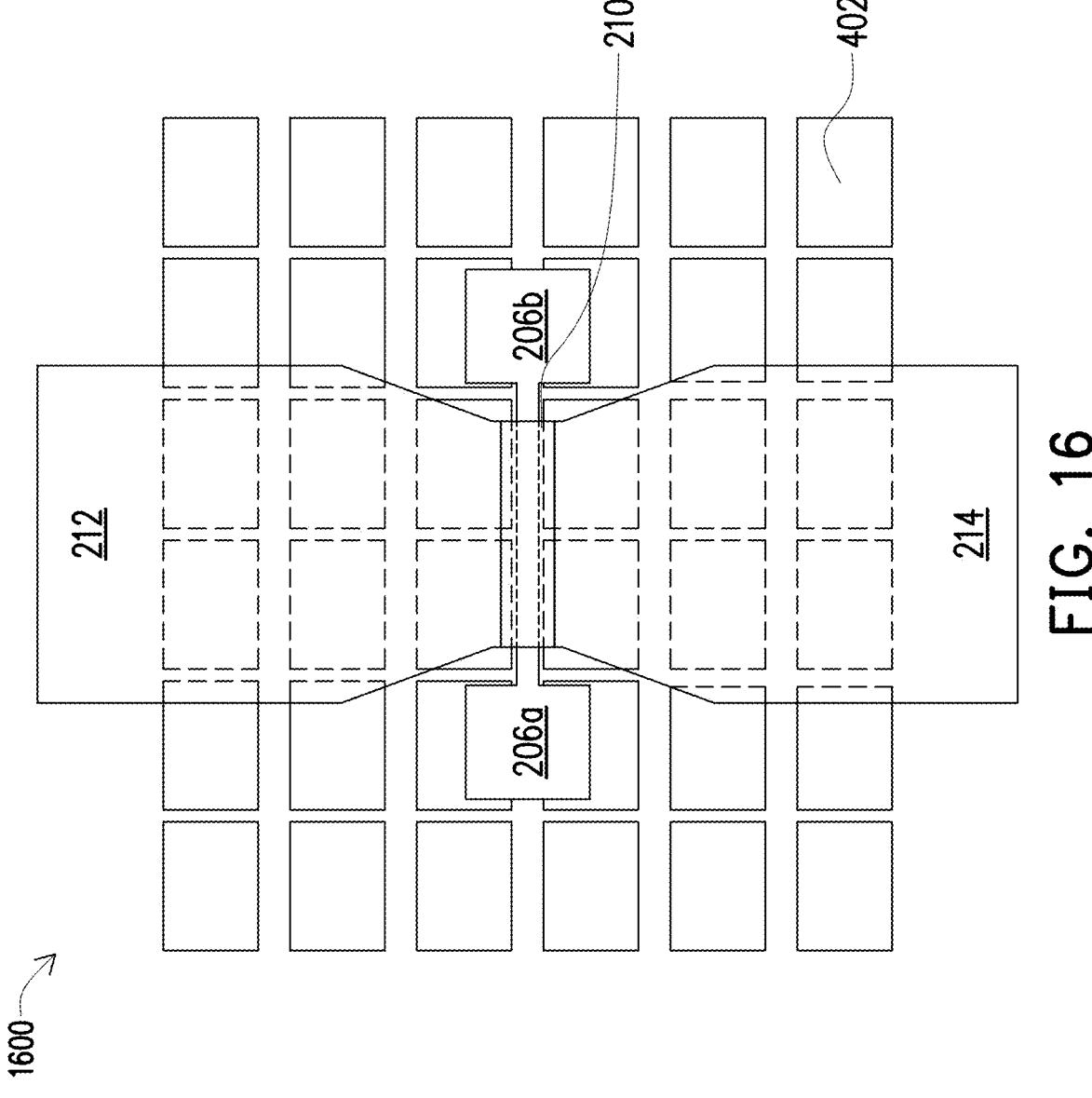

FIG. 16 is a diagram of an example semiconductor device 1600 described herein. As shown in FIG. 16, the semiconductor device 1600 may include a similar configuration as the semiconductor device 800. For example, the semiconductor device 1600 includes the PCM RF switch 200 and the pyroelectric device 402 below the PCM RF switch 200. However, in the semiconductor device 1600 includes a plurality of pyroelectric devices 402. The plurality of pyroelectric devices 402 may be arranged in an array below the PCM RF switch 200. As shown in FIG. 16, a subset of the plurality of pyroelectric devices 402 may be positioned at least partially under the structures and/or layers of the PCM RF switch 200, whereas another subset of the plurality of pyroelectric devices 402 may not be located under the structures and/or layers of the PCM RF switch 200.

In some implementations, the plurality of pyroelectric devices 402 may be located on approximately the same horizontal plane in the semiconductor device 1600 such that the plurality of pyroelectric devices 402 are at approximately the same height in the semiconductor devices. In some implementations, the height or vertical position of two or more of the plurality of pyroelectric devices 402 may be different in the semiconductor device 1600. Separating the pyroelectric device 402 into a plurality of pyroelectric devices 402 enables the plurality of pyroelectric devices 402 to be more optimally positioned in the semiconductor device 1600. Pyroelectric devices 402 that are located at least partially under the layer and/or structures of the PCM RF switch 200 may experience greater heat transfer from the heater 206 of the PCM RF switch 200 than pyroelectric devices 402 that are located laterally outward way from the PCM RF switch 200. Accordingly, the pyroelectric devices 402 that are located laterally outward away from the PCM RF switch 200 may be positioned at a greater height (and thus, vertically closer to the heater 206) in the semiconductor device 1600, which may help to increase the magnitude of the thermal changes (and thus, the thermal sensitivity) in these pyroelectric devices 402. This can increase the overall efficiency of heat scavenging and electricity generation for the pyroelectric generator 400.

As indicated above, FIG. 16 is provided as an example. Other examples may differ from what is described with regard to FIG. 16.

Figure 17:
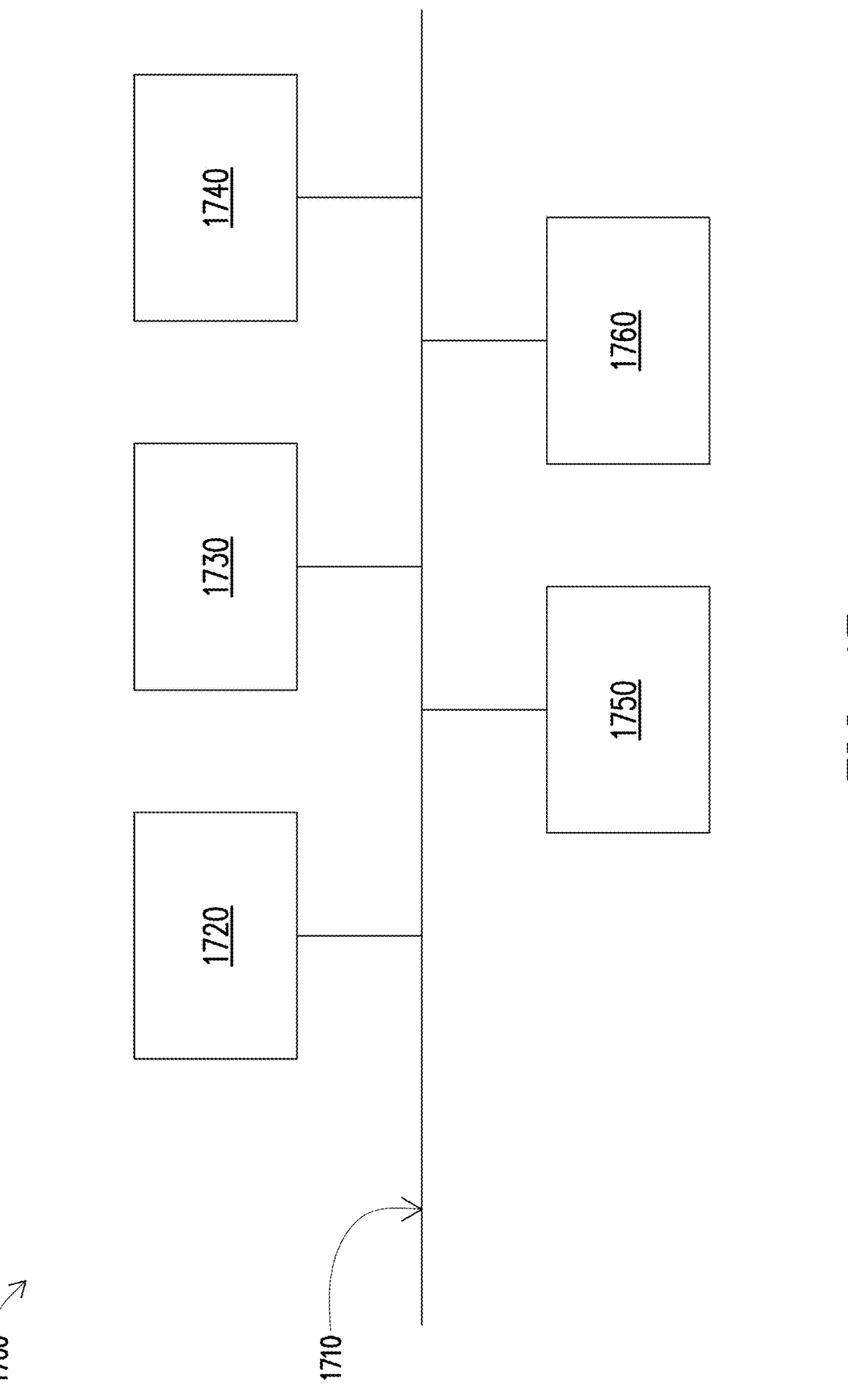
FIG. 17 is a diagram of example components of one or more devices of FIG. 1 described herein.

FIG. 17 is a diagram of example components of a device 1700. In some implementations, one or more of the semiconductor processing tools 102-112 and/or the wafer/die transport tool 114 include one or more devices 1700 and/or one or more components of device 1700. As shown in FIG. 17, device 1700 may include a bus 1710, a processor 1720, a memory 1730, an input component 1740, an output component 1750, and a communication component 1760.

Bus 1710 includes one or more components that enable wired and/or wireless communication among the components of device 1700. Bus 1710 may couple together two or more components of FIG. 17, such as via operative coupling, communicative coupling, electronic coupling, and/or electric coupling. Processor 1720 includes a central processing unit, a graphics processing unit, a microprocessor, a controller, a microcontroller, a digital signal processor, a field-programmable gate array, an application-specific integrated circuit, and/or another type of processing component. Processor 1720 is implemented in hardware, firmware, or a combination of hardware and software. In some implementations, processor 1720 includes one or more processors capable of being programmed to perform one or more operations or processes described elsewhere herein.

Memory 1730 includes volatile and/or nonvolatile memory. For example, memory 1730 may include random access memory (RAM), read only memory (ROM), a hard disk drive, and/or another type of memory (e.g., a flash memory, a magnetic memory, and/or an optical memory). Memory 1730 may include internal memory (e.g., RAM, ROM, or a hard disk drive) and/or removable memory (e.g., removable via a universal serial bus connection). Memory 1730 may be a non-transitory computer-readable medium. Memory 1730 stores information, instructions, and/or software (e.g., one or more software applications) related to the operation of device 1700. In some implementations, memory 1730 includes one or more memories that are coupled to one or more processors (e.g., processor 1720), such as via bus 1710.

Input component 1740 enables device 1700 to receive input, such as user input and/or sensed input. For example, input component 1740 may include a touch screen, a keyboard, a keypad, a mouse, a button, a microphone, a switch, a sensor, a global positioning system sensor, an accelerometer, a gyroscope, and/or an actuator. Output component 1750 enables device 1700 to provide output, such as via a display, a speaker, and/or a light-emitting diode. Communication component 1760 enables device 1700 to communicate with other devices via a wired connection and/or a wireless connection. For example, communication component 1760 may include a receiver, a transmitter, a transceiver, a modem, a network interface card, and/or an antenna.

Device 1700 may perform one or more operations or processes described herein. For example, a non-transitory computer-readable medium (e.g., memory 1730) may store a set of instructions (e.g., one or more instructions or code) for execution by processor 1720. Processor 1720 may execute the set of instructions to perform one or more operations or processes described herein. In some implementations, execution of the set of instructions, by one or more processors 1720, causes the one or more processors 1720 and/or the device 1700 to perform one or more operations or processes described herein. In some implementations, hardwired circuitry is used instead of or in combination with the instructions to perform one or more operations or processes described herein. Additionally, or alternatively, processor 1720 may be configured to perform one or more operations or processes described herein. Thus, implementations described herein are not limited to any specific combination of hardware circuitry and software.

The number and arrangement of components shown in FIG. 17 are provided as an example. Device 1700 may include additional components, fewer components, different components, or differently arranged components than those shown in FIG. 17. Additionally, or alternatively, a set of components (e.g., one or more components) of device 1700 may perform one or more functions described as being performed by another set of components of device 1700.

FIG. 18 is a flowchart of an example process 1800 associated with forming a semiconductor device. In some implementations, one or more process blocks of FIG. 18 are performed by one or more semiconductor processing tools (e.g., one or more of the semiconductor processing tools 102-112). Additionally, or alternatively, one or more process blocks of FIG. 18 may be performed by one or more components of device 1700, such as processor 1720, memory 1730, input component 1740, output component 1750, and/or communication component 1760.

As shown in FIG. 18, process 1800 may include forming a first oxide layer over a substrate of a semiconductor device (block 1810). For example, one or more of the semiconductor processing tools 102-112 may form a first oxide layer 904 over a substrate 902 of a semiconductor device (e.g., one or more of the semiconductor devices 800, 1100-1600), as described above.

As further shown in FIG. 18, process 1800 may include forming a bottom electrode of a pyroelectric device over the first oxide layer (block 1820). For example, one or more of the semiconductor processing tools 102-112 may form a bottom electrode 416 of a pyroelectric device 402 over the first oxide layer 904, as described above.

As further shown in FIG. 18, process 1800 may include forming a pyroelectric material layer of the pyroelectric device over the bottom electrode (block 1830). For example, one or more of the semiconductor processing tools 102-112 may form a pyroelectric material layer 412 of the pyroelectric device 402 over the bottom electrode 416, as described above.

As further shown in FIG. 18, process 1800 may include forming a top electrode of the pyroelectric device over the pyroelectric material layer (block 1840). For example, one or more of the semiconductor processing tools 102-112 may form a top electrode 414 of the pyroelectric device 402 over the pyroelectric material layer 412, as described above.

As further shown in FIG. 18, process 1800 may include forming a second oxide layer of a phase change material PCM RF switch over the top electrode of the pyroelectric device (block 1850). For example, one or more of the semiconductor processing tools 102-112 may form a second oxide layer 204 of a PCM RF switch 200 over the top electrode 414 of the pyroelectric device 402, as described above.

As further shown in FIG. 18, process 1800 may include forming a heater of the PCM RF switch in a recess in the second oxide layer (block 1860). For example, one or more of the semiconductor processing tools 102-112 may form a heater 206 of the PCM RF switch 200 in a recess in the second oxide layer 204, as described above.

As further shown in FIG. 18, process 1800 may include forming a PCM layer 210 of the PCM RF switch over the heater (block 1870). For example, one or more of the semiconductor processing tools 102-112 may form a PCM layer 210 of the PCM RF switch 200 over the heater 206, as described above.

As further shown in FIG. 18, process 1800 may include forming a plurality of contacts of the PCM RF switch at least partially over the PCM layer (block 1880). For example, one or more of the semiconductor processing tools 102-112 may form a plurality of contacts (e.g., an RF in electrode 212, an RF out electrode 214) of the PCM RF switch 200 at least partially over the PCM layer 210, as described above.

Process 1800 may include additional implementations, such as any single implementation or any combination of implementations described below and/or in connection with one or more other processes described elsewhere herein.

In a first implementation, process 1800 includes etching through the top electrode 414, through the pyroelectric material layer 412, and through the bottom electrode 416 to form a plurality of pyroelectric devices for the semiconductor device. In a second implementation, alone or in combination with the first implementation, process 1800 includes forming a plurality of conductive structures to electrically connect the pyroelectric device with a rectifier circuit 404 and an electrical storage device 406.

Although FIG. 18 shows example blocks of process 1800, in some implementations, process 1800 includes additional blocks, fewer blocks, different blocks, or differently arranged blocks than those depicted in FIG. 18. Additionally, or alternatively, two or more of the blocks of process 1800 may be performed in parallel.

In this way, a pyroelectric generator may generate electricity when the pyroelectric material layer of the pyroelectric generator encounters temporal temperature gradients (e.g., temperature cycling). The pyroelectric material layer is configured to make use of the inherent temperature cycling during the switching operation in a PCM RF switch to recycle heat to electricity. This increases the operating efficiency of the PCM RF switch and decreases thermal waste in the PCM RF switch. Both processes for forming the PCM RF switch and the pyroelectric generator can be embedded in similar CMOS processing, which results in minimal impact to processing complexity for forming a semiconductor device that includes the PCM RF switch and the pyroelectric generator. Moreover, the operation of the pyroelectric generator may have minimal impact on the operating performance (e.g., the off state capacitance) of the PCM RF switch as the working temperature (e.g., the curie temperature) for the pyroelectric generator may be much lower (e.g., less than approximately half) than the working temperature of the PCM RF switch.

As described in greater detail above, some implementations described herein provide a semiconductor device. The semiconductor device includes an RF switch. The semiconductor device includes a pyroelectric device adjacent to the RF switch.

As described in greater detail above, some implementations described herein provide a semiconductor device. The semiconductor device includes a PCM RF switch. The semiconductor device includes a pyroelectric device below the RF switch. The semiconductor device includes a plurality of conductive structures that electrically connect the pyroelectric device to a rectifier circuit.

As described in greater detail above, some implementations described herein provide a method. The method includes forming a first oxide layer over a substrate of a semiconductor device. The method includes forming a bottom electrode of a pyroelectric device over the first oxide layer. The method includes forming a pyroelectric material layer of the pyroelectric device over the bottom electrode. The method includes forming a top electrode of the pyroelectric device over the pyroelectric material layer. The method includes forming a second oxide layer of a PCM RF switch over the top electrode of the pyroelectric device. The method includes forming a heater of the PCM RF switch in a recess in the second oxide layer. The method includes forming a PCM layer of the PCM RF switch over the heater. The method includes forming a plurality of contacts of the PCM RF switch at least partially over the PCM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a radio frequency (RF) switch in a dielectric layer,
wherein a portion of the dielectric layer is on a side of the RF switch along a first direction;
a pyroelectric device in the dielectric layer under the RF switch along a second direction substantially perpendicular to the first direction,
wherein the pyroelectric device comprises an electrode on a pyroelectric material layer, and
wherein an end of the electrode is under at least part of the portion of the dielectric layer on the side of the RF switch; and
a plurality of conductive structures that electrically connect the pyroelectric device to a rectifier circuit,
wherein the plurality of conductive structures comprise a via on the end of the electrode and extending above the electrode along the second direction through the portion of the dielectric layer on the side of the RF switch.

2. The semiconductor device of claim 1, wherein the RF switch comprises:
a heater;
a phase change material (PCM) layer over the heater;
a first electrode on a first side of the PCM layer; and
a second electrode on a second side of the PCM layer opposing the first side.

3. The semiconductor device of claim 1, wherein the pyroelectric material layer comprises at least one of:
a hafnium oxide ($HfO_x$) material,
a hafnium oxide material that is doped with one or more types of dopants,
a lead zirconate titanate (PZT) material, or
a strontium bismuth tantalate (SBT) material.

4. The semiconductor device of claim 1, further comprising:
a pyroelectric generator, comprising:
the pyroelectric device;
the rectifier circuit electrically connected with the pyroelectric device; and
an electrical storage device electrically connected with the rectifier circuit.

5. The semiconductor device of claim 4, wherein the pyroelectric device is configured to generate an electrical current based on changes in temperature of the RF switch.

6. The semiconductor device of claim 5, wherein the rectifier circuit is configured to generate a rectified current by rectifying the electrical current; and
wherein the electrical storage device is configured to store the rectified current.

7. The semiconductor device of claim 1, wherein the pyroelectric device is configured to generate an electrical current during at least one of:
a set operation of the RF switch in which the RF switch transitions from an off state to an on state, or
a reset operation of the RF switch in transitions from the on state to the off state.

8. The semiconductor device of claim 1, wherein the RF switch comprises a heater; and
wherein a vertical distance between the heater and the pyroelectric device is included in a range of approximately 0.1 microns to approximately 1 micron.

9. The semiconductor device of claim 1, wherein the plurality of conductive structures further comprise a second via extending along the second direction through the portion of the dielectric layer on the side of the PCM RF switch.

10. A semiconductor device, comprising:
a phase change material (PCM) radio frequency (RF) switch in a dielectric layer,
wherein a portion of the dielectric layer is on a side of the PCM RF switch;
a pyroelectric device in the dielectric layer below the RF switch,
wherein the pyroelectric device comprises a top electrode on a pyroelectric material layer, and
wherein an end of the top electrode overlaps at least part of the portion of the dielectric layer on the side of the PCM RF switch; and
a plurality of conductive structures that electrically connect the pyroelectric device to a rectifier circuit,
wherein the plurality of conductive structures comprise a via above the end of the top electrode and extending above the top electrode through the portion of the dielectric layer on the side of the PCM RF switch.

11. The semiconductor device of claim 10, wherein the plurality of conductive structures further comprise:
a second via extending through the portion of the dielectric layer on the side of the PCM RF switch in a direction that is approximately parallel with the via,
wherein the second via electrically connects a bottom electrode of the pyroelectric device with the rectifier circuit.

12. The semiconductor device of claim 10, wherein the plurality of conductive structures further comprise:

a first metallization layer electrically connected with and above the via;

a second via electrically connected with and below the first metallization layer, wherein the via and the second via are approximately parallel;

a second metallization layer below the second via and electrically connecting the second via with the rectifier circuit;

a third via electrically connected with and below a bottom electrode of the pyroelectric device; and a third metallization layer below the third via and electrically connecting the third via with the rectifier circuit.

13. The semiconductor device of claim 10, further comprising:

a second dielectric layer under the dielectric layer;

an etch stop layer (ESL) between the dielectric layer and the second dielectric layer; and a metallization layer between the pyroelectric device and the PCM RF switch, wherein the pyroelectric device, the metallization layer, and a first subset of the plurality of conductive structures are included in the first-second dielectric layer, and wherein the PCM RF switch and a second subset of the plurality of conductive structures are included in the dielectric layer.

14. The semiconductor device of claim 10, further comprising:

a PCM RF switch array comprising a plurality of PCM RF switches above the pyroelectric device, wherein the PCM RF switch is included in the plurality of PCM RF switches, and wherein the PCM RF switch array comprises:

respective sets of contacts for each of the plurality of PCM RF switches;

a plurality of heaters under the respective sets of contacts; and respective PCM layers that extend between contacts in the respective sets of contacts, wherein the respective PCM layers are approximately U-shaped PCM layers.

15. The semiconductor device of claim 14, wherein the plurality of conductive structures further comprise:

a plurality of second vias electrically connected with a bottom electrode of the pyroelectric device and extending below the bottom electrode.

16. The semiconductor device of claim 10, wherein the pyroelectric device comprises at least one of:

a hafnium oxide ($HfO_x$) material, a hafnium oxide material that is doped with one or more types of dopants, a lead zirconate titanate (PZT) material, or a strontium bismuth tantalate (SBT) material.

17. The semiconductor device of claim 12, wherein the second via extends through the portion of the dielectric layer on the side of the PCM RF switch.

18. A semiconductor device, comprising:

a first oxide layer;

a bottom electrode of a pyroelectric device over the first oxide layer;

a pyroelectric material layer of the pyroelectric device over the bottom electrode;

a top electrode of the pyroelectric device over the pyroelectric material layer;

a second oxide layer of a phase change material (PCM) radio frequency (RF) switch over the top electrode of the pyroelectric device;

a heater of the PCM RF switch in a recess in the second oxide layer;

a PCM layer of the PCM RF switch over the heater;

a plurality of contacts of the PCM RF switch at least partially over the PCM layer, wherein a portion of the second oxide layer is on a side of the PCM RF switch;

wherein an end of the top electrode overlaps at least part of the portion of the second oxide layer on the side of the PCM RF switch; and a plurality of conductive structures that electrically connect the pyroelectric device to a rectifier circuit, wherein the plurality of conductive structures comprise a via on the end of the top electrode and extending above the top electrode through the portion of the second oxide layer on the side of the PCM RF switch.

19. The semiconductor device of claim 18, wherein the plurality of conductive structures electrically connect the pyroelectric device with the rectifier circuit and an electrical storage device.

20. The semiconductor device of claim 18, wherein the pyroelectric device comprises at least one of:

a hafnium oxide ($HfO_x$) material, a hafnium oxide material that is doped with one or more types of dopants, a lead zirconate titanate (PZT) material, or a strontium bismuth tantalate (SBT) material.

* * * * *